United States Patent
Kim et al.

(10) Patent No.: US 12,284,808 B2
(45) Date of Patent: Apr. 22, 2025

(54) THREE-DIMENSIONAL SEMICONDUCTOR MEMORY DEVICE

(71) Applicant: SK hynix Inc., Icheon-si (KR)

(72) Inventors: Jang Won Kim, Icheon-si (KR); Mi Seong Park, Icheon-si (KR); In Su Park, Icheon-si (KR); Jung Shik Jang, Icheon-si (KR); Won Geun Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 574 days.

(21) Appl. No.: 17/538,191

(22) Filed: Nov. 30, 2021

(65) Prior Publication Data

US 2022/0399364 A1 Dec. 15, 2022

(30) Foreign Application Priority Data

Jun. 15, 2021 (KR) .......................... 10-2021-0077456

(51) Int. Cl.
*H10B 43/27* (2023.01)
*H01L 21/768* (2006.01)
*H01L 23/535* (2006.01)
*H10B 41/27* (2023.01)

(52) U.S. Cl.
CPC ....... *H10B 43/27* (2023.02); *H01L 21/76805* (2013.01); *H01L 21/76895* (2013.01); *H01L 23/535* (2013.01); *H10B 41/27* (2023.02)

(58) Field of Classification Search
None
See application file for complete search history.

(56) References Cited

U.S. PATENT DOCUMENTS

| | | | | |
|---|---|---|---|---|
| 8,394,716 | B2* | 3/2013 | Hwang | H01L 23/5226 257/315 |
| 8,823,161 | B2* | 9/2014 | Kim | H01L 23/481 257/774 |
| 9,202,744 | B1* | 12/2015 | Ban | H01L 23/5226 |
| 9,653,474 | B2* | 5/2017 | Yune | G06F 3/0679 |
| 9,922,987 | B1* | 3/2018 | Mizutani | H10B 43/10 |
| 10,192,878 | B1* | 1/2019 | Tsutsumi | H10B 43/10 |
| 10,290,643 | B1* | 5/2019 | Kai | H01L 29/7883 |
| 10,347,651 | B2* | 7/2019 | Lee | H10B 41/20 |
| 10,347,654 | B1* | 7/2019 | Iwai | H10B 43/10 |
| 10,553,599 | B1* | 2/2020 | Chen | H10B 43/10 |
| 10,566,344 | B2* | 2/2020 | Moon | H01L 21/475 |
| 10,629,810 | B2* | 4/2020 | Matsuo | G11C 13/003 |
| 10,636,806 | B2 | 4/2020 | Lee | |
| 10,748,925 | B1* | 8/2020 | Tsutsumi | H10B 41/41 |

(Continued)

FOREIGN PATENT DOCUMENTS

| | | | | |
|---|---|---|---|---|
| CN | 103579125 | A * | 2/2014 | ........ H01L 27/11573 |
| CN | 104766865 | A | 7/2015 | |

(Continued)

*Primary Examiner* — Scott B Geyer
(74) *Attorney, Agent, or Firm* — WILLIAM PARK & ASSOCIATES LTD.

(57) ABSTRACT

A semiconductor memory device and a method of manufacturing the semiconductor memory device are provided. The semiconductor memory device includes a gate stacked structure with a cell array region and a contact region with a stepped shape, and a roughness of a first sidewall of the cell array region is greater than that of a second sidewall of the contact region.

15 Claims, 50 Drawing Sheets

(56) References Cited

U.S. PATENT DOCUMENTS

| | | | |
|---|---|---|---|
| 10,840,260 B2 | 11/2020 | Kai et al. | |
| 10,930,664 B2* | 2/2021 | Son | H10B 43/30 |
| 11,133,324 B2* | 9/2021 | Zhang | H10B 41/27 |
| 11,342,347 B2* | 5/2022 | Hinoue | H10B 43/27 |
| 11,637,038 B2* | 4/2023 | Amano | H10B 43/27 257/314 |
| 11,869,951 B2* | 1/2024 | Hsu | H01L 29/7881 |
| 2004/0152260 A1* | 8/2004 | Rabkin | H10B 69/00 438/257 |
| 2009/0097321 A1* | 4/2009 | Kim | H01L 29/42336 438/257 |
| 2009/0296476 A1* | 12/2009 | Shin | H10B 43/10 438/109 |
| 2013/0126959 A1* | 5/2013 | Aburada | H10B 43/27 438/269 |
| 2016/0064407 A1 | 3/2016 | Kim et al. | |
| 2016/0071865 A1* | 3/2016 | Yanai | H10B 43/10 257/324 |
| 2016/0071870 A1* | 3/2016 | Minami | H10B 43/35 257/314 |
| 2016/0141299 A1* | 5/2016 | Hong | H10B 43/35 438/157 |
| 2016/0343726 A1* | 11/2016 | Yune | H10B 43/27 |
| 2017/0077136 A1* | 3/2017 | Kim | H01L 29/40117 |
| 2017/0179144 A1* | 6/2017 | Han | H01L 23/53257 |
| 2017/0207221 A1 | 7/2017 | Kim et al. | |
| 2017/0207232 A1* | 7/2017 | You | H10B 41/27 |
| 2017/0229577 A1 | 8/2017 | Matsuura et al. | |
| 2017/0345839 A1* | 11/2017 | Han | H01L 21/76877 |
| 2018/0019257 A1* | 1/2018 | Son | H10B 43/30 |
| 2018/0268902 A1* | 9/2018 | Tanaka | H10B 43/35 |
| 2018/0269219 A1* | 9/2018 | Ito | H10B 43/40 |
| 2018/0269221 A1* | 9/2018 | Oda | H10B 43/27 |
| 2019/0006383 A1* | 1/2019 | Matsuno | H10B 43/27 |
| 2019/0035803 A1* | 1/2019 | Zhang | H10B 43/35 |
| 2019/0035804 A1* | 1/2019 | Kim | H10B 43/35 |
| 2019/0214395 A1* | 7/2019 | Zhang | H10B 43/20 |
| 2019/0280009 A1* | 9/2019 | Lee | H10B 41/20 |
| 2019/0305096 A1* | 10/2019 | Choi | H01L 29/41741 |
| 2020/0006358 A1* | 1/2020 | Nishikawa | H01L 29/0649 |
| 2020/0020712 A1* | 1/2020 | Kim | H10B 43/40 |
| 2020/0258993 A1* | 8/2020 | Haraguchi | G11C 29/12005 |
| 2020/0365612 A1* | 11/2020 | Hu | H10B 41/27 |
| 2021/0028181 A1* | 1/2021 | Wang | H10B 41/27 |
| 2021/0057429 A1* | 2/2021 | Zhang | H10B 41/27 |
| 2021/0074720 A1* | 3/2021 | Son | H10B 43/35 |
| 2022/0093633 A1* | 3/2022 | Ishiduki | H10B 43/20 |
| 2022/0149065 A1* | 5/2022 | Lee | H10B 43/35 |
| 2022/0254801 A1* | 8/2022 | Takeoka | H01L 23/562 |
| 2022/0293620 A1* | 9/2022 | Kinoshita | H10B 43/27 |

FOREIGN PATENT DOCUMENTS

| | | | | |
|---|---|---|---|---|
| CN | 105374824 A | * | 3/2016 | ........ H01L 27/11551 |
| CN | 107017260 A | | 8/2017 | |
| CN | 108074935 A | * | 5/2018 | ........ H01L 27/11582 |
| CN | 108573978 A | * | 9/2018 | ........ H01L 27/11565 |
| CN | 105845683 B | * | 4/2019 | ........ H01L 27/11524 |
| CN | 110120393 A | * | 8/2019 | ............ H10B 41/20 |
| CN | 111354735 A | * | 6/2020 | ............ H01L 21/768 |
| CN | 111933647 A | * | 11/2020 | ........ H01L 27/1157 |
| CN | 107195633 B | * | 12/2020 | ........ H01L 27/11519 |
| CN | 112185968 A | * | 1/2021 | ........ H01L 27/11519 |
| CN | 111933646 B | * | 5/2021 | ........ H01L 27/11565 |
| CN | 113206101 A | * | 8/2021 | ........ H01L 27/11565 |
| CN | 113228280 A | * | 8/2021 | ............ H01L 21/308 |
| DE | 102018123957 A1 | * | 4/2019 | ............ H01L 27/092 |
| EP | 1635395 A2 | * | 3/2006 | ............ H01L 27/115 |
| KR | 1020170087809 A | | 7/2017 | |
| KR | 102128465 B1 | | 7/2020 | |
| WO | WO-2020197595 A1 | * | 10/2020 | ........ H01L 27/11524 |
| WO | WO-2021194536 A1 | * | 9/2021 | ......... G11C 16/0483 |

\* cited by examiner (CTR)

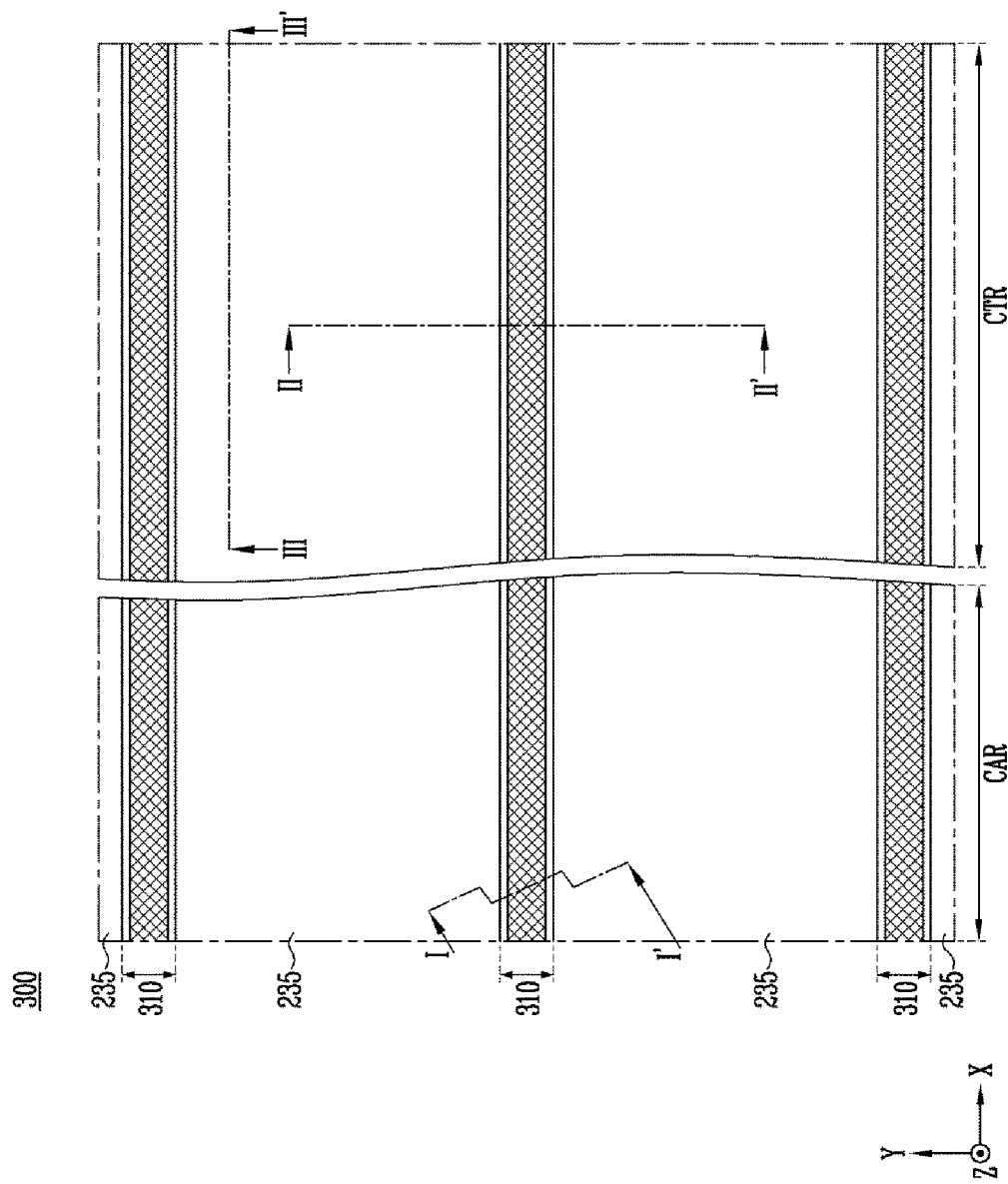

(CTR)

(CTR)

(CTR)

(CTR)

(CTR)

(CTR)

(CTR)

(CTR)

(CTR)

(CTR)

THREE-DIMENSIONAL SEMICONDUCTOR MEMORY DEVICE

CROSS-REFERENCE TO RELATED APPLICATION

The present application claims priority under 35 U.S.C. § 119(a) to Korean patent application number 10-2021-0077456, filed on Jun. 15, 2021, in the Korean Intellectual Property Office, the entire disclosure of which is incorporated herein by reference.

BACKGROUND

1. Technical Field

Various embodiments of the present disclosure generally relate to a semiconductor memory device and a method of manufacturing the semiconductor memory device, and more particularly, to a three-dimensional semiconductor memory device and a method of manufacturing the three-dimensional semiconductor memory device.

2. Related Art

Three-dimensional semiconductor memory devices including a plurality of three-dimensionally arranged memory cells have been proposed to increase integration density.

As the number of memory cells that are stacked over a substrate increases, integration density of three-dimensional semiconductor memory devices may increase. However, as the number of stacked memory cells increases, the stability of the process may deteriorate.

SUMMARY

According to an embodiment, a semiconductor memory device may include a source structure and a gate stacked structure disposed over the source structure, the gate stacked structure having a cell array region and a contact region with a stepped shape, wherein a roughness of a first sidewall of the cell array region of the gate stacked structure is higher than that of a second sidewall of the contact region of the gate stacked structure.

According to an embodiment, a semiconductor memory device may include a first gate stacked structure and a second gate stacked structure that are spaced apart from each other, a vertical structure between the first gate stacked structure and the second gate stacked structure, the vertical structure comprising a first portion and a second portion, and a plurality of cell plugs passing through the first gate stacked structure and the second gate stacked structure to be adjacent to both sides of the first portion of the vertical structure, wherein the first portion of the vertical structure includes depressions and protrusions that face the plurality of cell plugs, and wherein the second portion of the vertical structure is formed in a straight shape.

According to an embodiment, a method of manufacturing a semiconductor memory device may include forming a stacked structure with a cell array region and a contact region, forming a hole group with a plurality of channel holes and a plurality of auxiliary holes, the plurality of channel holes and the plurality of auxiliary holes passing through the cell array region of the stacked structure and being arranged in a plurality of rows, forming a memory layer along a surface of each of the plurality of channel holes, forming a channel structure on the memory layer, forming a first trench that passes through the contact region of the stacked structure, and removing a part of the stacked structure through the plurality of auxiliary holes and the first trench such that a slit is formed, wherein the plurality of auxiliary holes and the first trench are coupled in the slit.

BRIEF DESCRIPTION OF THE DRAWINGS

FIGS. 6, 7A, and 7B are diagrams illustrating a process of forming a lower structure according to an embodiment;

DETAILED DESCRIPTION

Specific structural or functional descriptions disclosed hereafter are merely illustrative for the purpose of describing embodiments according to the concept of the present disclosure. Embodiments according to the concept of the present disclosure should not be construed as being limited to the specific embodiments set forth herein, and may be implemented in various forms and replaced by an equivalent embodiment.

Hereinafter, the terms such as "first" and "second" may be used to describe various components. However, the components should not be limited by these terms. The above terms are used to distinguish one component from another component.

Various embodiments are directed to a semiconductor memory device capable of improving process stability and a method of manufacturing the semiconductor memory device.

Figure 1:
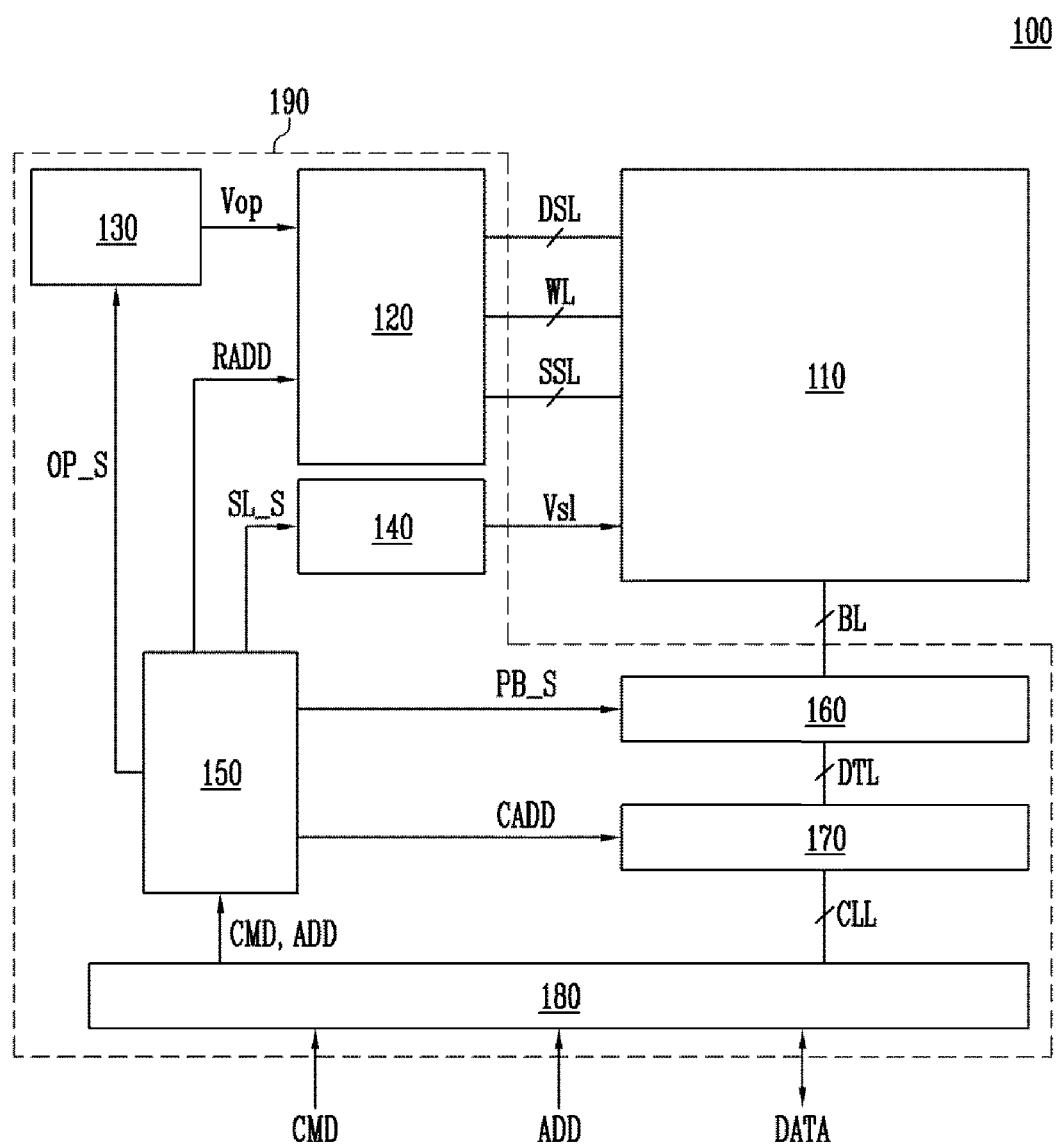
FIG. 1 is a block diagram of a semiconductor memory device according to an embodiment.

FIG. 1 is a block diagram of a semiconductor memory device 100 according to an embodiment.

Referring to FIG. 1, the semiconductor memory device 100 may include a peripheral circuit structure 190 and a memory cell array 110.

The peripheral circuit structure 190 may be configured to perform a program operation and a verify operation for storing data in the memory cell array 110, a read operation for outputting the data that is stored in the memory cell array 110, and an erase operation for erasing the data that is stored in the memory cell array 110. The peripheral circuit structure 190 may include an input/output circuit 180, a control circuit 150, a voltage generating circuit 130, a row decoder 120, a column decoder 170, a page buffer 160, and a source line driver 140.

The memory cell array 110 may include a plurality of memory cells that store data. According to an embodiment, the memory cell array 110 may include a three-dimensional memory cell array. The plurality of memory cells may store a single bit of data or multi-bits, that is, two or more bits of data per cell. The plurality of memory cells may form a plurality of memory cell strings. Each of the memory cell strings may include a plurality of memory cells that are coupled in series to each other through a channel structure. The channel structure may be coupled to the page buffer 160 through a corresponding bit line BL among a plurality of bit lines BL.

The input/output circuit 180 may transfer a command CMD and an address ADD that are received from an external device (for example, a memory controller) of the semiconductor memory device 100 to the control circuit 150. The input/output circuit 180 may exchange data DATA with the external device and the column decoder 170.

The control circuit 150 may output an operation signal OP_S, a row address RADD, a source line control signal SL_S, a page buffer control signal PB_S, and a column address CADD in response to the command CMD and the address ADD.

The voltage generating circuit 130 may generate various operating voltages Vop that are used for performing the program operation, the verify operation, the read operation, and the erase operation in response to the operation signal OP_S.

The row decoder 120 may be coupled to the memory cell array 110 through a plurality of drain select lines DSL, a plurality of word lines WL, and a plurality of source select lines SSL. The row decoder 120 may transfer the operating voltages Vop to the plurality of drain select lines DSL, the plurality of word lines WL, and the plurality of source select lines SSL in response to the row address RADD.

The column decoder 170 may transmit the data DATA that is input from the input/output circuit 180 to the page buffer 160 or transmit the data DATA that is stored in the page buffer 160 to the input/output circuit 180 in response to the column address CADD. The column decoder 170 may exchange the data DATA with the input/output circuit 180 through column lines CLL. The column decoder 170 may exchange the data DATA with the page buffer 160 through data lines DTL.

The page buffer 160 may be coupled to the memory cell array 110 through the bit line BL. The page buffer 160 may temporarily store the data DATA that is received through the plurality of bit lines BL in response to the page buffer control signal PB_S. The page buffer 160 may sense a voltage or a current of the plurality of bit lines BL during the read operation.

The source line driver 140 may transmit a source voltage Vsl to the memory cell array 110 in response to the source line control signal SL_S.

Figure 2:
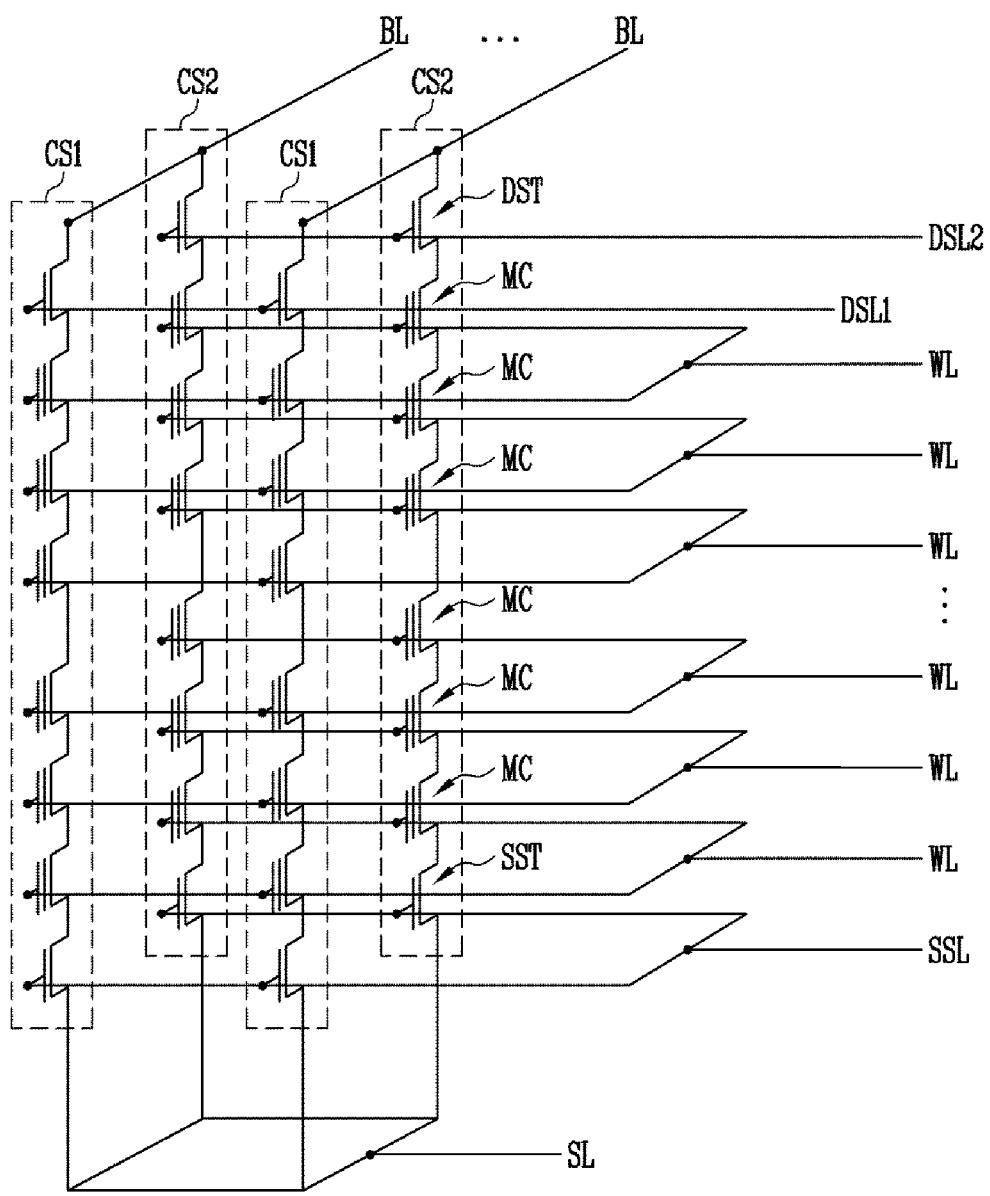
FIG. 2 is a circuit diagram illustrating an embodiment of a memory cell array, shown in FIG. 1.

FIG. 2 is a circuit diagram illustrating an embodiment of the memory cell array, shown in FIG. 1.

Referring to FIG. 2, the memory cell array may include a plurality of memory cell strings CS1 and CS2 that are connected to the plurality of bit lines BL. The plurality of memory cell strings CS1 and CS2 may be connected in common to a source line SL. According to an embodiment, a plurality of first memory cell strings CS1 and a plurality of second memory cell strings CS2 may be connected in common to the source line SL.

At least one pair of the first memory cell string CS1 and the second memory cell string CS2 may be connected to each of the plurality of bit lines BL.

Each of the plurality of first memory cell strings CS1 and each of the plurality of second memory cell strings CS2 may include a source select transistor SST, a plurality of memory cells MC, and a drain select transistor DST that are disposed between the source line SL and the bit line BL.

The source select transistor SST may control the electrical coupling between the plurality of memory cells MC and the source line SL. One source select transistor SST may be disposed between the source line SL and the plurality of memory cells MC. Although not illustrated in FIG. 2, two or more source select transistors that are coupled in series to each other may be disposed between the source line SL and the plurality of memory cells MC. The gate of the source select transistor SST may be connected to the source select line SSL. The operation of the source select transistor SST may be controlled by a source gate signal that is applied to the source select line SSL.

The plurality of memory cells MC may be disposed between the source select transistor SST and the drain select transistor DST. The plurality of memory cells MC between the source select transistor SST and the drain select transistor DST may be coupled in series. The gates of the plurality of memory cells MC may be connected to each of the plurality of word lines WL. The operation of each of the plurality of memory cells MC may be controlled by a cell gate signal that is applied to the word line WL that corresponds to each of the plurality of memory cells MC.

The drain select transistor DST may control the electrical coupling between the plurality of memory cells MC and the bit line BL. The gate of the drain select transistor DST may be connected to a drain select line DSL1 or DSL2. The operation of the drain select transistor DST may be controlled by a drain gate signal that is applied to the drain select line DSL1 or DSL2.

The plurality of first memory cell strings CS1 may be connected to a first drain select line DSL1. The plurality of second memory cell strings CS2 may be connected to a second drain select line DSL2. Accordingly, one memory cell string may be selected (among the plurality of first memory cell strings CS1 and the plurality of second memory cell strings CS2) by selecting one bit line (among the plurality of bit lines BL) and one drain select line (among the first drain select line DSL1 and the second drain select line DSL2).

The plurality of first memory cell strings CS1 and the plurality of second memory cell strings CS2 may be connected in common to each of the plurality of word lines WL.

The plurality of first memory cell strings CS1 and the plurality of second memory cell strings CS2 may be connected in common to the source select line SSL. However, embodiments of the present disclosure are not limited thereto. Although not illustrated in FIG. 2, according to an embodiment, a memory cell array may include a first source select line and a second source select line that are separated from each other. The first source select line may be connected to a plurality of first memory cell strings and the second source select line may be connected to a plurality of second memory cell strings.

Figure 3:
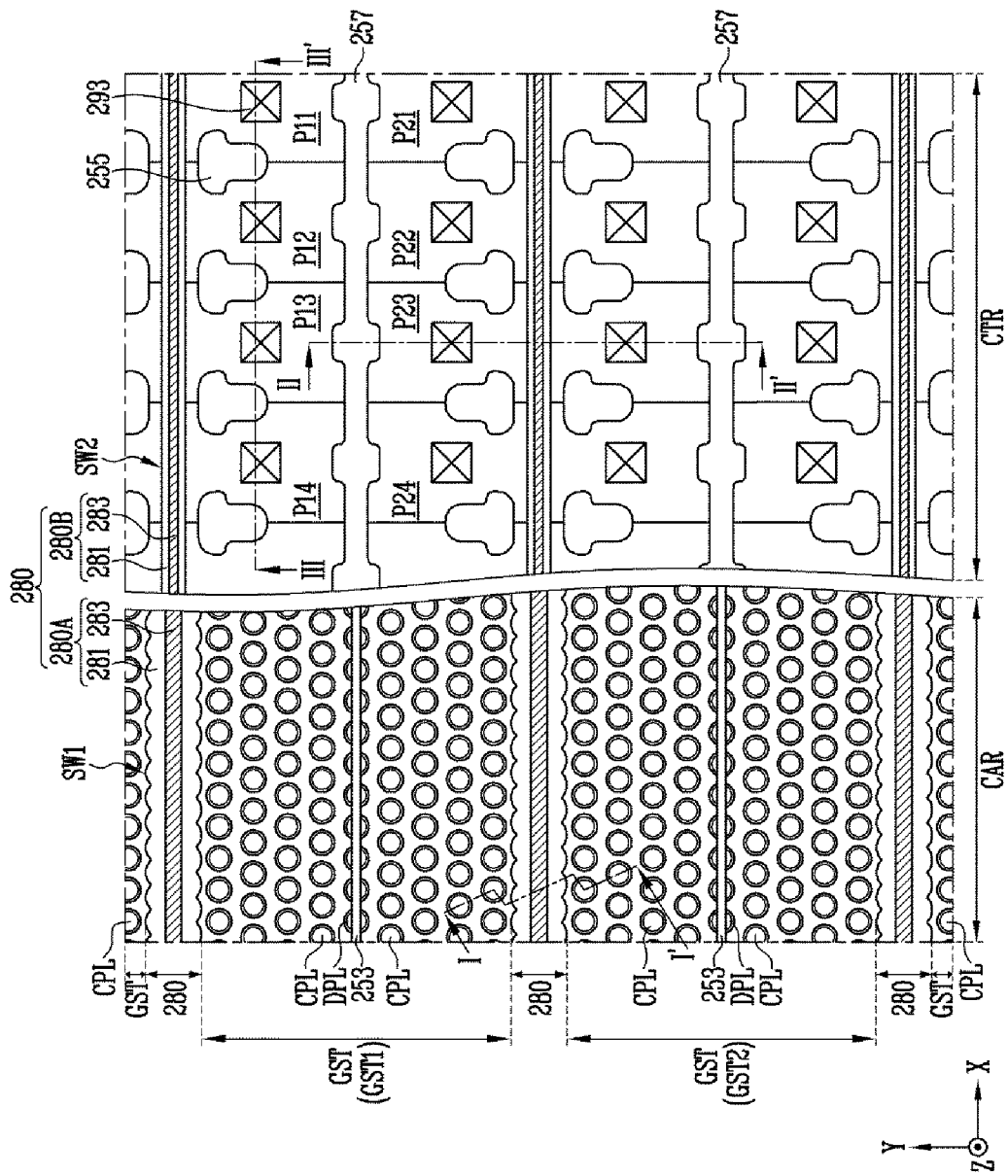
FIG. 3 is a plan view of a semiconductor memory device according to an embodiment.

FIG. 3 is a plan view of a semiconductor memory device according to an embodiment. More specifically, FIG. 3 is a layout view of gate stacked structures of the semiconductor memory device.

Referring to FIG. 3, the semiconductor memory device may include a plurality of gate stacked structures GST. Each of the gate stacked structures GST may extend along a plane. According to an embodiment, the gate stacked structure GST may extend along an XY-plane in an XYZ coordinate system.

The gate stacked structure GST may include a cell array region CAR and a contact region CTR. The contact region CTR of the gate stacked structure GST may extend from the cell array region CAR. According to an embodiment, the contact region CTR of the gate stacked structure GST may extend from the cell array region CAR in an X-axis direction. The contact region CTR of the gate stacked structure GST may include a plurality of pad portions P11, P12, P13, P14, P21, P22, P23, and P24. The plurality of pad portions P11 to P14 and P21 to P24 may be disposed in different levels in a Z-axis direction and may form a stepped structure in the contact region CTR.

The gate stacked structure GST may include a first sidewall SW1 that is defined along the cell array region CAR and a second sidewall SW2 that is defined along the contact region CTR. The roughness of the first sidewall SW1 may be greater than that of the second sidewall SW2. The first sidewall SW1 may extend sinuously to have depressions and protrusions. According to an embodiment, the first sidewall SW1 may have sinuous depressions and protrusions that are defined along the X-axis direction. The second sidewall SW2 may extend in a substantially straight manner. According to an embodiment, the second sidewall SW2 may extend in the X-axis direction.

A plurality of vertical structures 280 may be disposed between the plurality of gate stacked structures GST that are spaced apart from each other. For example, the plurality of gate stacked structures GST may include a first gate stacked structure GST1 and a second gate stacked structure GST2. One of the plurality of vertical structures 280 may be disposed between the first gate stacked structure GST1 and the second gate stacked structure GST2.

Each of the plurality of vertical structures 280 may include a first portion 280A and a second portion 280B. The first portion 280A of the vertical structure 280 may extend along the cell array region CAR of the gate stacked structure GST, and the second portion 280B of the vertical structure 280 may extend along the contact region CTR of the gate stacked structure GST. For example, the first portion 280A of the vertical structure 280 may be disposed between the first gate stacked structure GST1 of the cell array region CAR and the second gate stacked structure GST2 of the cell array region CAR. In addition, the second portion 280B of the vertical structure 280 may be disposed between the first gate stacked structure GST1 of the contact region CTR and the second gate stacked structure GST2 of the contact region CTR.

The semiconductor memory device may include a plurality of cell plugs CPL that are disposed to be adjacent to both sides of the first portion 280A of the vertical structure 280. The plurality of cell plugs CPL may pass through the cell array region CAR of the gate stacked structure GST in the Z-axis direction. The first portion 280A of the vertical structure 280 may have depressions and protrusions that face the plurality of cell plugs CPL. The depressions and the protrusions of the first portion 280A may be defined along the first sidewall SW1 of the gate stacked structure GST.

A gate isolation structure 253 may be embedded in the gate stacked structure GST. The gate isolation structure 253 may be an insulating material that separates the first drain select line DSL1 and the second drain select line DSL2, shown in FIG. 2, from each other. The gate isolation structure 253 may extend in the same direction as the first portion 280A of the vertical structure 280. According to an embodiment, the gate isolation structure 253 may extend in the X-axis direction. The plurality of cell plugs CPL may be divided into a first group and a second group, adjacent to both sides of the gate isolation structure 253. A plurality of dummy plugs DPL may be disposed between the cell plugs CPL of the first group and the cell plugs CPL of the second group. The plurality of dummy plugs DPL may pass through the gate stacked structure GST in the Z-axis direction and may be arranged next to each other in a line along a direction in which the gate isolation structure 253 extends. The gate isolation structure 253 may extend into the plurality of dummy plugs DPL. The gate isolation structure 253 may be formed to be shorter than the dummy plug DPL in the Z-axis direction.

The semiconductor memory device may include a plurality of conductive gate contacts 293. The plurality of conductive gate contacts 293 may be disposed to be adjacent to both sides of the second portion 280B of the vertical structure 280. The plurality of conductive gate contacts 293 may be in contact with the plurality of pad portions P11 to P14 and P21 to P24 of the gate stacked structure GST and may extend in the Z-axis direction.

Each of the first portion 280A and the second portion 280B of the vertical structure 280 may include an insulating material or may include an insulating material and a conductive material that passes through the insulating material. According to an embodiment, each of the first portion 280A and the second portion 280B of the vertical structure 280 may include an insulating layer 281 and a conductive source contact 283.

The insulating layer 281 may extend along the first sidewall SW1 and the second sidewall SW2 of the gate stacked structure GST. The conductive source contact 283 may be spaced apart from the gate stacked structure GST with the insulating layer 281 therebetween. The conductive source contact 283 may include at least one of a doped semiconductor layer, a metal silicide layer, a metal barrier layer, and a metal layer. The conductive source contact 283 may extend along the insulating layer 281 and may be formed to have a linear shape. According to an embodiment, each of the insulating layer 281 and the conductive source contact 283 may extend along the X-axis direction.

The contact region CTR of the gate stacked structure GST may be penetrated by a vertical insulating structure 257 and a plurality of supporting pillars 255. The vertical insulating structure 257 and the plurality of supporting pillars 255 may include the same insulating material.

The vertical insulating structure 257 may linearly extend in the contact region CTR of the gate stacked structure GST. According to an embodiment, the vertical insulating structure 257 may extend in the X-axis direction in the contact region CTR of the gate stacked structure GST.

The plurality of supporting pillars 255 and the plurality of conductive gate contacts 293 may be alternately disposed. According to an embodiment, the plurality of supporting pillars 255 and the plurality of conductive gate contacts 293 may be alternately disposed in the X-axis direction.

Figure 4:
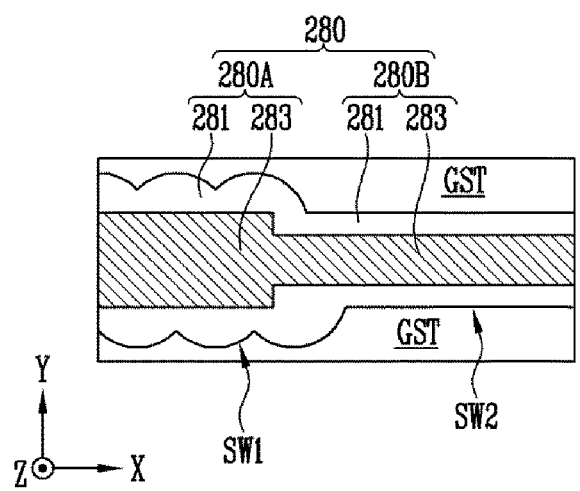
FIG. 4 is an enlarged plan view of a part of a semiconductor memory device according to an embodiment.

FIG. 4 is an enlarged plan view of a part of a semiconductor memory device according to an embodiment. More specifically, FIG. 4 is the enlarged plan view of a boundary portion between the first sidewall SW1 and the second sidewall SW2 of the gate stacked structure GST and a boundary portion between the first portion 280A and the second portion 280B of the vertical structure 280.

Referring to FIG. 4, the first sidewall SW1 and the second sidewall SW2 of each of the gate stacked structures GST may be coupled to each other. Each of the insulating layer 281 and the conductive source contact 283 may extend from the first portion 280A of the vertical structure 280 to the second portion 280B of the vertical structure 280.

Figure 5A:
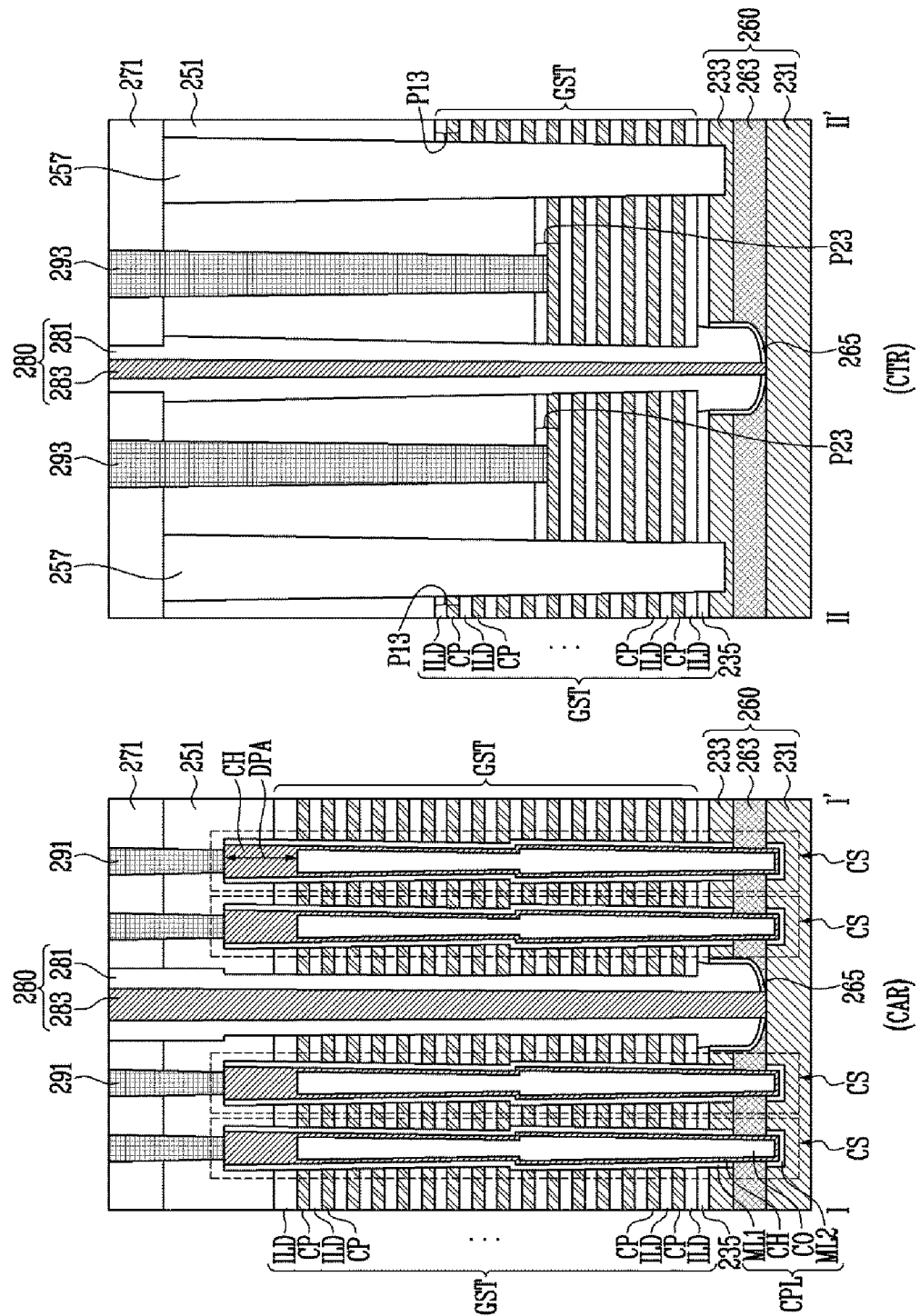
FIGS. 5A and 5B are cross-sectional diagrams illustrating a semiconductor memory device, shown in FIG. 3.
Figure 5B:
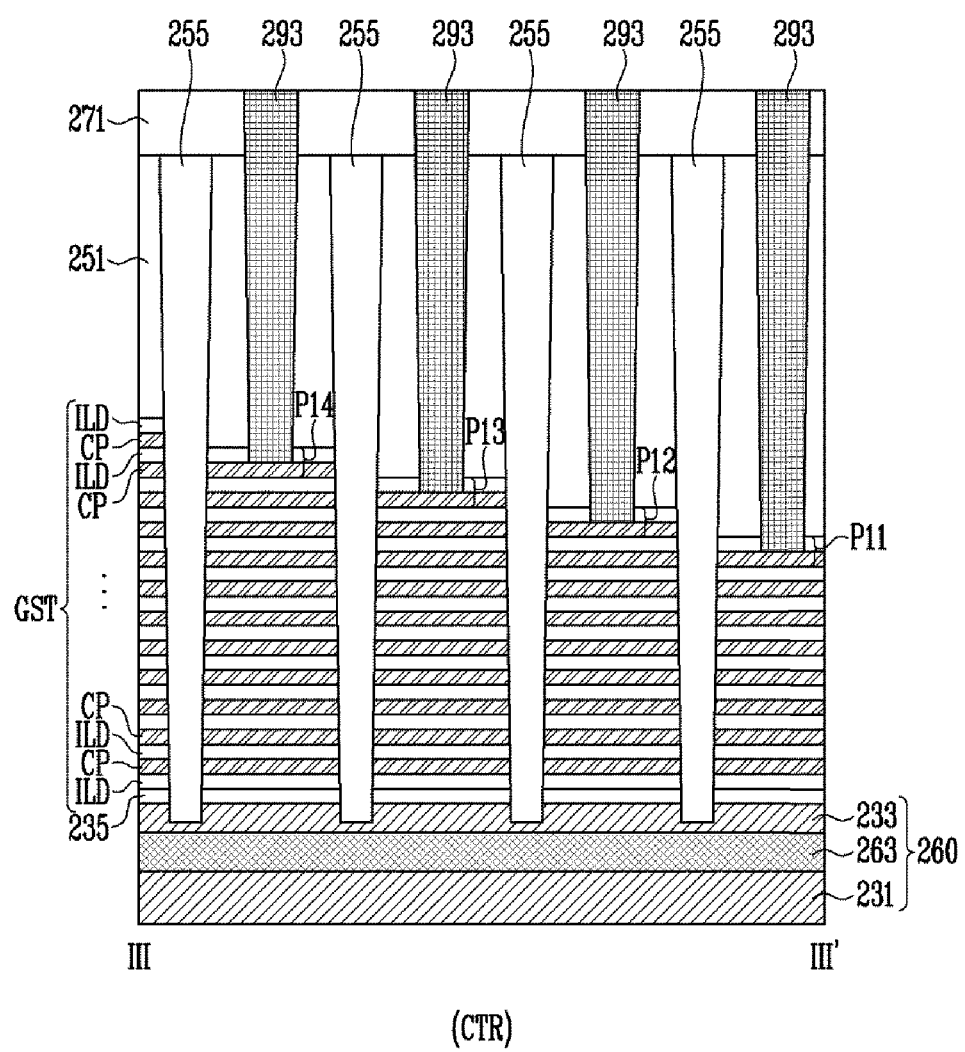

FIGS. 5A and 5B are cross-sectional diagrams illustrating the semiconductor memory device, shown in FIG. 3. FIG. 5A is a cross-sectional diagram of the semiconductor memory device taken along line I-I' and line II-II', shown in FIG. 3, and FIG. 5B is a cross-sectional diagram of the semiconductor memory device taken along line III-III', shown in FIG. 3.

Referring to FIGS. 5A and 5B, the plurality of gate stacked structures GST may be disposed over a source structure 260. A lower insulating layer 235 may be disposed between the source structure 260 and each of the gate stacked structures GST.

The source structure 260 may extend along a plane to overlap the cell array region CAR and the contact region CTR of each of the gate stacked structures GST. According to an embodiment, the source structure 260 may extend along the XY-plane. Although not illustrated in FIGS. 5A and 5B, a semiconductor substrate (not illustrated) with transistors that form the peripheral circuit structure 190, shown in FIG. 1, may be disposed below the source structure 260. In such embodiments, the source structure 260 may be disposed over an insulating structure (not illustrated) that covers the semiconductor substrate.

The source structure 260 may include a doped semiconductor layer. According to an embodiment, the source structure 260 may include a first semiconductor layer 231, a channel contact layer 263, and a second semiconductor layer 233 that are stacked on each other. Each of the first semiconductor layer 231, the channel contact layer 263, and the second semiconductor layer 233 may include a doped semiconductor layer with a conductivity type impurity. According to an embodiment, each of the first semiconductor layer 231, the channel contact layer 263, and the second semiconductor layer 233 may include an n-type doped semiconductor layer.

The second semiconductor layer 233 may be disposed over the first semiconductor layer 231. The channel contact layer 263 may be disposed between the first semiconductor layer 231 and the second semiconductor layer 233.

The first portion 280A and the second portion 280B of the vertical structure 280 may extend into the source structure 260. According to an embodiment, the first portion 280A and the second portion 280B of the vertical structure 280 may pass through the lower insulating layer 235, the second semiconductor layer 233, and the channel contact layer 263.

The conductive source contact 283 may be connected to the source structure 260. According to an embodiment, the conductive source contact 283 may be in contact with the first semiconductor layer 231 of the source structure 260. The source structure 260 and the conductive source contact 283 may be connected to the source line SL, shown in FIG. 2. According to an embodiment, the source structure 260 may be connected to the source line SL, shown in FIG. 2, via the conductive source contact 283.

The insulating layer 281 may be disposed between the conductive source contact 283 and each of the plurality of gate stacked structures GST. The insulating layer 281 may pass through the lower insulating layer 235 and may extend toward the first semiconductor layer 231. According to an embodiment, an oxide layer 265 may be interposed between the insulating layer 281 and each of the first semiconductor layer 231, the channel contact layer 263, and the second semiconductor layer 233 of the source structure 260.

A plurality of memory cell strings CS may include the plurality of cell plugs CPL. Each of the plurality of memory cell strings CS may be connected not only to the source structure 260, but also to a plurality of conductive patterns CP of the gate stacked structure GST. The gate stacked structure GST may include not only the plurality of conductive patterns CP, but also a plurality of interlayer insulating layers ILD. The plurality of conductive patterns CP and the plurality of interlayer insulating layers ILD may be alternately stacked in the Z-axis direction over the source structure 260. Each of the conductive patterns CP may include various conductive materials, such as a doped semiconductor layer, a metal layer, and a conductive metal nitride. The conductive pattern CP may include a single type of a conductive material or two or more types of conductive materials. Each of the interlayer insulating layers ILD may include a silicon oxide layer.

Each of the cell plugs CPL may include a first memory pattern ML1, a channel structure CH, a core insulating layer CO, and a second memory pattern ML2.

The channel structure CH may pass through the gate stacked structure GST. The channel structure CH may extend into the source structure 260 to be in contact with the source structure 260. According to an embodiment, the channel structure CH may pass through the second semiconductor layer 233 and may extend into the first semiconductor layer 231 of the source structure 260. The channel contact layer 263 of the source structure 260 may be in contact with a sidewall of the channel structure CH and may surround the sidewall of the channel structure CH. The channel structure CH may serve as a channel region of the memory cell string CS. The channel structure CH may include a semiconductor layer. The channel structure CH may extend along a sidewall, a bottom surface, and a top surface of the core insulating layer CO. A doped region DPA may be defined by the end of the channel structure CH that is formed on the core insulating layer CO. The doped region DPA of the channel structure CH may include an n-type impurity.

The first memory pattern ML1 may be disposed between the gate stacked structure GST and the channel structure CH. The first memory pattern ML1 may extend between the second semiconductor layer 233 of the source structure 260 and the channel structure CH. The second memory pattern ML2 may be disposed between the first semiconductor layer 231 of the source structure 260 and the channel structure CH.

The plurality of conductive patterns CP may serve as the first drain select line DSL1, the second drain select line DSL2, the plurality of word lines WL, and the source select line SSL, shown in FIG. 2. According to an embodiment, at least one conductive pattern, among the plurality of conductive patterns CP, adjacent to the source structure 260, may serve as the source select line SSL, shown in FIG. 2. The uppermost conductive patterns, among the plurality of conductive patterns CP, may serve as the first drain select line DSL1 and the second drain select line DSL2, shown in FIG. 2. The conductive patterns, among the plurality of conductive patterns CP, disposed between the source select line SSL and each of the first drain select line DSL1 and the second drain select line DSL2 may serve as the word lines WL, shown in FIG. 2.

According to the above-described structure, the memory cells MC, shown in FIG. 2, may be defined at intersections of the channel structure CH and the conductive patterns CP that serve as the word lines. In addition, the drain select transistor DST, shown in FIG. 2, may be defined at the intersection of the channel structure CH and the conductive pattern CP that serves as the first drain select line or the second drain select line. Further, the source select transistor SST, shown in FIG. 2, may be defined at an intersection of the channel structure CH and the conductive pattern CP that serves as the source select line. The source select transistor SST, the memory cell MC, and the drain select transistor DST may be coupled in series by the channel structure CH and may form the memory cell string CS.

The plurality of interlayer insulating layers ILD and the plurality of conductive patterns CP may form the plurality of pad portions P11 to P14 and P21 to P24 in the contact region CTR of the gate stacked structure GST. Each of the plurality of pad portions P11 to P14 and P21 to P24 may include a interlayer insulating layer ILD and a conductive pattern CP that correspond to each pad portion. In other words, each of the plurality of pad portions P11 to P14 and P21 to P24 may be comprised of a corresponding pair of interlayer insulating layer ILD and conductive pattern CP.

The plurality of gate stacked structures GST and the plurality of cell plugs CPL may be covered by a first upper insulating layer 251. The vertical insulating structure 257 and the supporting pillar 255 may pass through the first upper insulating layer 251 and the gate stacked structure GST. The bottom surface of each of the vertical insulating structure 257 and the supporting pillar 255 may extend along a top surface of the second semiconductor layer 233.

The first upper insulating layer 251, the vertical insulating structures 257, and the supporting pillars 255 may be covered by a second upper insulating layer 271. The second upper insulating layer 271 may be penetrated by a plurality of conductive bit line contacts 291 and a plurality of conductive gate contacts 293.

Each of the conductive bit line contacts 291 may extend from a corresponding channel structure CH of the cell plug CPL to pass through the first upper insulating layer 251 and the second upper insulating layer 271. The channel structure CH may be connected to the bit line BL, shown in FIG. 2, via the conductive bit line contact 291.

Each of the conductive gate contacts 293 may extend to be in contact with a corresponding conductive pattern CP of a pad portion, among the plurality of pad portions P11 to P14 and P21 to P24 of the gate stacked structure GST. Each of the conductive gate contacts 293 may pass through the first upper insulating layer 251 and the second upper insulating layer 271. The plurality of conductive patterns CP may be connected to the row decoder 120, shown in FIG. 1, via the plurality of conductive gate contacts 293.

Hereinafter, a method of manufacturing a semiconductor memory device according to an embodiment is described mainly based on the cell array region CAR and the contact region CTR of the semiconductor memory device. Hereinafter, a detailed description already described above with reference to FIGS. 3, 4, 5A, and 5B will be omitted for the sake of brevity.

Figure 7A:
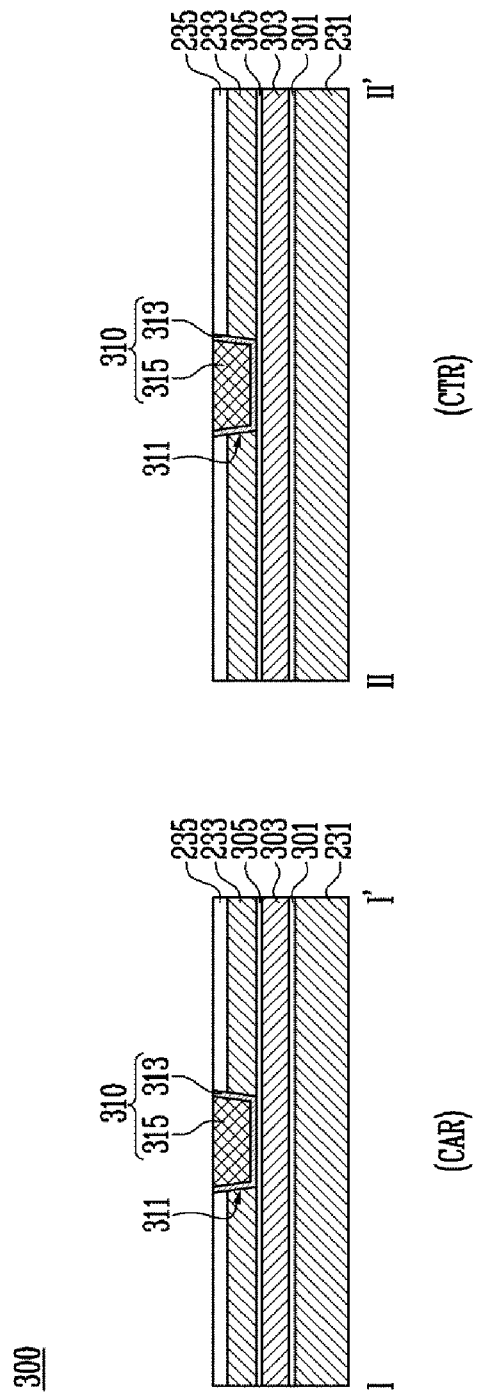
Figure 7B:
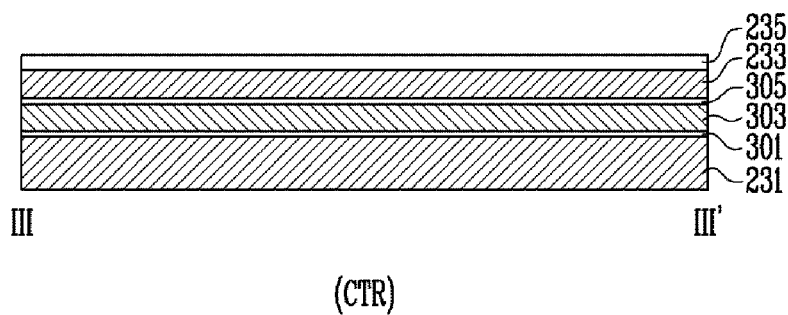

FIGS. 6, 7A, and 7B are diagrams illustrating a process of forming a lower structure 300 according to an embodiment. FIG. 6 is a plan view illustrating the lower structure 300, FIG. 7A is a cross-sectional diagram of the lower structure 300 taken along line I-I' and line II-II', shown in FIG. 6, and FIG. 7B is a cross-sectional diagram of the lower structure 300 taken along line III-III', shown in FIG. 6.

Referring to FIGS. 6, 7A, and 7B, the lower structure 300 may include the first semiconductor layer 231, a sacrificial source layer 303 over the first semiconductor layer 231, the second semiconductor layer 233 over the sacrificial source layer 303, and an etch stop pattern 310 that passes through the second semiconductor layer 233. The first semiconductor layer 231 may include a conductivity type dopant. According to an embodiment, the first semiconductor layer 231 may include n-type doped silicon. The second semiconductor layer 233 may include a conductivity type dopant or may be an undoped layer. According to an embodiment, the second semiconductor layer 233 may include n-type doped silicon or undoped silicon. According to an embodiment, the sacrificial source layer 303 may include undoped silicon. The etch stop pattern 310 may include a metal with an etch selectivity with respect to the second semiconductor layer 233. According to an embodiment, the etch stop pattern 310 may include a first metal nitride layer 313 that extends along a sidewall and a bottom surface of the etch stop pattern 310 and may include a first metal layer 315 over the first metal nitride layer 313. According to an embodiment, the first metal nitride layer 313 may include a titanium nitride layer, and the first metal layer 315 may include tungsten.

The lower structure 300 may further include a first protective layer 301 between the first semiconductor layer 231 and the sacrificial source layer 303 and may include a second protective layer 305 between the sacrificial source layer 303 and the second semiconductor layer 233. The first protective layer 301 and the second protective layer 305 may include a material with an etch selectivity with respect to the sacrificial source layer 303. According to an embodiment, the first protective layer 301 and the second protective layer 305 may include an oxide layer.

The lower structure 300 may further include a lower insulating layer 235 on the second semiconductor layer 233. The lower insulating layer 235 may include an oxide layer.

Forming the lower structure 300 may include stacking the first semiconductor layer 231, the first protective layer 301, the sacrificial source layer 303, the second protective layer 305, the second semiconductor layer 233, and the lower insulating layer 235, as described above, forming a plurality of grooves 311 passing through the lower insulating layer 235 and the second semiconductor layer 233, forming the first metal nitride layer 313 along a surface of each of the plurality of grooves 311, forming the first metal layer 315 on the first metal nitride layer 313, and planarizing the first metal layer 315 and the first metal nitride layer 313 to expose the lower insulating layer 235.

Each of the plurality of grooves 311 may extend from the cell array region CAR of the lower structure 300 to the contact region CTR of the lower structure 300. According to an embodiment, the plurality of grooves 311 may be formed to have a linear shape that extends in the X-axis direction and may be spaced apart from each other in a Y-axis direction.

Although not illustrated in FIGS. 6, 7A, and 7B, according to an embodiment, before the lower structure 300 is formed, a first semiconductor substrate with transistors that constitute the peripheral circuit structure 190, shown in FIG. 1, may be provided. According to such embodiment, the lower structure 300 may be disposed over an insulating structure that covers the first semiconductor substrate. According to another embodiment, the lower structure 300 may be formed over a separate second semiconductor substrate that is different from the first semiconductor substrate, and a subsequent process for forming a memory cell array over the second semiconductor substrate may be performed. According to such embodiment, the first semiconductor substrate with the transistors that constitute the peripheral circuit structure 190, shown in FIG. 1, may be bonded to the memory cell array over the second semiconductor substrate through bonding pads.

FIGS. 8, 9A, 9B, 10, 11A, 11B, 12A, 12B, 13A, and 13B are diagrams illustrating a process of forming a stacked structure and a hole group and a process of forming a plurality of sacrificial pillars according to an embodiment.

Figure 8:
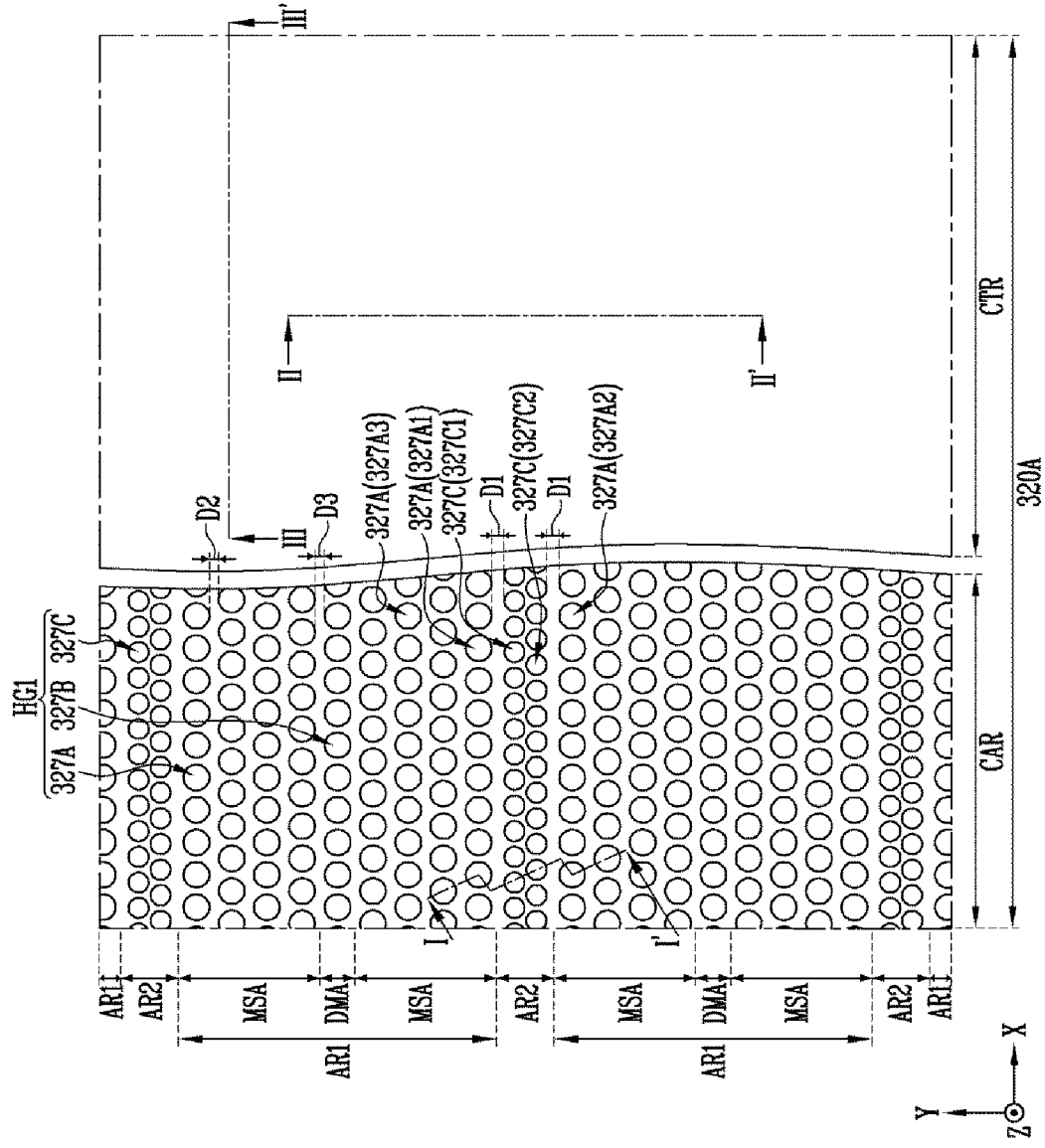
FIGS. 8, 9A, 9B, 10, 11A, 11B, 12A, 12B, 13A, and 13B are diagrams illustrating a process of forming a stacked structure and a hole group and a process of forming a plurality of sacrificial pillars according to an embodiment.
Figure 9A:
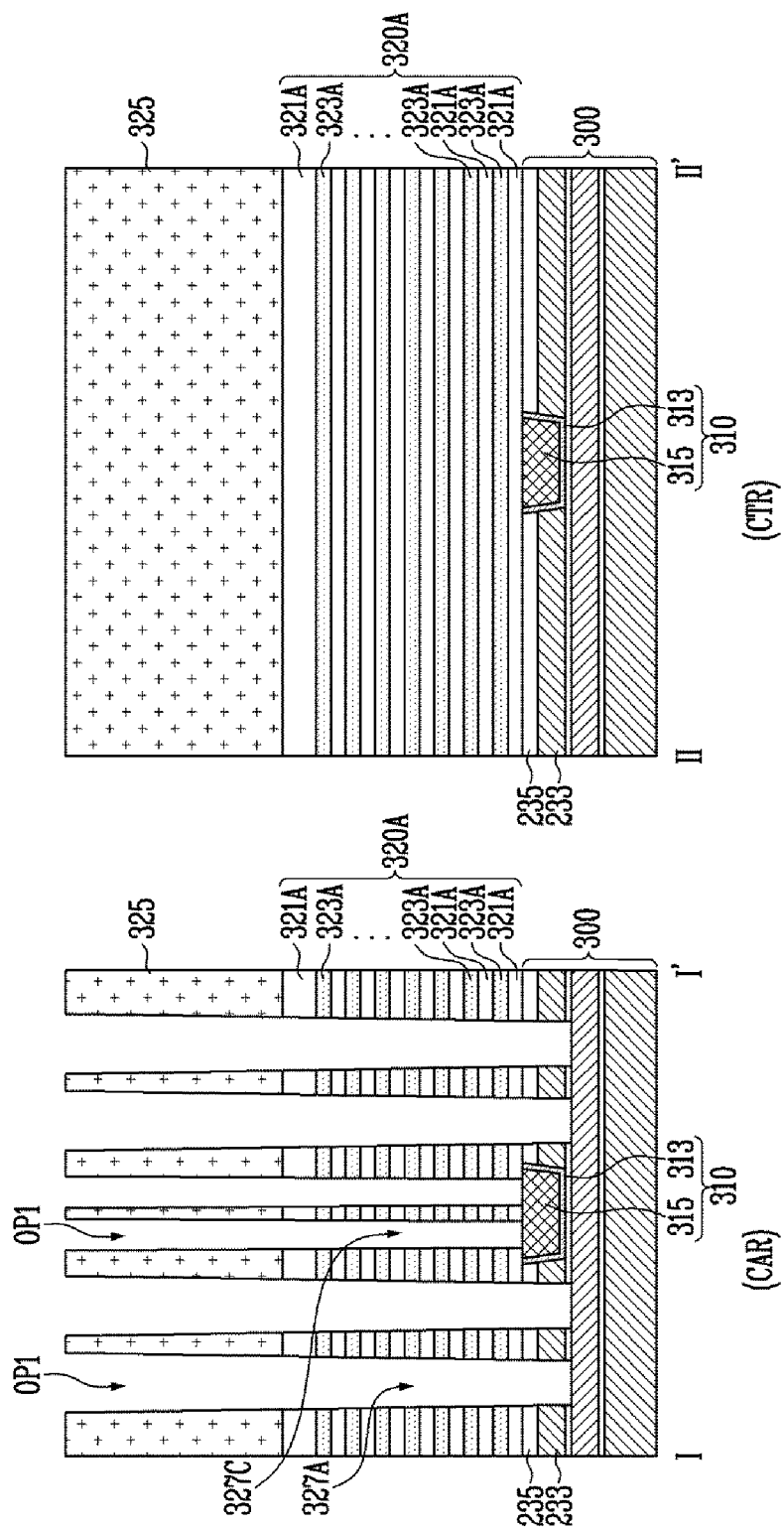
Figure 9B:
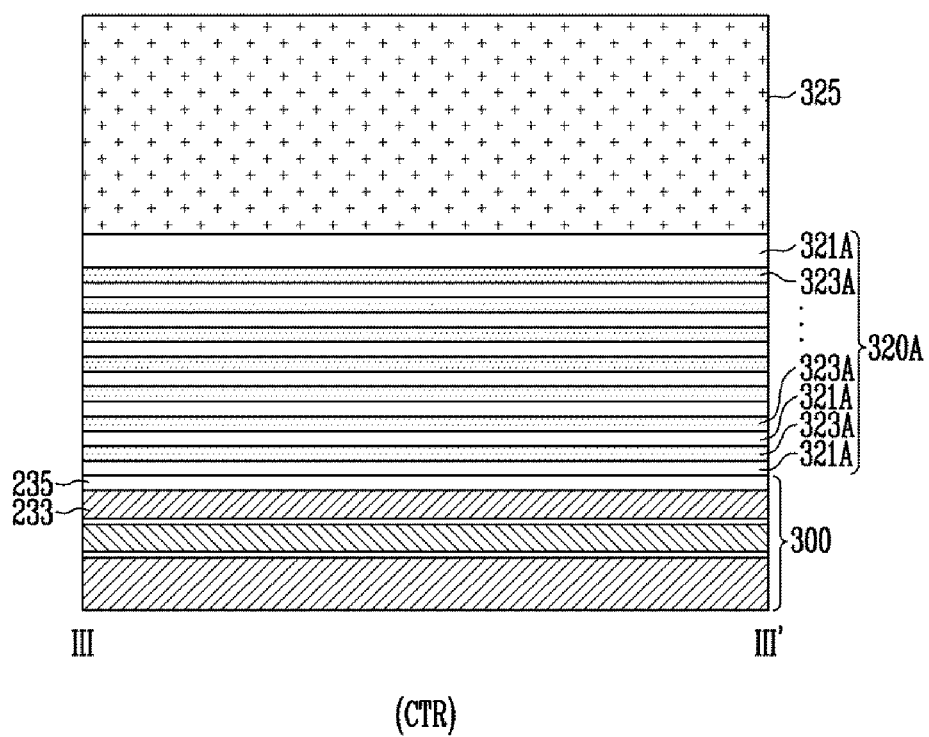

FIG. 8 is a plan view illustrating a first stacked structure 320A and a first hole group HG1. FIG. 9A is a cross-sectional diagram of the first stacked structure 320A taken along line I-I' and line II-II', shown in FIG. 8. FIG. 9B is a cross-sectional diagram of the first stacked structure 320A taken along line III-III', shown in FIG. 8.

Referring to FIGS. 8, 9A, and 9B, the process of forming the stacked structure and the hole group may include forming the first stacked structure 320A and forming the first hole group HG1.

Forming the first stacked structure 320A may include alternately stacking a plurality of lower first material layers 321A and a plurality of lower second material layers 323A over the lower structure 300. The first stacked structure 320A may include the cell array region CAR and the contact region CTR. The plurality of lower first material layers 321A and the plurality of lower second material layers 323A may extend from the cell array region CAR to the contact region CTR.

Each of the plurality of lower first material layers 321A may include the same material as the interlayer insulating layer ILD, shown in FIGS. 5A and 5B. Each of the plurality of lower second material layers 323A may include a material with an etch selectivity with respect to the plurality of lower first material layers 321A. According to an embodiment, the lower first material layer 321A may include an oxide, such as a silicon oxide layer, and the lower second material layer 323A may include a nitride, such as a silicon nitride layer. The etch selectivity of the first metal layer 315 with respect to each of the plurality of lower first material layers 321A and the plurality of lower second material layers 323A may be higher than the etch selectivity of the second semiconductor layer 233 with respect to each of the plurality of lower first material layers 321A and the plurality of lower second material layers 323A.

Subsequently, a first hard mask pattern 325 may be formed over the first stacked structure 320A. The first hard mask pattern 325 may include a carbon layer. The first hard mask pattern 325 may include a plurality of first openings OP1 that are formed through a photolithography process. Each of the plurality of first openings OP1 may overlap the cell array region CAR of the first stacked structure 320A and the contact region CTR of the first stacked structure 320A may be blocked by the first hard mask pattern 325.

Thereafter, the first hole group HG1 may be formed by etching the plurality of lower first material layers 321A and the plurality of lower second material layers 323A through each of the plurality of first openings OP1. The lower insulating layer 235 may be etched during an etching process for forming the first hole group HG1.

The cell array region CAR of the first stacked structure 320A may include a plurality of first regions AR1 and a plurality of second regions AR2 that are disposed alternately with each other in one direction. The direction in which the plurality of first regions AR1 and the plurality of second regions AR2 are arranged may be different from the direction in which the cell array region CAR and the contact region CTR are arranged. According to an embodiment, the plurality of first regions AR1 and the plurality of second regions AR2 may be alternately disposed in the Y-axis direction. Two adjacent first regions AR1 may be disposed to be adjacent to both sides of the etch stop pattern 310. The second region AR2 may overlap the etch stop pattern 310 corresponding thereto.

Each of the plurality of first regions AR1 may include two or more memory cell string regions MSA and a dummy region DMA that is between the memory cell string regions MSA. The memory cell string regions MSA of the first region AR1 may be arranged in the direction in which the plurality of first regions AR1 and the plurality of second regions AR2 are arranged.

The first hole group HG1 may include a plurality of lower channel holes 327A, a plurality of lower dummy holes 327B, and a plurality of lower auxiliary holes 327C. Each of the plurality of lower channel holes 327A and each of the plurality of lower dummy holes 327B may pass through the first region AR1 of the first stacked structure 320A. Each of the plurality of lower auxiliary holes 327C may pass through the second region AR2 of the first stacked structure 320A. The second semiconductor layer 233 may be exposed by the lower channel hole 327A and the lower dummy hole 327B, and the first metal layer 315 of the etch stop pattern 310 may be exposed by the lower auxiliary hole 327C. A cross-sectional shape of each of the lower channel hole 327A, the lower dummy hole 327B, and the lower auxiliary hole 327C may be a circle, an ellipse, or a polygon.

The plurality of lower channel holes 327A may be arranged to be in a plurality of rows. Lower channel holes of each row may be aligned with each other in a line in a first direction in which the cell array region CAR faces the contact region CTR. According to an embodiment, the lower channel holes of each row may be aligned with each other in a line in the X-axis direction. The plurality of lower channel holes 327A may include a plurality of first lower channel holes 327A1 that are arranged in a first row and a plurality of second lower channel holes 327A2 that are arranged in a second row. The first row and the second row may be respectively disposed at both sides of the second region AR2. The plurality of lower auxiliary holes 327C may include lower auxiliary holes that are arranged in two rows in the second region AR2. For example, the plurality of lower auxiliary holes 327C may include a plurality of first lower auxiliary holes 327C1 that are arranged in a third row that is adjacent to the first row and a plurality of second lower auxiliary holes 327C2 that are arranged in a fourth row that is adjacent to the second row. According to the above-described arrangement, the first lower auxiliary holes 327C1 and the second lower auxiliary holes 327C2 may be disposed between the first lower channel holes 327A1 and the second lower channel holes 327A2.

The lower dummy hole 327B may have substantially the same width as the lower channel hole 327A. Accordingly, uniformity of the hole patterns in the first region AR1 may be improved.

The distance between the first lower auxiliary hole 327C1 and the second lower auxiliary hole 327C2 that are arranged in adjacent rows may be defined to be smaller than the distance D1 between the lower auxiliary hole 327C and the lower channel hole 327A, arranged in adjacent rows. For example, the distance between the first lower auxiliary hole 327C1 and the second lower auxiliary hole 327C2 may be defined to be less than the distance D1 between the first lower channel hole 327A1 and the first lower auxiliary hole 327C1 or the distance D1 between the second lower channel hole 327A2 and the second lower auxiliary hole 327C2. The distance D1 between the lower auxiliary hole 327C and the lower channel hole 327A that are arranged in adjacent rows may be defined to be greater than each of a distance D2 between the lower channel holes 327A that are arranged in adjacent rows and a distance D3 between the lower channel hole 327A and the lower dummy hole 327B that are arranged in adjacent rows. The above-described design condition may be advantageous when securing process margins in performing a subsequent process that will be described below with reference to FIG. 25.

The distance D3 between the lower channel hole 327A and the lower dummy hole 327B that are arranged in adjacent rows may be substantially the same as the distance D2 between the lower channel holes 327A that are arranged in adjacent rows. Accordingly, uniformity of hole patterns in the first region AR1 may be improved.

In a second direction in which the plurality of first regions AR1 and the plurality of second regions AR2 are arranged, the lower auxiliary hole 327C may have a smaller width than each of the lower channel hole 327A and the lower dummy hole 327B. According to an embodiment, the lower auxiliary hole 327C may have a smaller width than each of the lower channel hole 327A and the lower dummy hole 327B in the Y-axis direction. Accordingly, the area of the second region AR2 that is provided for the plurality of lower auxiliary holes 327C may be reduced, thereby increasing integration density of a semiconductor memory device.

According to an embodiment, when the lower channel holes 327A and the lower dummy holes 327B are formed in the first region AR1 of the first stacked structure 320A, the lower auxiliary holes 327C may be formed in the second region AR2 of the first stacked structure 320A. Accordingly, according to an embodiment, the continuity of hole patterns in the cell array region CAR may be increased. For example, when the lower auxiliary hole 327C is not arranged in the second region AR2, the cell array region CAR may be divided into a region in which the hole patterns are continuously arranged and a region in which hole patterns are not formed. In such an example, when a photolithography process for defining first openings is performed, an optical distortion phenomenon may occur and the shape of a first opening that is adjacent to the region in which the hole patterns are not formed may be distorted. According to an embodiment, a photomask for the plurality of first openings OP1 may be designed such that the lower auxiliary holes 327C are formed in the second region AR2 of the first stacked structure 320A when the lower channel holes 327A and the lower dummy holes 327B are formed in the first region AR1 of the first stacked structure 320A. According to such design, the optical distortion may be mitigated during the photolithography process for defining the plurality of first openings OP1. Accordingly, according to an embodiment, the distortion of shapes with regard to the plurality of first openings OP1 may be mitigated, and the distortion of the shape of the first hole group HG1 that is defined by the plurality of first openings OP1 may also be mitigated. For example, the shape of each of the lower channel holes 327A1 or 327A2 in a row adjacent to the second region AR2 may be substantially the same as the shape of each of a plurality of lower channel holes 327A3 in rows other than the row that is adjacent to the second region AR2.

According to an embodiment, because the optical distortion phenomenon is mitigated, the plurality of lower channel holes 327A and the plurality of lower dummy holes 327B may be formed to have substantially the same width in the first region AR1.

Figure 10:
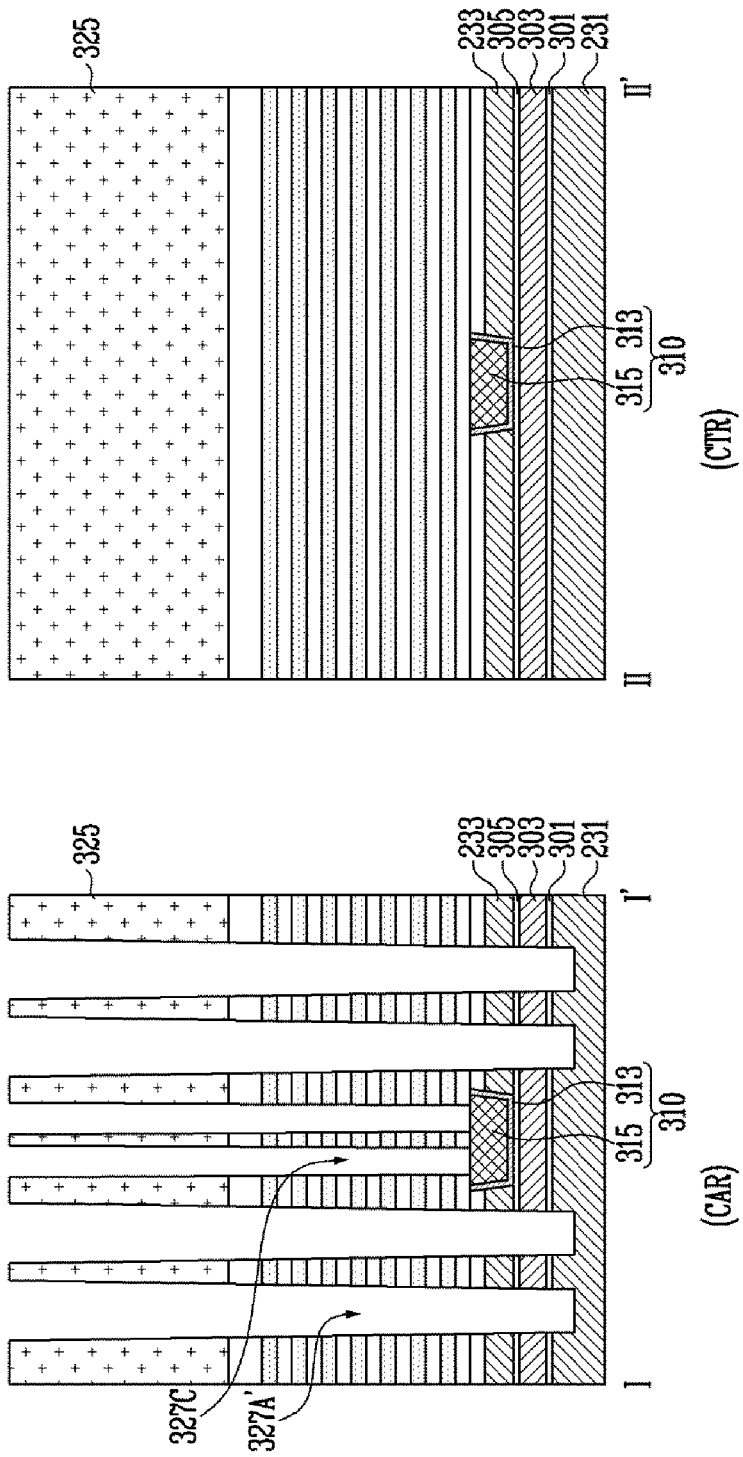

FIG. 10 is a plan view illustrating a process of expanding a depth of each of the plurality of lower channel holes 327A, shown in FIGS. 8 and 9A.

Referring to FIG. 10, the process of forming the stacked structure and the hole group may include forming a plurality of lower channel holes 327A' with an expanded depth. To form the plurality of lower channel holes 327A' with the expanded depth, the second semiconductor layer 233, the second protective layer 305, the sacrificial source layer 303, and the first protective layer 301 that are exposed through the first hole group HG1, shown in FIGS. 8 and 9A, may be selectively etched. Accordingly, each of the plurality of lower channel holes 327A, shown in FIGS. 8 and 9A, may expand to be deep enough to pass through the second semiconductor layer 233, the second protective layer 305, the sacrificial source layer 303, and the first protective layer 301, thereby defining the plurality of lower channel holes 327A' with the expanded depth.

The plurality of lower channel holes 327A' with the expanded depth may extend into the first semiconductor layer 231. When the plurality of lower channel holes 327A' with the expanded depth are formed, the depth of each of the lower dummy holes 327B, shown in FIG. 8, may expand to extend into the first semiconductor layer 231, similar to the lower channel holes.

When the above-described selective etching process is performed, the second semiconductor layer 233, the second protective layer 305, the sacrificial source layer 303, and the first protective layer 301 that overlap the lower auxiliary holes 327C may be protected by the etch stop pattern 310.

Figure 11A:
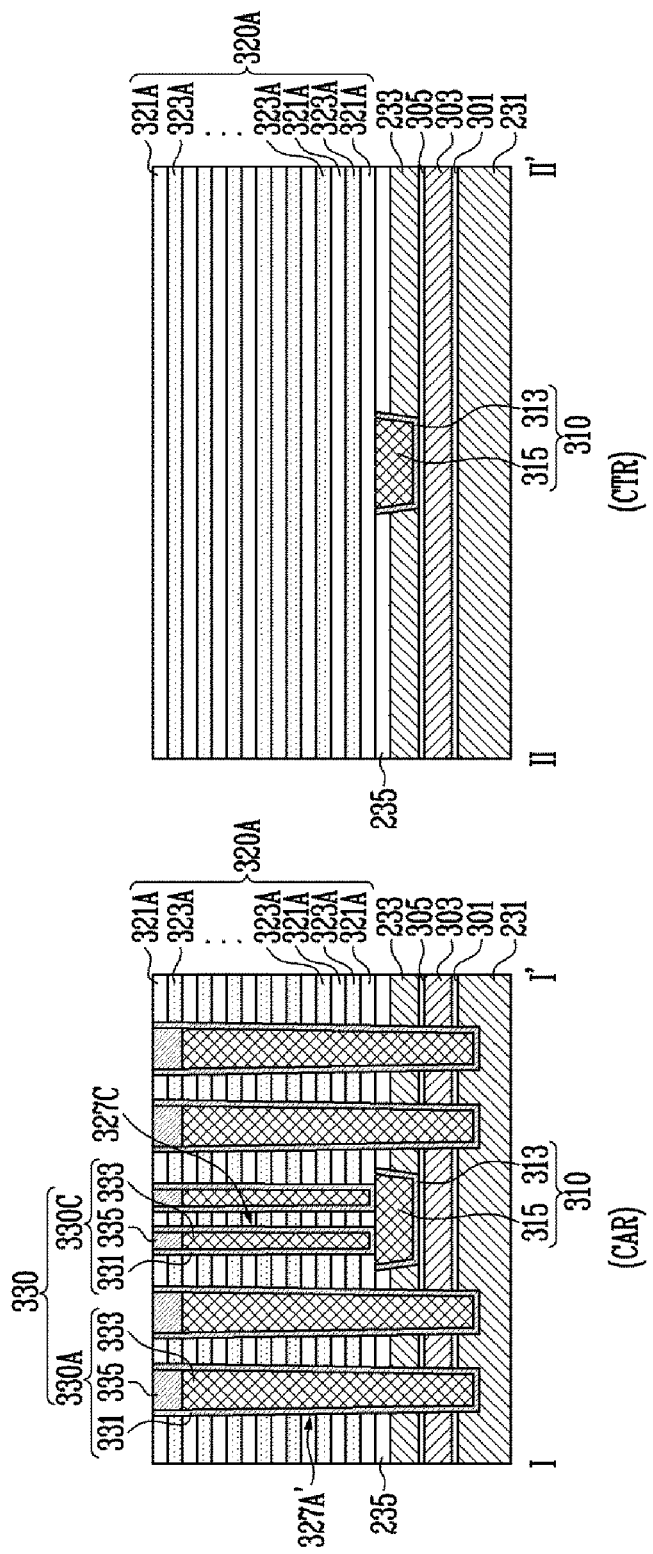
Figure 11B:
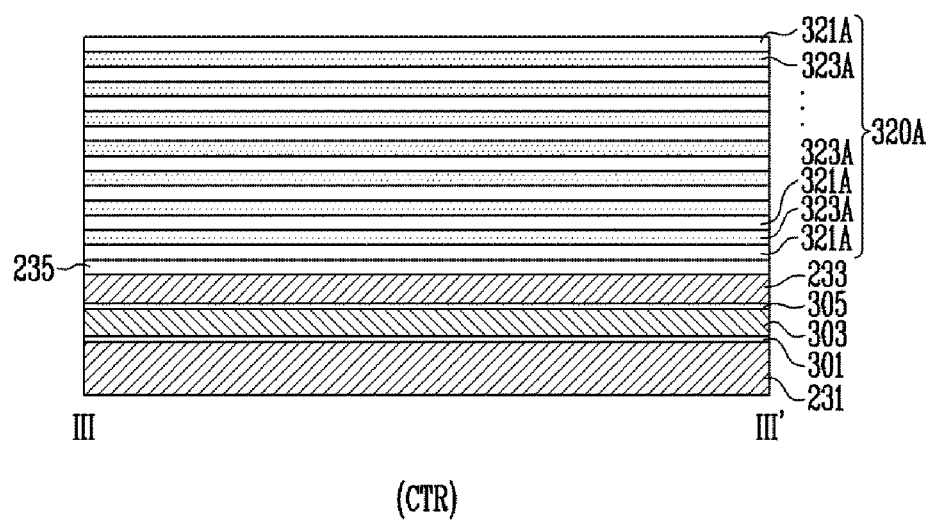

FIGS. 11A and 11B are cross-sectional diagrams illustrating a lower sacrificial group 330.

Referring to FIGS. 11A and 11B, the process of forming the plurality of sacrificial pillars may include forming the lower sacrificial group 330. Forming the lower sacrificial group 330 may include forming a sacrificial material, filling each of the plurality of lower auxiliary holes 327C and the plurality of lower channel holes 327A' with the expanded depth and planarizing a surface of the sacrificial material to expose the first stacked structure 320A. Although not illustrated in FIGS. 11A and 11B, the lower dummy hole with the expanded depth may also be filled with a sacrificial material.

The sacrificial material may include a material with an etch selectivity not only with respect to the lower first material layers 321A and the lower second material layers 323A of the first stacked structure 320A, but also with respect to the first semiconductor layer 231, the sacrificial source layer 303, and the second semiconductor layer 233. According to an embodiment, the sacrificial material may include a second metal nitride layer 331, a second metal layer 333, and a third metal nitride layer 335. For example, the second metal nitride layer 331 and the third metal nitride layer 335 may include a titanium nitride layer, similar to the first metal nitride layer 313. The second metal layer 333 may include tungsten, similar to the first metal layer 315.

The second metal nitride layer 331 may extend along a surface of each of the plurality of lower auxiliary holes 327C and the plurality of lower channel holes 327A' with the expanded depth. The second metal layer 333 may be formed on the second metal nitride layer 331 and may be formed to have a height to open an upper portion of each of the plurality of lower auxiliary holes 327C and the plurality of lower channel holes 327A' with the expanded depth. The third metal nitride layer 335 may be disposed on the second metal layer 333 in each of the plurality of lower auxiliary holes 327C and the plurality of lower channel holes 327A' with the expanded depth.

The lower sacrificial group 330 may include a first lower sacrificial pillar 330A that fills the lower channel hole 327A' with the expanded depth and a second lower sacrificial pillar 330C that fills the lower auxiliary hole 327C. Although not illustrated in FIGS. 11A and 11B, the lower sacrificial group 330 may further include a lower dummy pillar that fills the lower dummy hole with the expanded depth, and the cross section of the lower dummy pillar may be substantially the same as that of the first lower sacrificial pillar 330A.

Figure 12A:
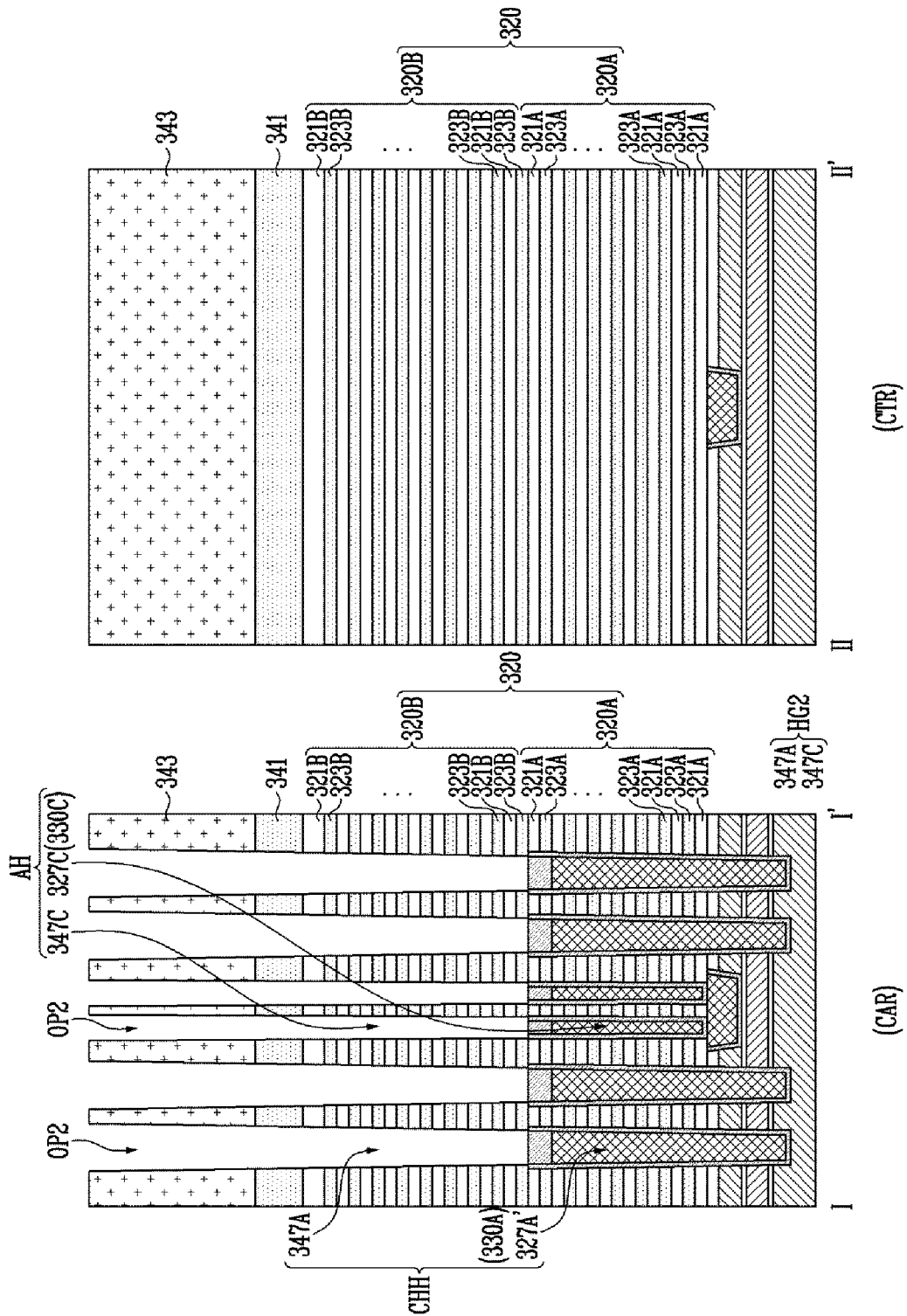
Figure 12B:
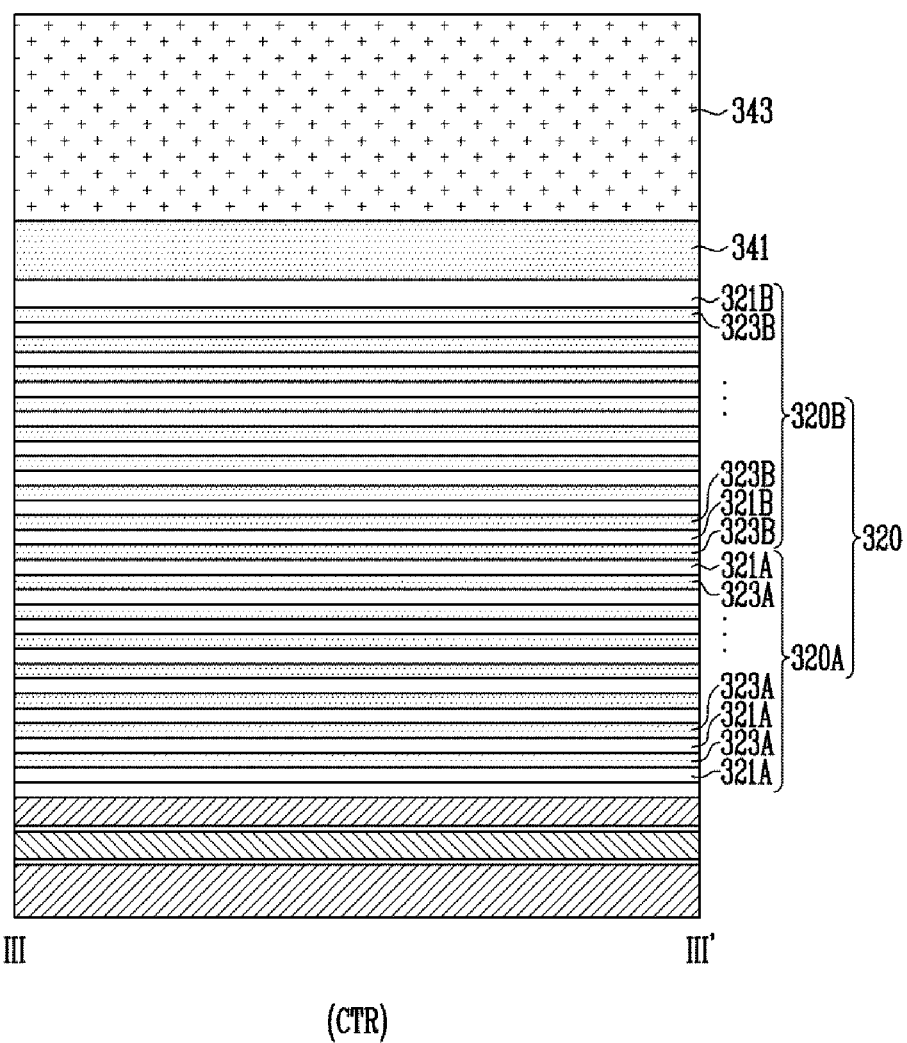

FIGS. 12A and 12B are cross-sectional diagrams illustrating a second stacked structure 320B and a second hole group HG2.

Referring to FIGS. 12A and 12B, the process of forming the stacked structure and the hole group may include forming the second stacked structure 320B and forming the second hole group HG2.

Forming the second stacked structure 320B may include alternately stacking a plurality of upper first material layers 321B and a plurality of upper second material layers 323B over the first stacked structure 320A. The second stacked structure 320B may include the cell array region CAR and the contact region CTR, similar to the first stacked structure 320A. The cell array region CAR of the second stacked structure 320B may be divided into the first region AR1 and the second region AR2, similar to the first stacked structure 320A as shown in FIG. 8. In addition, the first region AR1 of the second stacked structure 320B may be divided into two or more memory cell string regions MSA and the dummy region DMA between adjacent memory cell string regions MSA, similar to the first stacked structure 320A as shown in FIG. 8. The upper first material layer 321B may include the same material as the lower first material layer 321A, and the upper second material layer 323B may include the same material as the lower second material layer 323A.

Subsequently, an etch stop layer 341 and a second hard mask pattern 343 may be stacked over the second stacked structure 320B. The etch stop layer 341 may include a nitride layer. The second hard mask pattern 343 may include a carbon layer. The second hard mask pattern 343 may include a plurality of second openings OP2 that are formed through a photolithography process. Each of the plurality of second openings OP2 may overlap the cell array region CAR of the second stacked structure 320B and the contact region CTR of the second stacked structure 320B may be blocked by the second hard mask pattern 343.

Subsequently, the etch stop layer 341, the plurality of upper first material layers 321B, and the plurality of upper second material layers 323B may be etched through the plurality of second openings OP2 of the second hard mask pattern 343. As a result, the second hole group HG2 may be formed.

The second hole group HG2 may include a plurality of upper channel holes 347A and a plurality of upper auxiliary holes 347C. The plurality of upper channel holes 347A may be disposed to have the same arrangement as the plurality of lower channel holes 327A, shown in FIG. 8. Each of the plurality of upper channel holes 347A may pass through the cell array region CAR of the second stacked structure 320B and may expose the first lower sacrificial pillar 330A corresponding thereto. The plurality of upper auxiliary holes 347C may be disposed to have the same arrangement as the plurality of lower auxiliary holes 327C, shown in FIG. 8. Each of the plurality of upper auxiliary holes 347C may pass through the cell array region CAR of the second stacked structure 320B and may expose the second lower sacrificial pillar 330C corresponding thereto. Although not illustrated in FIGS. 12A and 12B, the second hole group HG2 may include a plurality of upper dummy holes that pass through the second stacked structure 320B in the same arrangement as the plurality of lower dummy holes 327B, shown in FIG. 8. The cross section of the upper dummy hole may be substantially the same as that of the upper channel hole 347A.

A plurality of channel holes CHH, a plurality of auxiliary holes AH, and a plurality of dummy holes may be formed through the above-described processes. Each of the plurality of channel holes CHH may include a corresponding upper channel hole 347A and a corresponding lower channel hole 327A' with the expanded depth that is coupled to the upper channel hole 347A. Each of the plurality of auxiliary holes AH may include a corresponding upper auxiliary hole 347C and a corresponding lower auxiliary hole 327C that is coupled to the upper auxiliary hole 347C. Each of the plurality of dummy holes may include a corresponding upper dummy hole and a corresponding lower dummy hole with an expanded depth that is coupled to the upper dummy hole, similar to the channel hole CHH.

The first stacked structure 320A and the second stacked structure 320B may form the stacked structure 320.

The plurality of channel holes CHH may be disposed to have the same arrangement as the plurality of lower channel holes 327A, shown in FIG. 8, in the XY plane. In addition, the plurality of auxiliary holes AH may be disposed to have substantially the same arrangement as the plurality of lower auxiliary holes 327C, shown in FIG. 8, in the XY plane.

Figure 13A:
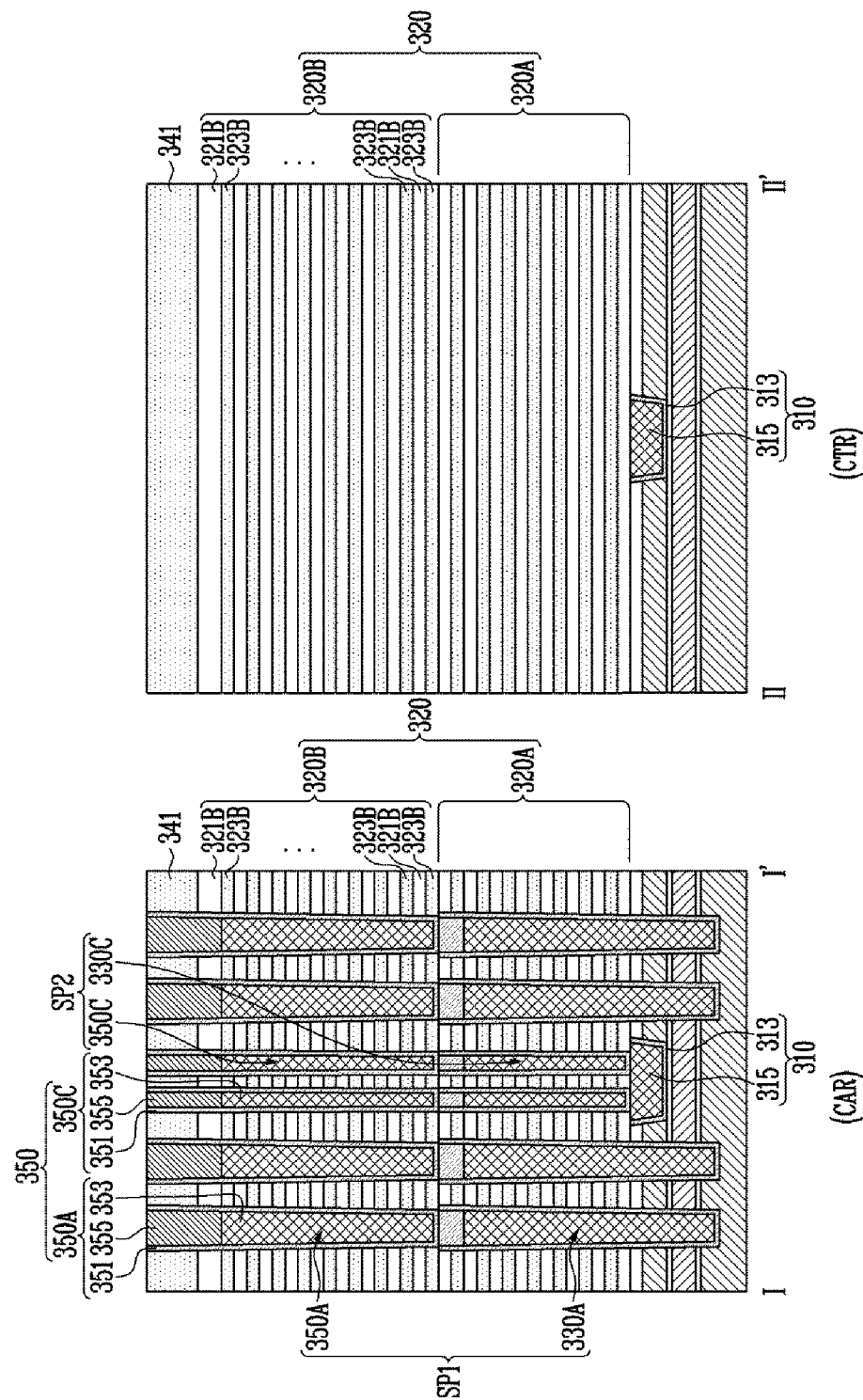
Figure 13B:
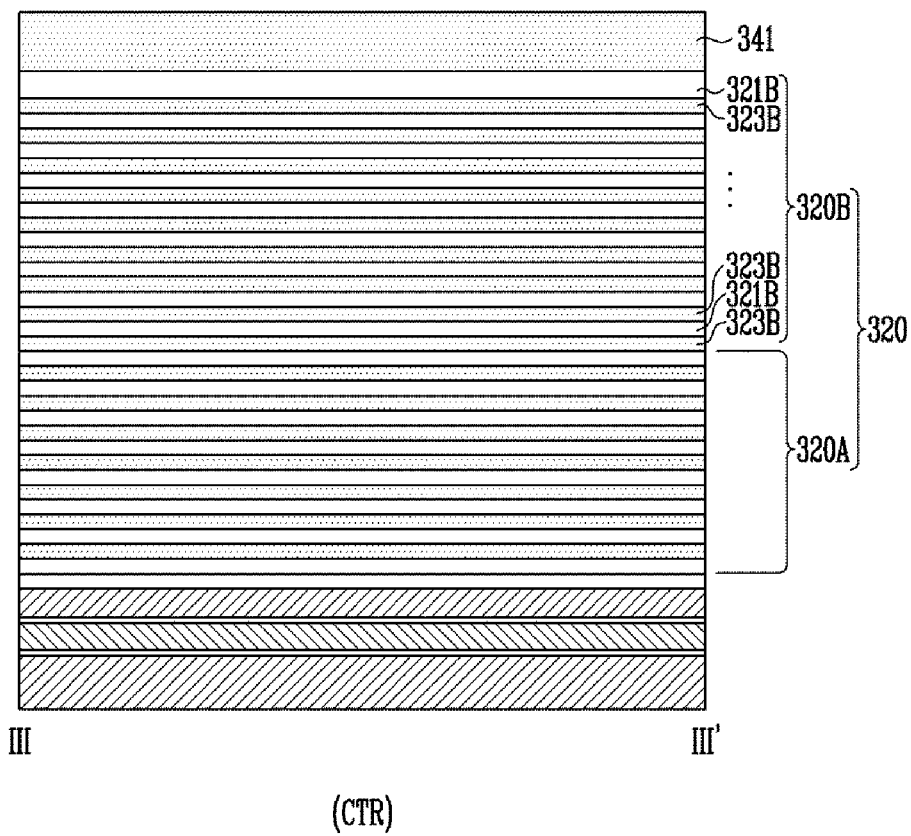

FIGS. 13A and 13B are cross-sectional diagrams illustrating an upper sacrificial group 350.

Referring to FIGS. 13A and 13B, a process of forming a plurality of sacrificial pillars SP1 and SP2 may include forming the upper sacrificial group 350. Forming the upper sacrificial group 350 may include forming a sacrificial material that fills each of the plurality of upper channel holes 347A and the plurality of upper auxiliary holes 347C, shown in FIG. 12A, and planarizing a surface of the sacrificial material to expose the etch stop layer 341. Although not illustrated in FIGS. 13A and 13B, the plurality of upper dummy holes may also be filled with the sacrificial material.

The sacrificial material may include a material with an etch selectivity with respect to the upper first material layers 321B and the upper second material layers 323B. According to an embodiment, the sacrificial material may include a fourth metal nitride layer 351 and a third metal layer 353.

For example, the fourth metal nitride layer 351 may include a titanium nitride layer, similar to the first metal nitride layer 313. The third metal layer 353 may include tungsten, similar to the first metal layer 315. The sacrificial material may further include a capping layer 355. The capping layer 355 may include a material with an etch selectivity with respect to a dry etching process of an oxide. According to an embodiment, the capping layer 355 may include a polysilicon layer.

The fourth metal nitride layer 351 may extend along a surface of each of the plurality of upper channel holes 347A and the plurality of upper auxiliary holes 347C, shown in FIG. 12A. The third metal layer 353 may be formed on the fourth metal nitride layer 351 and may be formed to have a height to open an upper portion of each of the plurality of upper channel holes 347A and the plurality of upper auxiliary holes 347C, shown in FIG. 12A. The capping layer 355 may be disposed in each of the plurality of upper channel holes 347A and the plurality of upper auxiliary holes 347C, shown in FIG. 12A.

The upper sacrificial group 350 may include a plurality of first upper sacrificial pillars 350A that fill the plurality of upper channel holes 347A, shown in FIG. 12A, and a plurality of second upper sacrificial pillars 350C that fill the plurality of upper auxiliary holes 347C, shown in FIG. 12A. Although not illustrated in FIGS. 13A and 13B, the upper sacrificial group 350 may further include an upper dummy pillar that fills the upper dummy hole, and a cross section of the upper dummy pillar may be substantially the same as that of the first upper sacrificial pillar 350A.

A plurality of first sacrificial pillars SP1, a plurality of second sacrificial pillars SP2, and a plurality of dummy pillars may be formed through the above-described processes. Each of the plurality of first sacrificial pillars SP1 may include a corresponding first upper sacrificial pillar 350A and a corresponding first lower sacrificial pillar 330A that is coupled to the first upper sacrificial pillar 350A. Each of the plurality of second sacrificial pillars SP2 may include a corresponding second upper sacrificial pillar 350C and a corresponding second lower sacrificial pillar 330C that is coupled to the second upper sacrificial pillar 350C. Each of the plurality of dummy pillars may include a corresponding lower dummy pillar corresponding thereto and a corresponding upper dummy pillar that is coupled to the lower dummy pillar similarly to the first sacrificial pillar SP1. A cross-sectional structure of the dummy pillar may be the same as that of the first sacrificial pillar SP1.

FIGS. 14A, 14B, 15A, and 15B are diagrams illustrating a process of forming a plurality of cell plugs and a process of forming a stepped stacked structure according to an embodiment.

Figure 14A:
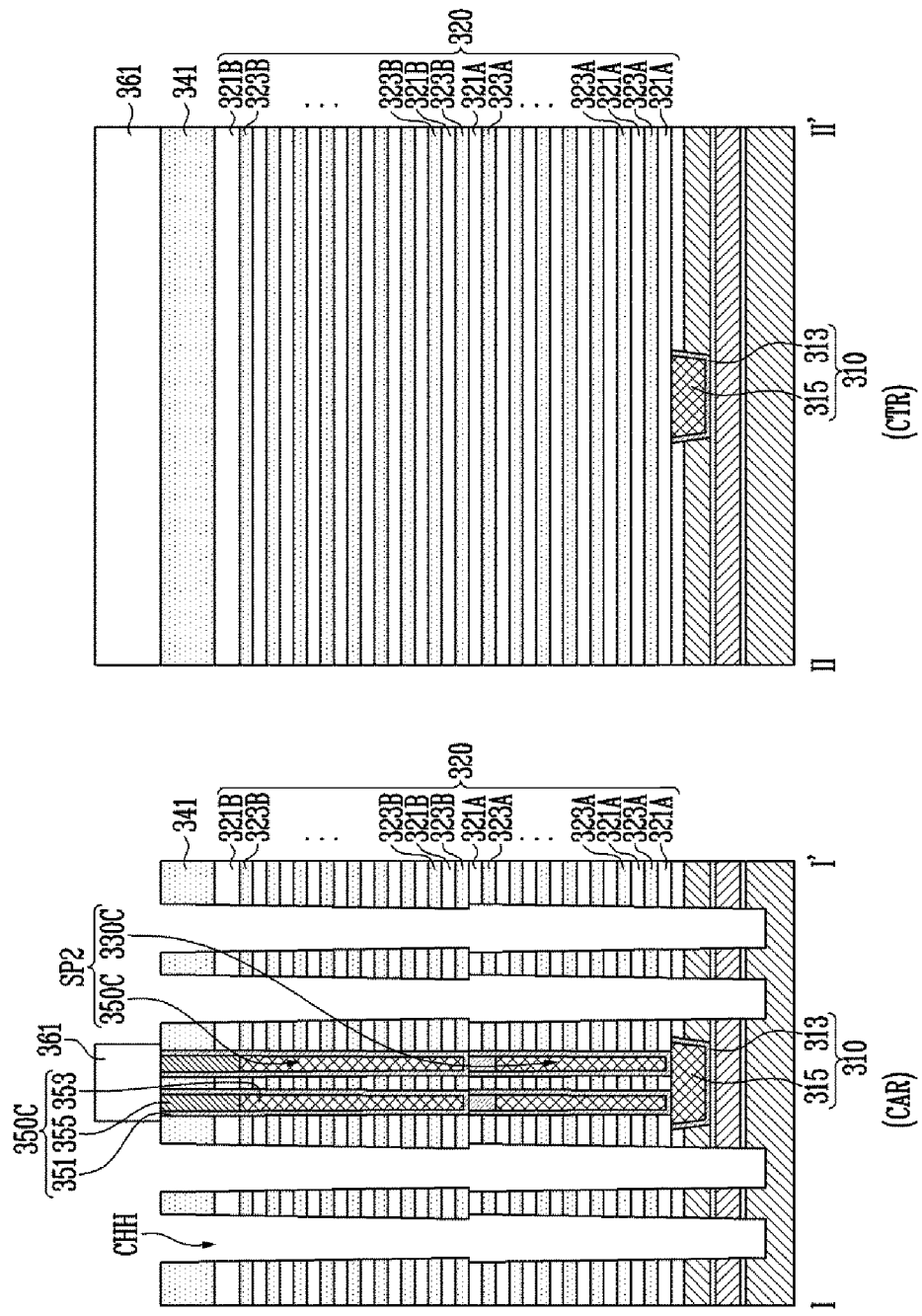
FIGS. 14A, 14B, 15A, and 15B are diagrams illustrating a process of forming a plurality of cell plugs and a process of forming a stepped stacked structure according to an embodiment.
Figure 14B:
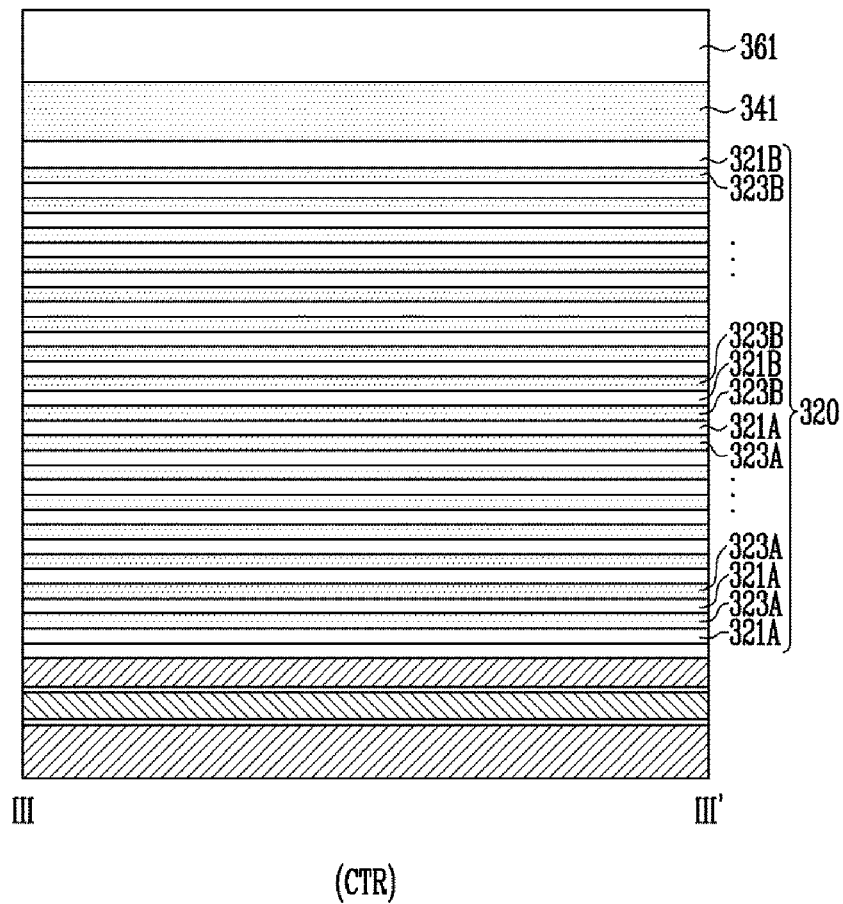

FIGS. 14A and 14B may be cross-sectional diagrams illustrating opening the plurality of channel holes CHH.

Referring to FIGS. 14A and 14B, the process of forming the plurality of cell plugs may include opening the plurality of channel holes CHH. Opening the plurality of channel holes CHH may include forming a photoresist pattern 361 on the etch stop layer 341 and removing the plurality of first sacrificial pillars SP1, shown in FIG. 13A, through an etching process that uses the photoresist pattern 361 as an etching barrier.

The photoresist pattern 361 may overlap the cell array region CAR of the stacked structure 320 to block the plurality of second sacrificial pillars SP2. The photoresist pattern 361 may expose the cell array region CAR on both sides of the etch stop pattern 310. The photoresist pattern 361 may extend to overlap the contact region CTR of the stacked structure 320.

When the plurality of first sacrificial pillars SP1 are removed, the plurality of dummy pillars may be removed, and the plurality of dummy holes may be opened. A cross-sectional structure of the opened dummy hole may be the same as that of the opened channel hole CHH.

Figure 15A:
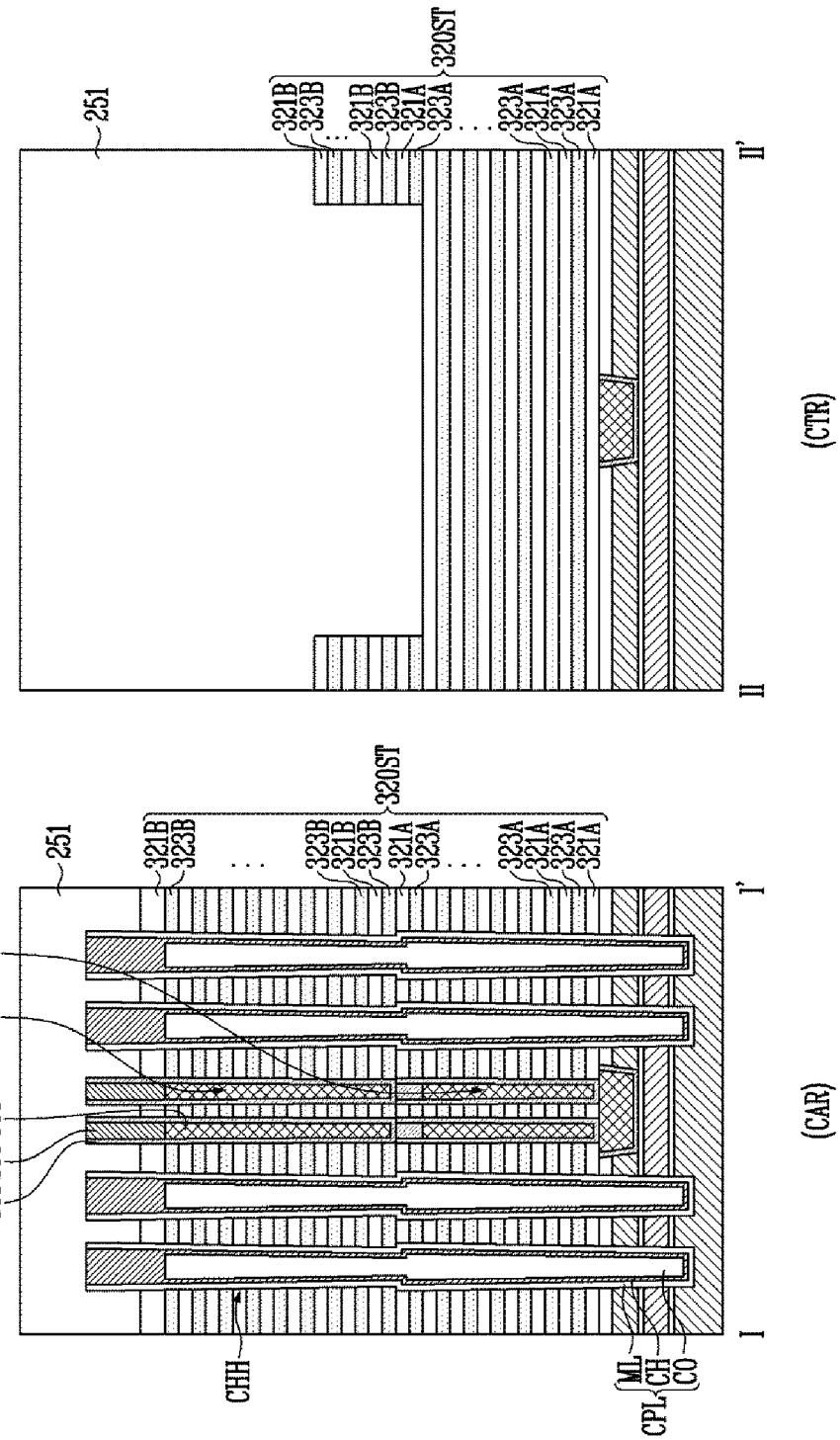
Figure 15B:
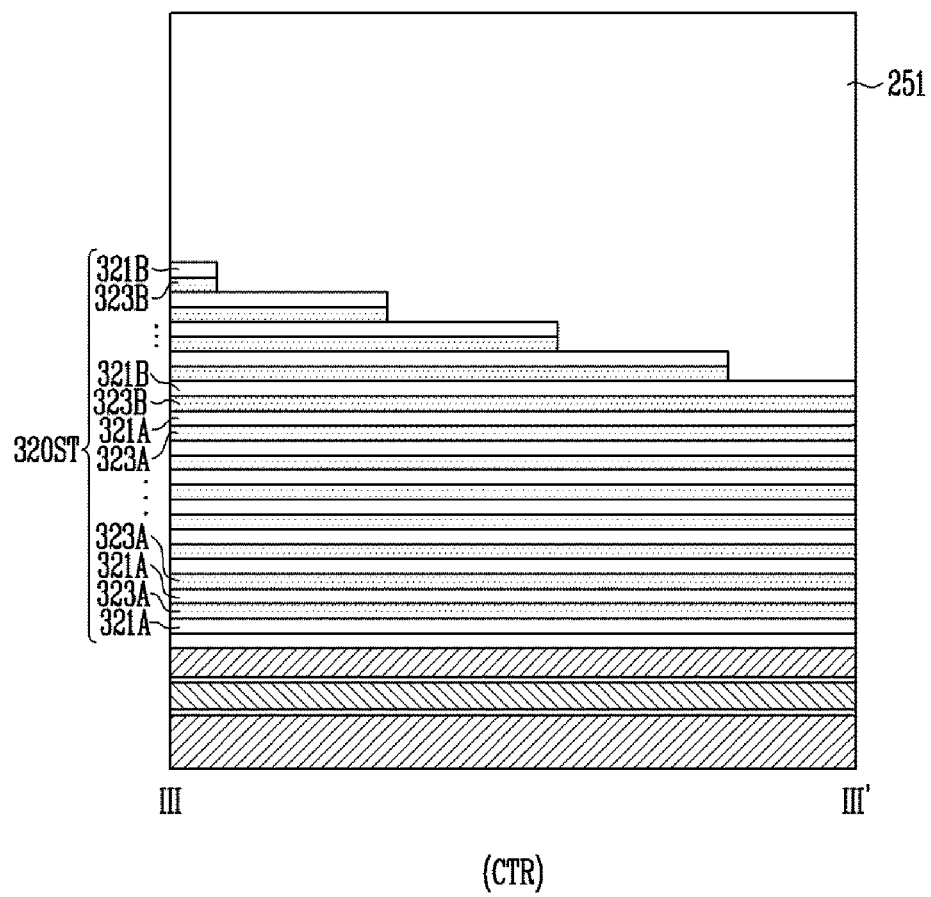

FIGS. 15A and 15B are cross-sectional diagrams illustrating the plurality of cell plugs CPL that are surrounded by a stepped stacked structure 320ST.

Referring to FIGS. 15A and 15B, the plurality of channel holes CHH may be filled with the plurality of cell plugs CPL. Forming the plurality of cell plugs CPL may include forming a memory layer ML along a surface of each channel hole CHH, forming a semiconductor layer along a surface of the memory layer ML, and filling a central region of the channel hole CHH opened by the semiconductor layer with the core insulating layer CO and a doped semiconductor layer. The core insulating layer CO may include an oxide. Before the doped semiconductor layer is formed, a part of the core insulating layer may be removed through a dry etching process such that an upper portion of the channel hole CHH is opened. The plurality of second sacrificial pillars SP2 may be protected by the capping layer 355 from the dry etching process. The semiconductor layer and the doped semiconductor layer in the channel hole CHH may form the channel structure CH.

Although not illustrated in FIGS. 15A and 15B, a dummy plug that fills a dummy hole may be formed by using the above-described process of forming the cell plug CPL.

Subsequently, after the etch stop layer 341, shown in FIG. 14A, is removed, the plurality of lower first material layers 321A, the plurality of lower second material layers 323A, the plurality of upper first material layers 3211B, and the plurality of upper second material layers 323B may be etched in a stepped shape. Accordingly, the stepped stacked structure 320ST may be formed. Each of the plurality of lower first material layers 321A, the plurality of lower second material layers 323A, the plurality of upper first material layers 3211B, and the plurality of upper second material layers 323B of the stepped stacked structure 320ST may surround the second sacrificial pillar SP2, the cell plug CPL, and the dummy plug (not illustrated) in the cell array region CAR. The plurality of lower first material layers 321A, the plurality of lower second material layers 323A, the plurality of upper first material layers 3211B, and the plurality of upper second material layers 323B of the stepped stacked structure 320ST may form a stepped structure in the contact region CTR.

Thereafter, the first upper insulating layer 251 may be formed on the stepped stacked structure 320ST. The surface of the first upper insulating layer 251 may be planarized, and the first upper insulating layer 251 may extend to cover the plurality of cell plugs CPL, the plurality of second sacrificial pillars SP2, and the plurality of dummy plugs (not illustrated).

Figure 16:
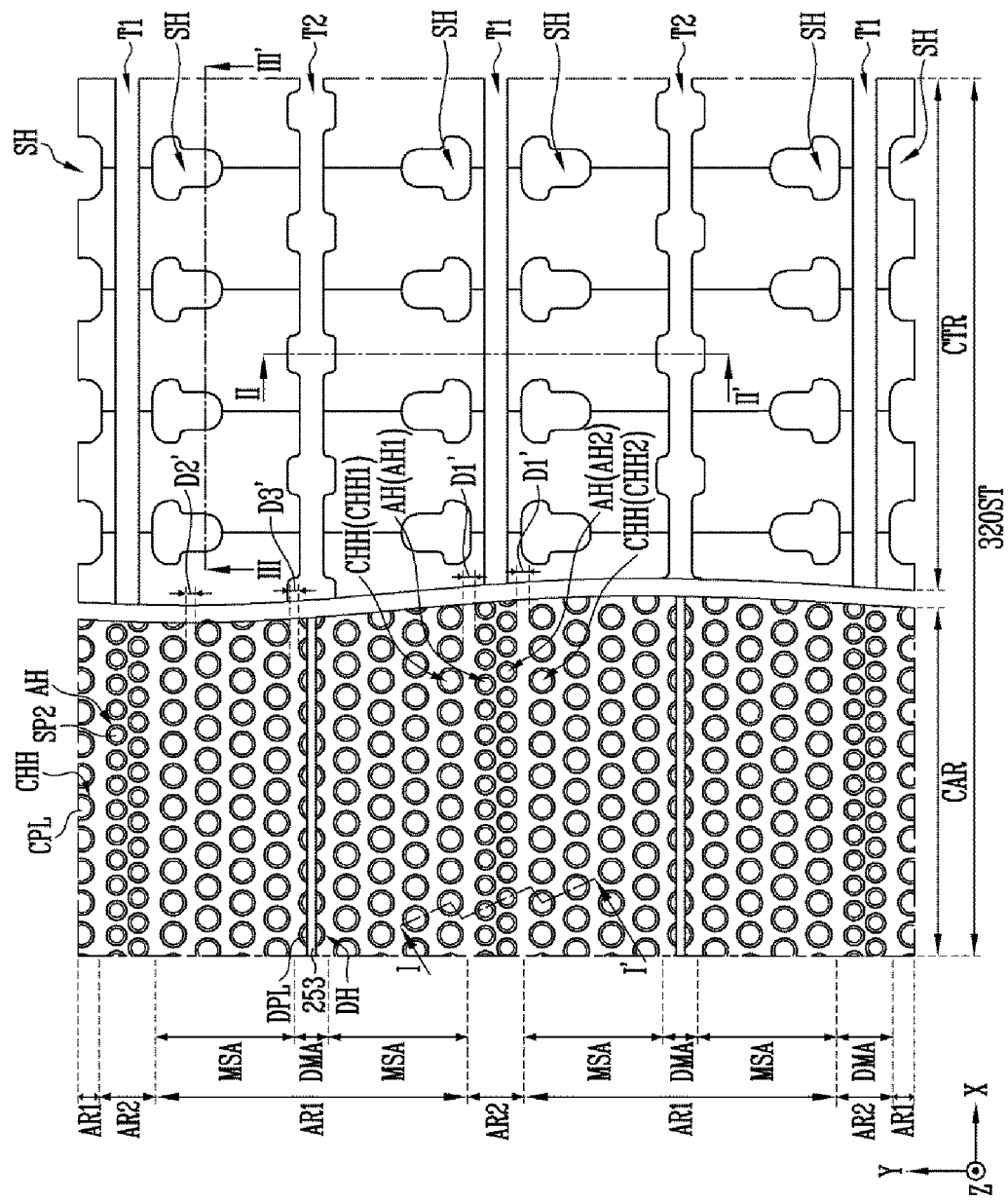
FIGS. 16, 17A, and 17B are diagrams illustrating a process of forming a plurality of trenches and a plurality of supporting holes according to an embodiment.
Figure 17A:
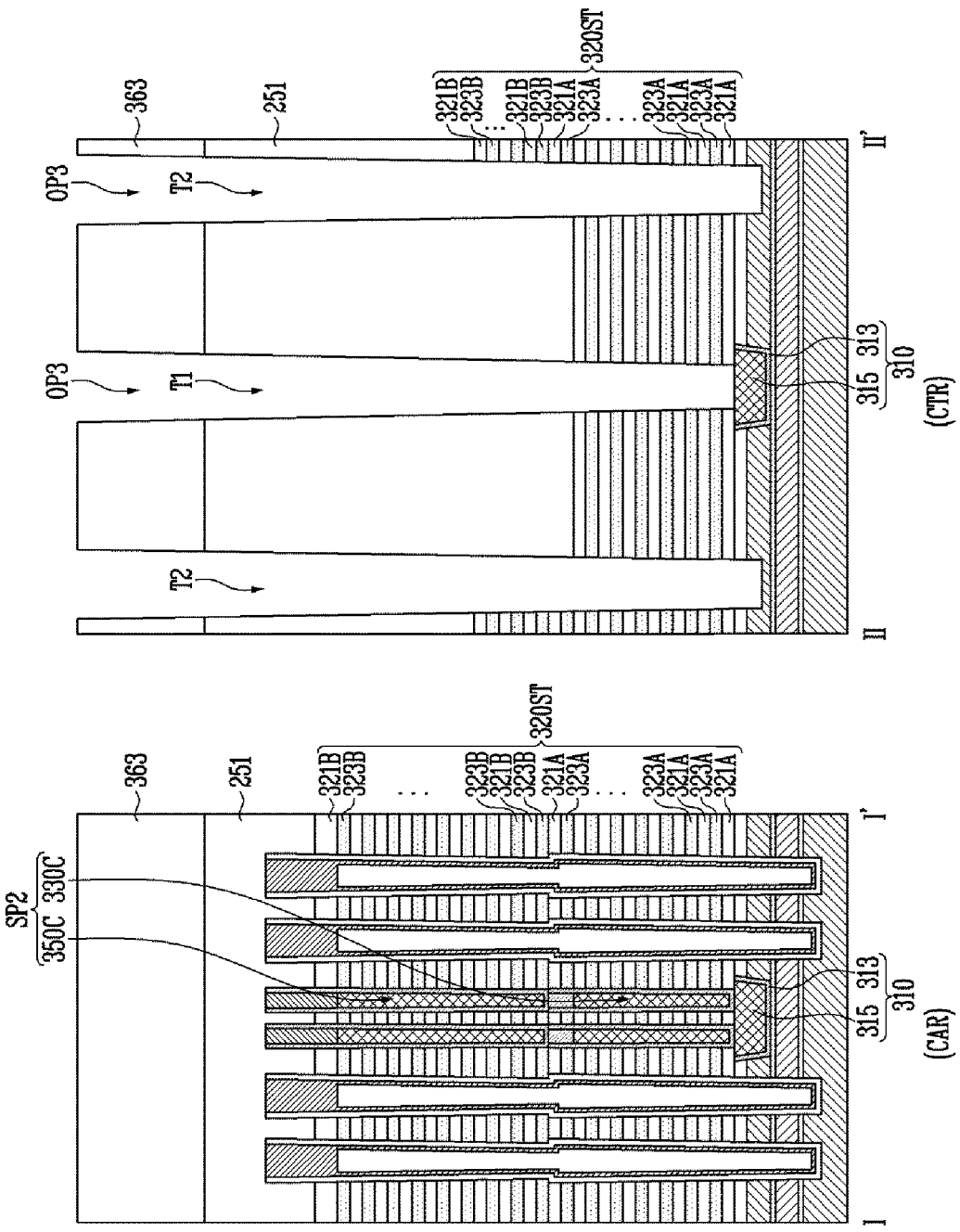
Figure 17B:
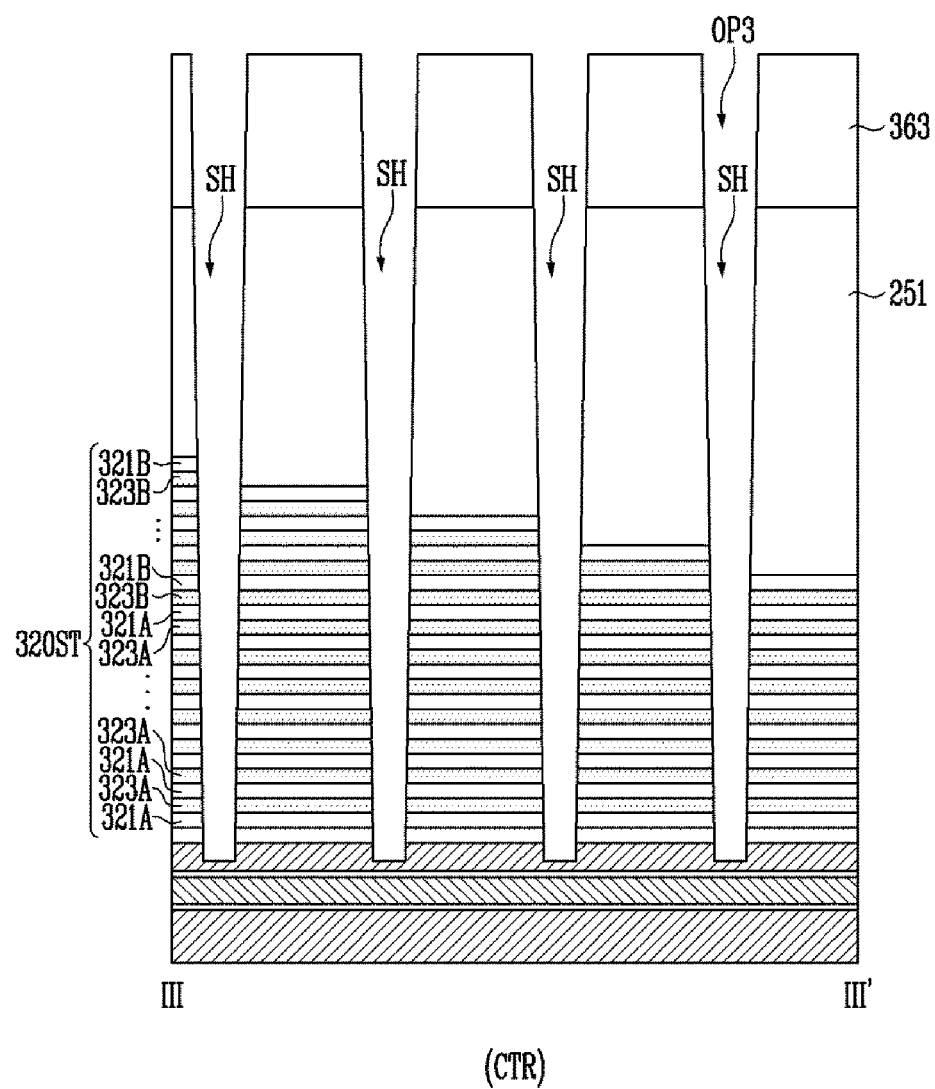

FIGS. 16, 17A, and 17B are diagrams illustrating a process of forming a plurality of trenches and a plurality of supporting holes according to an embodiment. FIG. 16 is a plan view illustrating the plurality of channel holes CHH, a plurality of dummy holes DH, the plurality of auxiliary holes AH, a plurality of trenches T1 and T2, and a plurality of supporting holes SH passing through the stepped stacked structure 320ST. FIG. 17A is a cross-sectional diagram of the stepped stacked structure 320ST that is taken along line I-I' and line II-II', shown in FIG. 16, and FIG. 17B is a cross-sectional diagram of the stepped stacked structure 320ST that is taken along line III-III', shown in FIG. 16.

Referring to FIGS. 16, 17A, and 17B, the plurality of trenches T1 and T2 and the plurality of supporting holes SH may be formed by etching the first upper insulating layer 251 and the contact region CTR of the stepped stacked structure 320ST. When the first upper insulating layer 251 and the contact region CTR of the stepped stacked structure 320ST are etched, the cell array region CAR of the stepped stacked structure 320ST may be blocked by a third hard mask pattern 363 that is disposed on the first upper insulating layer 251.

The third hard mask pattern 363 may include a carbon layer. The third hard mask pattern 363 may include a plurality of third openings OP3. The plurality of third openings OP3 may partially open the contact region CTR of the stepped stacked structure 320ST. According to an embodiment, the plurality of third openings OP3 may open a part of the stepped stacked structure 320ST that overlaps the etch stop pattern 310 in the contact region CTR and parts of the stepped stacked structure 320ST that are at both sides of the etch stop pattern 310 in the contact region CTR. The contact region CTR of the stepped stacked structure 320ST and the first upper insulating layer 251 may be etched through the plurality of third openings OP3. The plurality of trenches T1 and T2 and the plurality of supporting holes SH may be defined by the plurality of third openings OP3.

The plurality of trenches T1 and T2 may include a first trench T1 and a second trench T2. The first trench T1 may pass through a part of the stepped stacked structure 320ST and a part of the first upper insulating layer 251 that overlap the etch stop pattern 310. The first trench T1 may extend straight along the contact region CTR. The second trench T2 may pass through the contact region CTR of the stepped stacked structure 320ST, adjacent to each side of the first trench T1. The second trench T2 may extend along the contact region CTR in one direction.

The plurality of supporting holes SH may pass through the contact region CTR of the stepped stacked structure 320ST between the first trench T1 and the second trench T2.

The stepped stacked structure 320ST may be penetrated by the plurality of supporting holes SH, the first trench T1, and the second trench T2 as well as the channel hole CHH that is filled with the cell plug CPL, the dummy hole DH that is filled with the dummy plug DPL, and the auxiliary hole AH that is filled with the second sacrificial pillar SP2 through the above-described process.

Referring to FIG. 16, the cell array region CAR of the stepped stacked structure 320ST may include the plurality of first regions AR1 and the plurality of second regions AR2, similar to the first stacked structure 320A, shown in FIG. 8. The first region AR1 of the stepped stacked structure 320ST may include the memory cell string regions MSA and the dummy region DMA between the memory cell string regions MSA, similar to the first stacked structure 320A, shown in FIG. 8.

The plurality of channel holes CHH that pass through the stepped stacked structure 320ST may be arranged in a plurality of rows, similar to the plurality of lower channel holes 327A, shown in FIG. 8. The plurality of channel holes CHH that pass through the stepped stacked structure 320ST may include a plurality of first channel holes CHH1 that are arranged along the first row in a first direction (for example, in the X-axis direction) and a plurality of second channel holes CHH2 that are arranged along the second row in the first direction (for example, in the X-axis direction), similar to the plurality of lower channel holes 327A, shown in FIG. 8.

The plurality of auxiliary holes AH that pass through the stepped stacked structure 320ST may include a plurality of first auxiliary holes AH1 that are arranged along the third row that is adjacent to the first row in the first direction (for example, in the X-axis direction) and a plurality of second auxiliary holes AH2 that are arranged along the fourth row that is adjacent to the second row in the first direction (for example, in the X-axis direction), similar to the plurality of lower auxiliary holes 327C, shown in FIG. 8. The above-described third and fourth rows may be disposed between the first row and the second row.

The plurality of dummy holes DH that pass through the stepped stacked structure 320ST may be arranged along the dummy region DMA of the stepped stacked structure 320ST, similar to the plurality of lower dummy holes 327B, shown in FIG. 8.

Distances and widths between the plurality of channel holes CHH, the plurality of dummy holes DH, and the plurality of auxiliary holes AH may be similar to the distances and the widths between the plurality of lower channel holes 327A, the plurality of lower dummy holes 327B, and the plurality of lower auxiliary holes 327C that are described above with reference to FIG. 8. For example, the distance between the first auxiliary hole AH1 and the second auxiliary hole AH2 may be less than the distance between the first channel hole CHH1 and the first auxiliary hole AH1 or a first distance D1' between the second channel hole CHH2 and the second auxiliary hole AH2. The first distance D1' may be greater than each of a second distance D2' between the channel holes CHH that are arranged in adjacent rows and a third distance D3' between the channel hole CHH and the dummy hole DH that neighbor each other. The third distance D3' may be substantially the same as the second distance D2'. The width of each of the first auxiliary hole AH1 and the second auxiliary hole AH2 may be smaller than the width of each of the first channel hole CHH1 and the second channel hole CHH2 in the second direction (for example, in the Y-axis direction).

The distance between the auxiliary holes AH that neighbor each other in the X-axis direction may be less than the distance between the channel holes CHH that neighbor each other in the X-axis direction. The distance between the auxiliary holes AH that neighbor each other in the Y-axis direction may be less than the distance between the channel holes CHH that neighbor each other in the Y-axis direction.

The gate isolation structure 253 that extends into the stepped stacked structure 320ST may be formed after the dummy plug DPL is formed.

The arrangement density of the first trenches T1, the second trenches T2, and the supporting holes SH in the contact region CTR may be lower than the arrangement density of the channel holes CHH, the dummy holes DH, and the auxiliary holes AH in the cell array region CAR. Considering the arrangement density, the process of forming the channel holes CHH, the dummy holes DH, and the auxiliary holes AH in the cell array region CAR may be performed separately from the process of forming the first trenches T1, the second trenches T2, and the supporting holes SH in the contact region CTR, thereby mitigating or reducing the phenomenon in which shapes of patterns are distorted. Accordingly, according to an embodiment, process stability may be improved.

According to an embodiment, the first trenches T1, the second trenches T2, and the supporting holes SH may be formed not only after the first sacrificial pillars SP1 and the second sacrificial pillars SP2, shown in FIG. 13A, are formed, but also after the first sacrificial pillars SP1 are removed. Accordingly, stress that the first sacrificial pillars SP1 and the second sacrificial pillars SP2, which include a different material from the lower first material layers 321A, the lower second material layers 323A, the upper first material layers 321B, and the upper second material layers 323B of the stepped stacked structure 320ST, apply to the stepped stacked structure 320ST may be reduced. For example, when the first trench T1, the second trench T2, and the supporting hole SH are formed through the process of forming the channel hole CHH, the dummy hole DH, and the auxiliary hole AH, each of the first trench T1, the second trench T2, and the supporting hole SH may be filled with the sacrificial pillar as shown in FIG. 13A. According to the above-described embodiment, the proportion of material that applies stress to the stepped stacked structure 320ST is increased by the sacrificial pillar that fills each of the first trench T1, the second trench T2, and the supporting hole SH, and therefore, process failure, such as warpage of the stepped stacked structure 320ST, may occur. According to an embodiment, the proportion of material that applies stress to the stepped stacked structure 320ST may be reduced, thereby improving process stability.

FIGS. 18A, 18B, 19A, 19B, 20A, 20B, and 21 are diagrams illustrating a process of forming a vertical insulating structure and a plurality of supporting pillars and a process of forming a sacrificial structure according to an embodiment.

Figure 18A:
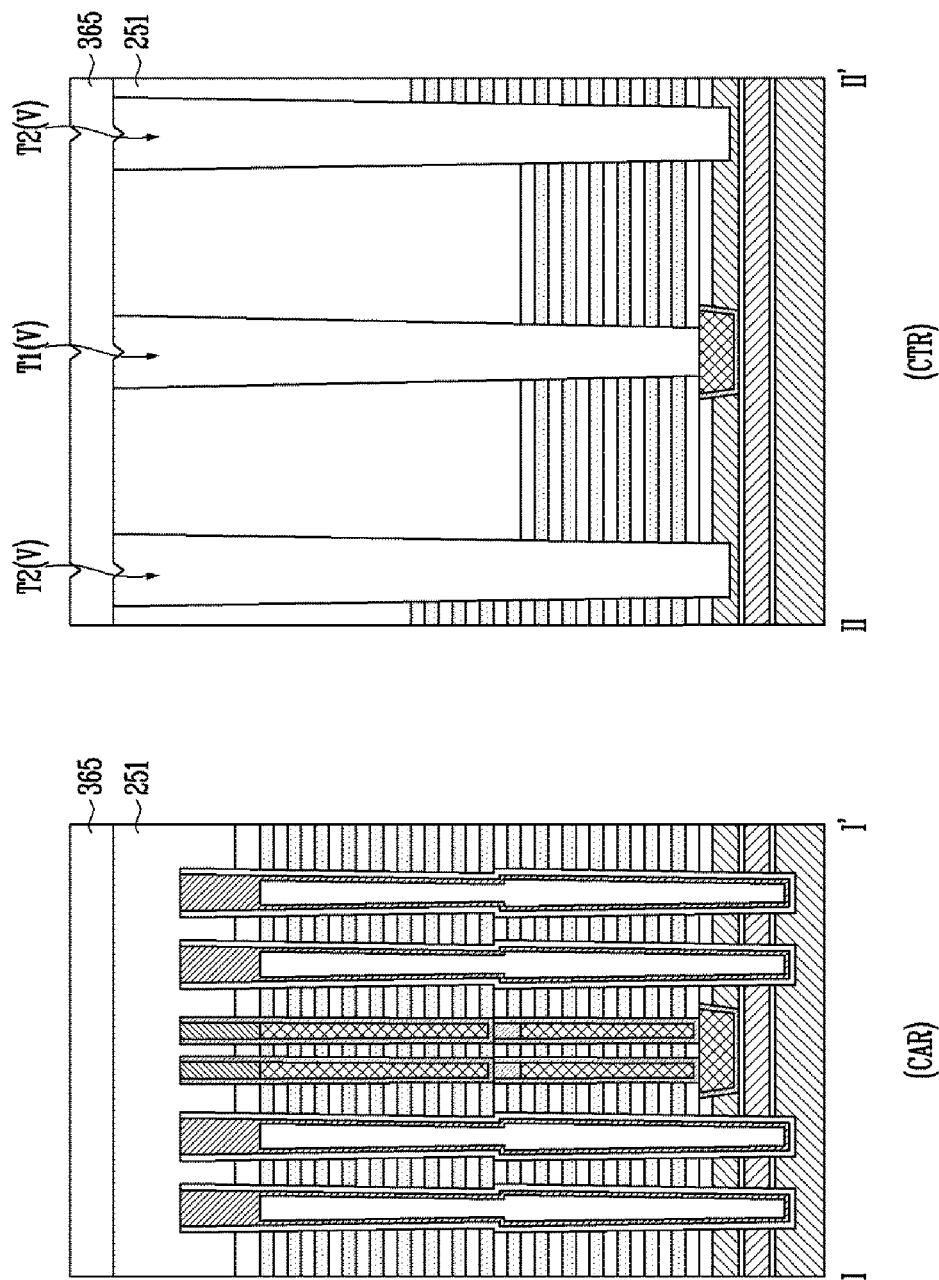
FIGS. 18A, 18B, 19A, 19B, 20A, 20B, and 21 are diagrams illustrating a process of forming a vertical insulating structure and a plurality of supporting pillars and a process of forming a sacrificial structure according to an embodiment.
Figure 18B:
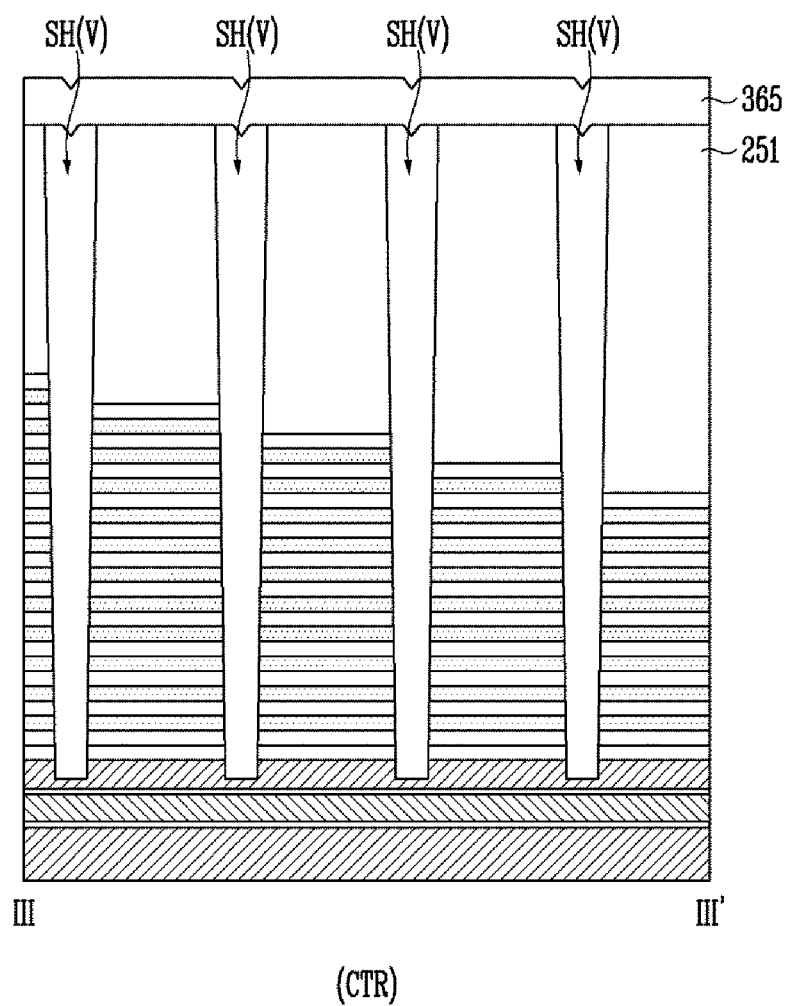

FIGS. 18A and 18B are cross-sectional diagrams illustrating a horizontal layer 365.

Referring to FIGS. 18A and 18B, the process of forming the vertical insulating structure and the plurality of supporting pillars may include forming the horizontal layer 365. The horizontal layer 365 may be formed on the first upper insulating layer 251 after the first upper insulating layer 251 is exposed by removing the third hard mask pattern 363, shown in FIGS. 17A and 17B. The horizontal layer 365 may be deposited through a deposition method with poor step coverage. Accordingly, a void V may be formed in each of the first trench T1, the second trench T2, and the supporting hole SH. The horizontal layer 365 may include an oxide layer.

Figure 19A:
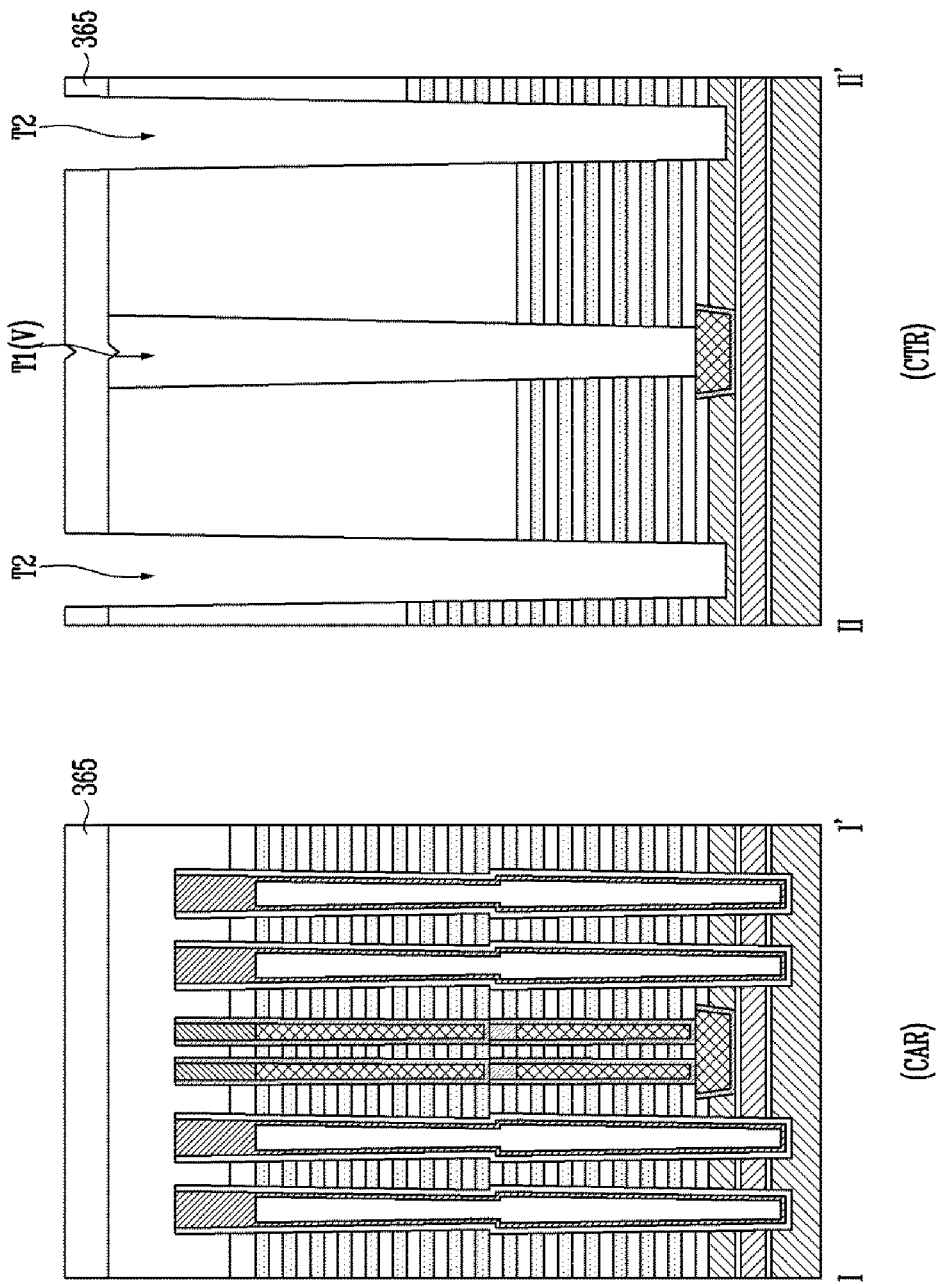
Figure 19B:
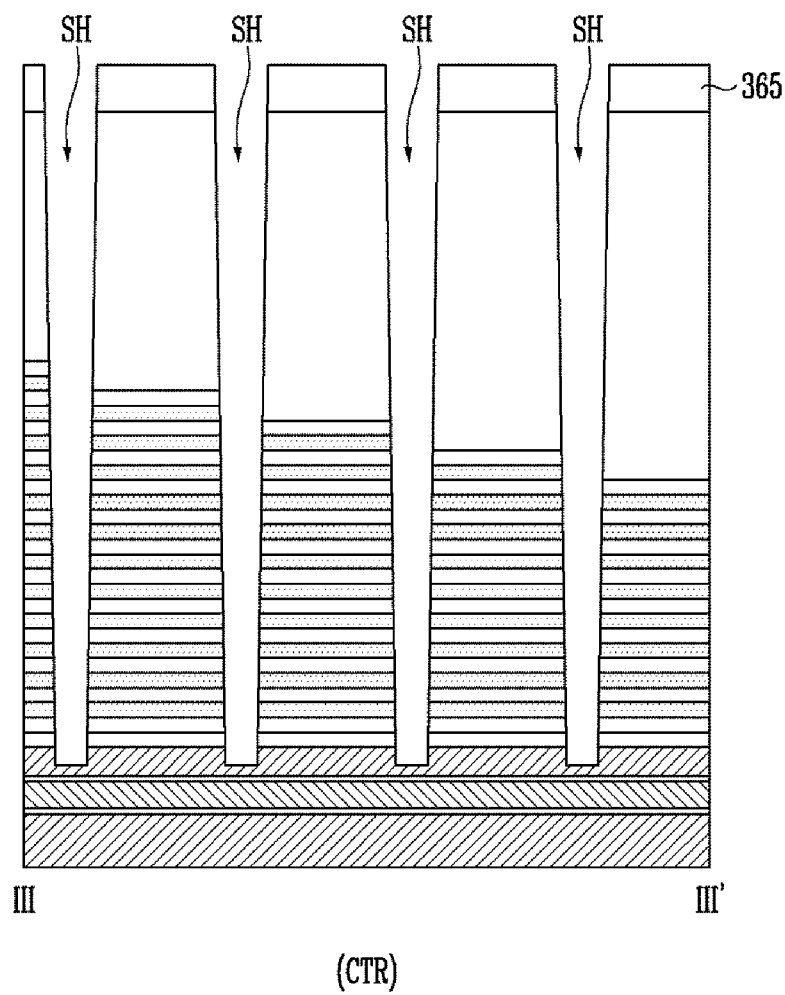

Referring to FIGS. 19A and 19B, the process of forming the vertical insulating structure and the plurality of supporting pillars may include exposing the second trench T2 and the supporting hole SH by partially removing the horizontal layer 365 through a photolithography process.

Figure 20A:
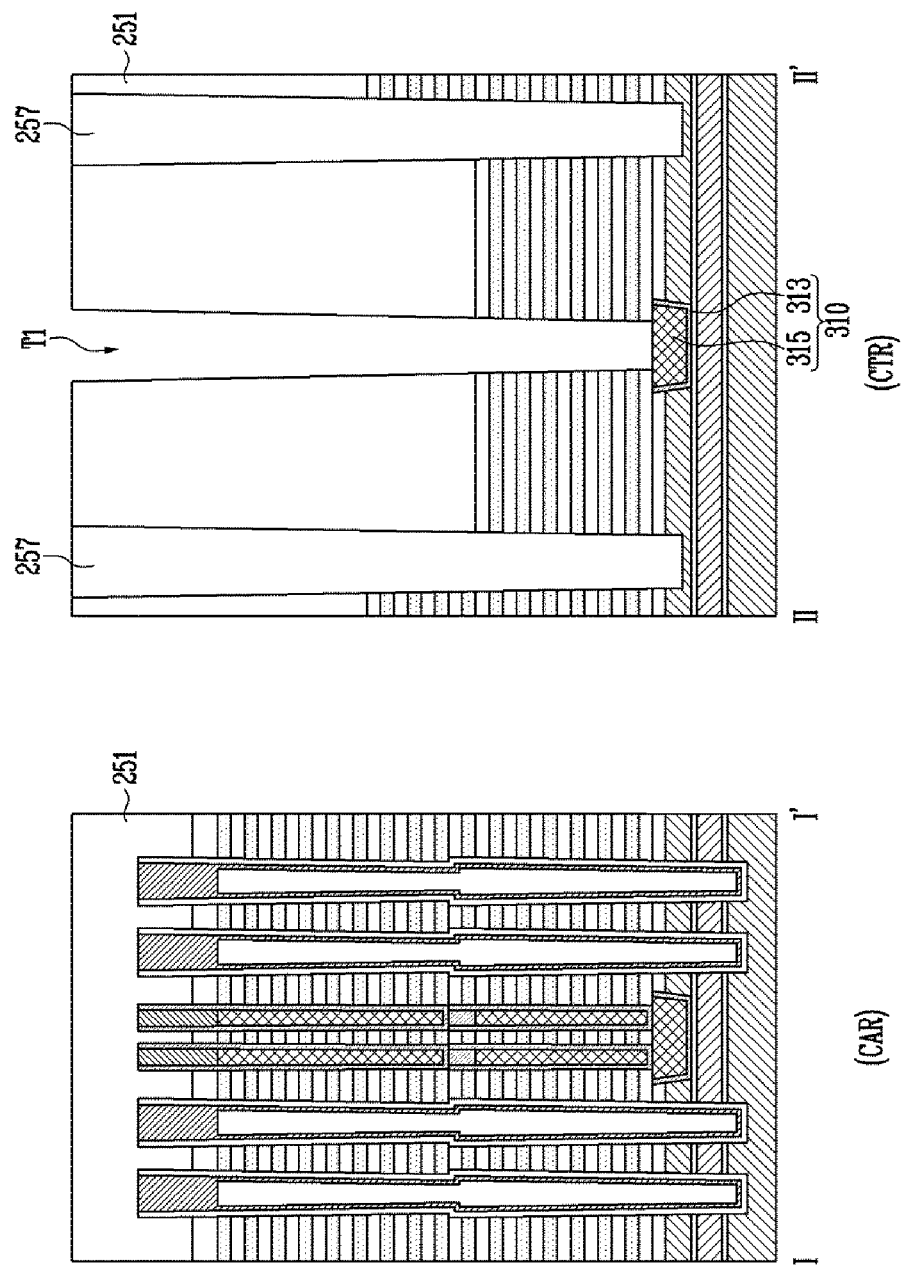
Figure 20B:
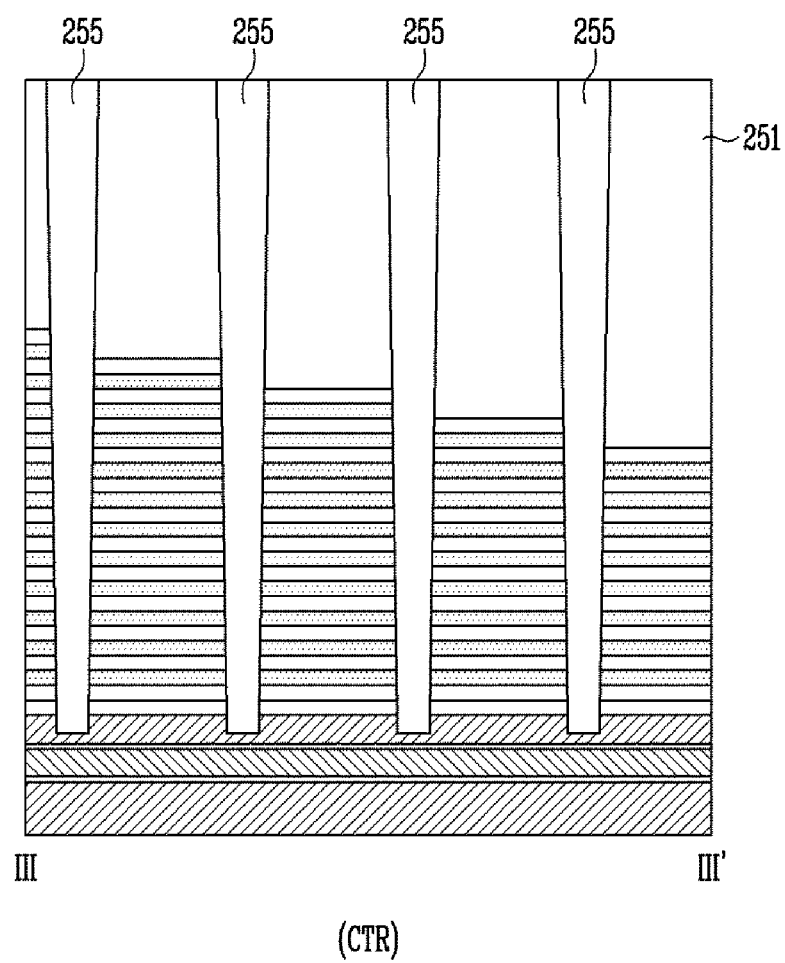

Referring to FIGS. 20A and 20B, the process of forming the vertical insulating structure and the plurality of supporting pillars may include filling the second trench T2 and the supporting hole SH that are opened through the process that is shown in FIGS. 19A and 19B with an insulating material. Accordingly, the vertical insulating structure 257 that fills the second trench T2, shown in FIG. 19A, and the plurality of supporting pillars 255 that fill the plurality of supporting holes SH, shown in FIG. 19B, may be formed.

Subsequently, the horizontal layer 365, shown in FIGS. 19A and 19B, may be removed through an etching process, such as an etch-back process, to open the first trench T1. The etch stop pattern 310 may be exposed through the opened first trench T1.

Figure 21:
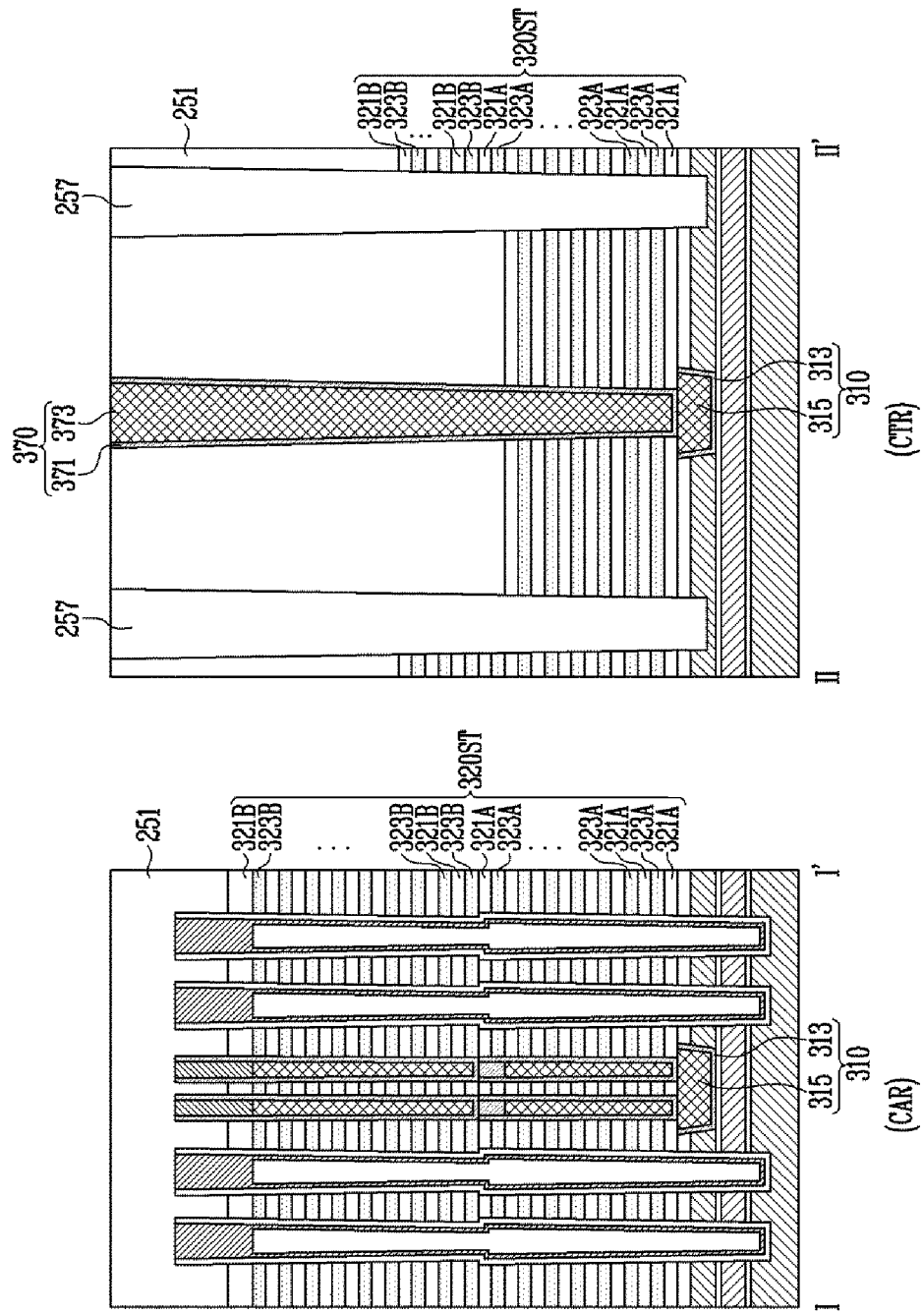

FIG. 21 is a cross-sectional diagram illustrating a sacrificial structure 370.

Referring to FIG. 21, the first trench T1, shown in FIG. 20A, may be filled with the sacrificial structure 370. The sacrificial structure 370 may include a material with an etch selectivity with respect to the supporting pillar 255, shown in FIG. 20B, the stepped stacked structure 320ST, the first upper insulating layer 251, and the vertical insulating structure 257. According to an embodiment, the sacrificial structure 370 may include a fifth metal nitride layer 371 that extends along a sidewall and a bottom surface of the first trench T1, shown in FIG. 20A, and a fourth metal layer 373 on the fifth metal nitride layer 371. For example, the fifth metal nitride layer 371 may include a titanium nitride layer, similar to the first metal nitride layer 313, and the fourth metal layer 373 may include tungsten, similar to the first metal layer 315.

FIGS. 22A, 22B, 23, 24, and 25 are diagrams illustrating a process of forming a slit according to an embodiment.

Figure 22A:
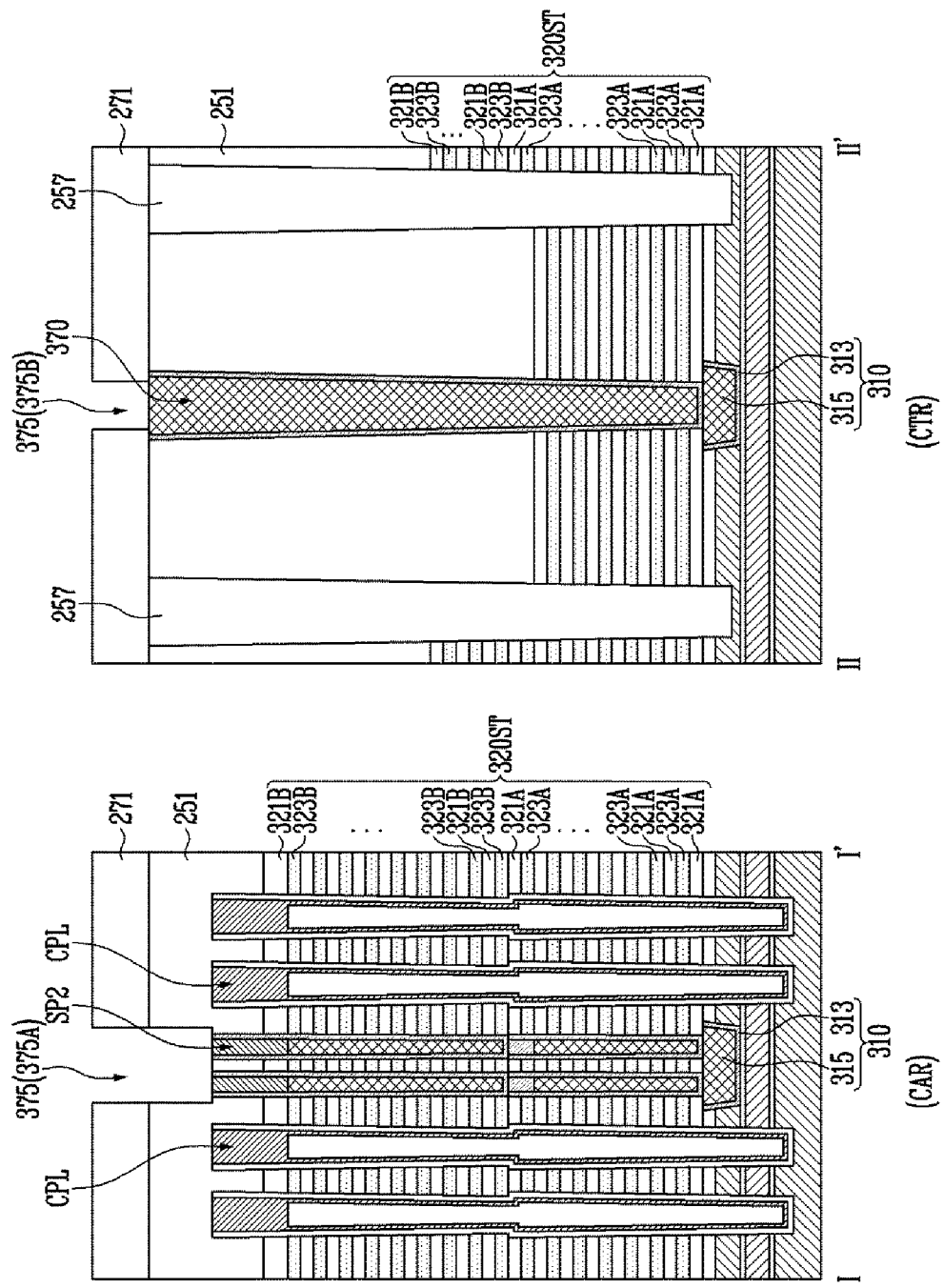
FIGS. 22A, 22B, 23, 24, and 25 are diagrams illustrating a process of forming a slit according to an embodiment.
Figure 22B:
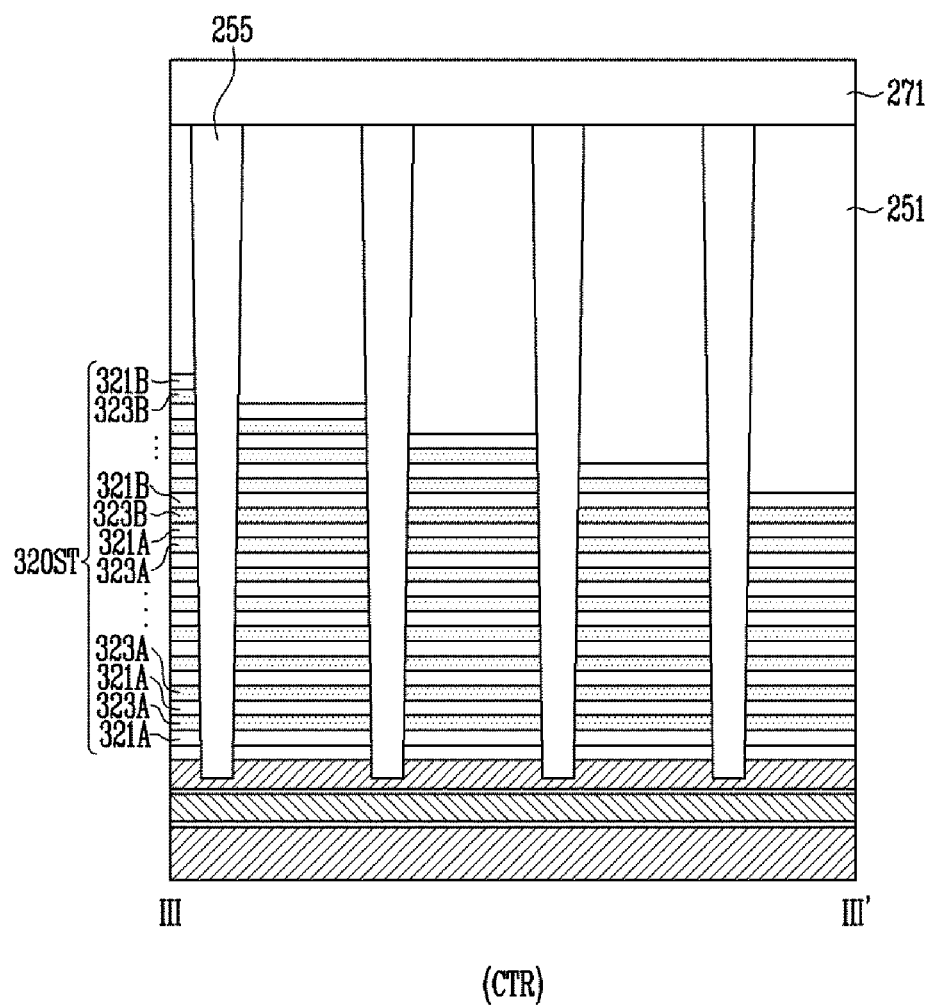

Referring to FIGS. 22A and 22B, the second upper insulating layer 271 may be formed on the first upper insulating layer 251. The second upper insulating layer 271 may extend to cover the vertical insulating structures 257, the sacrificial structure 370, and the supporting pillars 255.

Subsequently, a third trench 375 that passes through the second upper insulating layer 271 may be formed. The third trench 375 may pass through a part of the second upper insulating layer 271 that overlaps the etch stop pattern 310. The third trench 375 may extend along a direction in which the etch stop pattern 310 extends and may overlap the cell array region CAR and the contact region CTR of the stepped stacked structure 320ST.

The third trench 375 may include a first portion 375A that overlaps the cell array region CAR of the stepped stacked structure 320ST and a second portion 375B that overlaps the contact region CTR of the stepped stacked structure 320ST. The first portion 375A may extend into the first upper insulating layer 251 to expose the plurality of second sacrificial pillars SP2. The second portion 375B may expose the sacrificial structure 370. The width of the first portion 375A may be controlled such that an edge of the first portion 375A is disposed between the cell plug CPL and the second sacrificial pillar SP2 that neighbor each other. The second portion 375B may be formed to have a width that is smaller than a width of the sacrificial structure 370 to mitigate the stepped stacked structure 320ST from being excessively etched.

Figure 23:
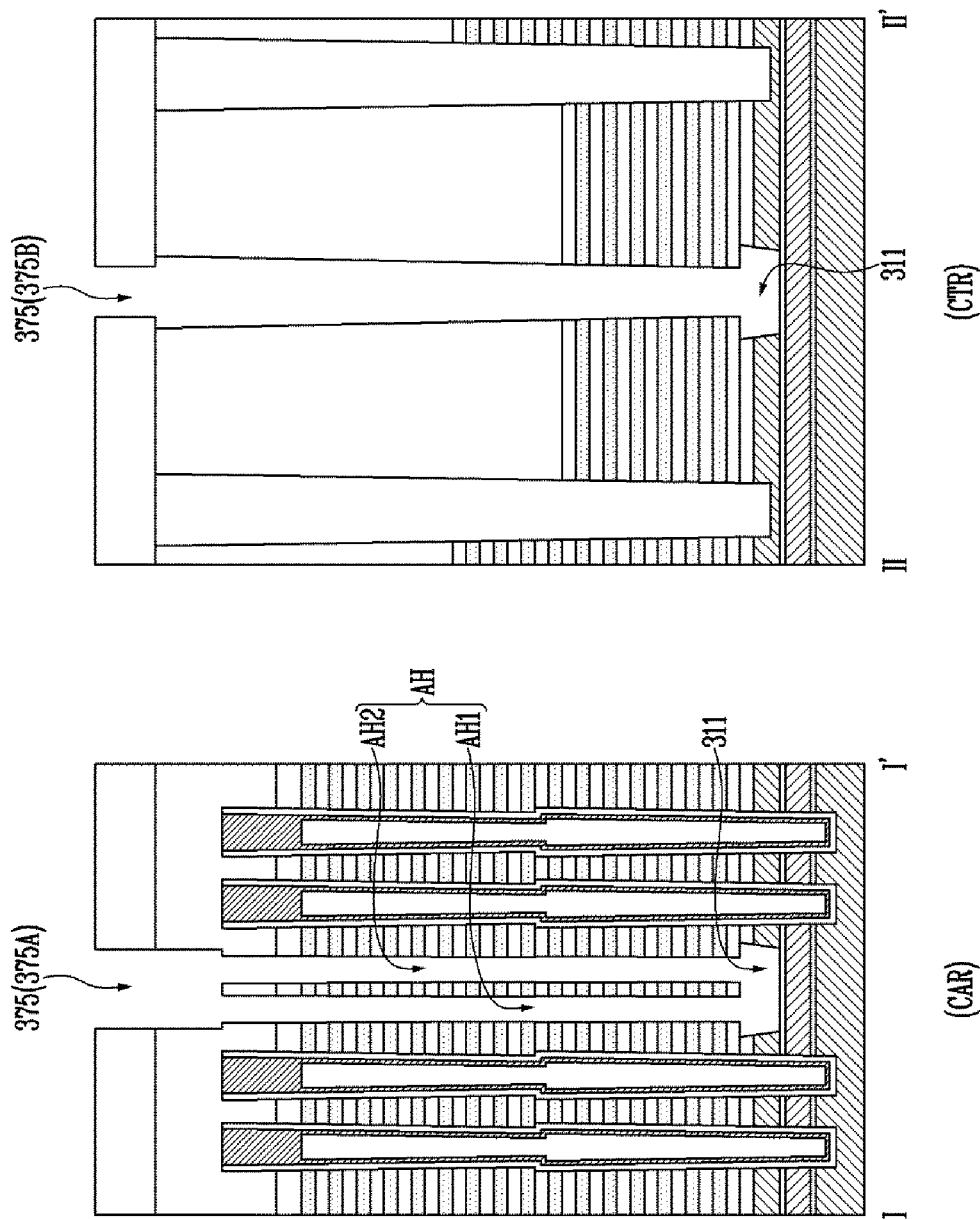

Referring to FIG. 23, the plurality of second sacrificial pillars SP2, the sacrificial structure 370, and the etch stop pattern 310, shown in FIGS. 22A and 22B, may be removed through the third trench 375 through a selective etching process. Accordingly, the first and second auxiliary holes AH1 and AH2 of the plurality of auxiliary holes AH, the groove 311, and the first trench T1 may be opened. The first and second auxiliary holes AH1 and AH2 may be coupled to the first trench T1 through the groove 311.

Figure 24:
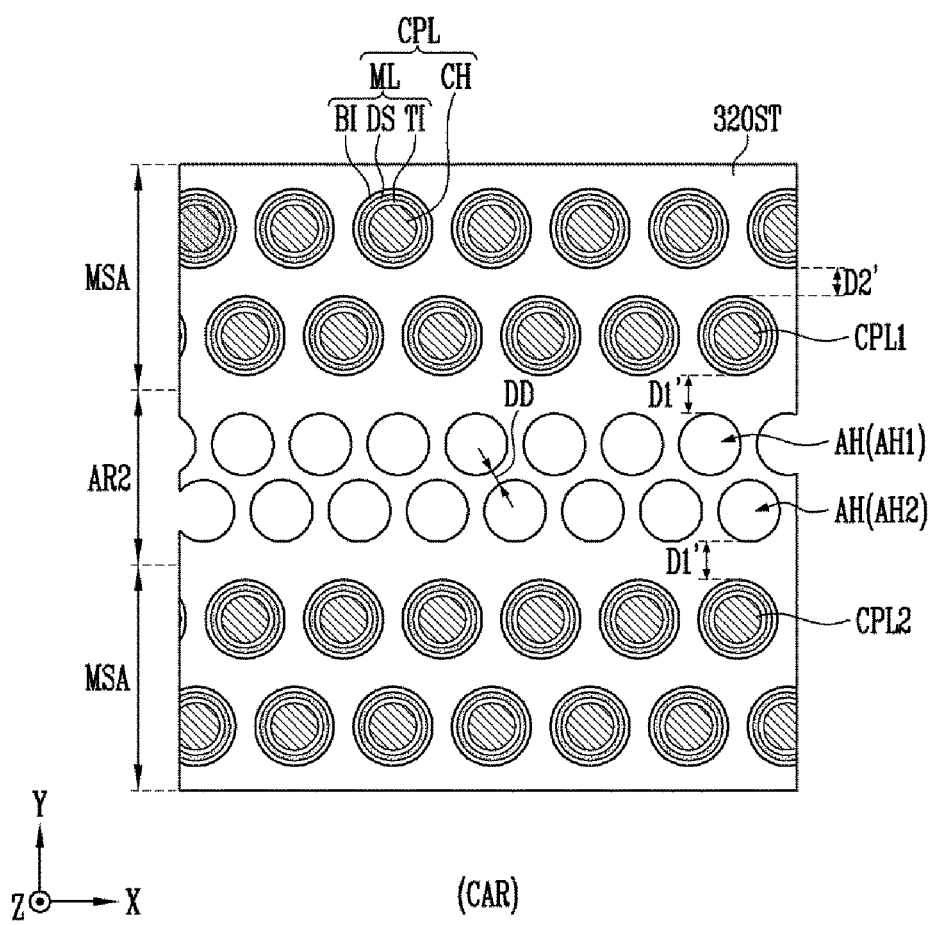

FIG. 24 is an enlarged plan view of a part of the cell array region CAR of the stepped stacked structure 320ST, shown in FIG. 23.

Referring to FIG. 24, the cell array region CAR of the stepped stacked structure 320ST may include the second region AR2 that is penetrated by the plurality of auxiliary holes AH and the memory cell string regions MSA that are penetrated by the plurality of cell plugs CPL that are adjacent to both sides of the second region AR2.

The memory layer ML of each of the plurality of cell plugs CPL may include a tunnel insulating layer TI that surrounds the channel structure CH, a data storage layer DS that surrounds the tunnel insulating layer TI, and a blocking insulating layer BI that surrounds the data storage layer DS. The tunnel insulating layer TI may include an insulating material enabling charge tunneling. According to an embodiment, the tunnel insulating layer TI may include a silicon oxide layer. The data storage layer DS may include an insulating material that enables charge trapping. According to an embodiment, the data storage layer DS may include a nitride layer. The blocking insulating layer BI may include an insulating material capable of blocking movement of charges. According to an embodiment, the blocking insulating layer BI may include at least one of a silicon oxide layer and a metal oxide layer with higher permittivity than the silicon oxide layer.

The plurality of cell plugs CPL may include first cell plugs CPL1 that fill the first channel holes CHH1 in the first row, shown in FIG. 16, and second cell plugs CPL2 that fill the second channel holes CHH2 in the second row, shown in FIG. 16. According to the above-described arrangement with reference to FIG. 16, the first cell plug CPL1 and the first auxiliary hole AH1 may be spaced apart from each other by the first distance D1', and the second cell plug CPL2 and the second auxiliary hole AH2 may be spaced apart from each other by the first distance D1'. In addition, the cell plugs CPL that neighbor each other in the Y-axis direction may be spaced apart from each other by the second distance D2'. The first distance D1' may be defined to be greater than the second distance D2'. In addition, a distance DD between the first auxiliary hole AH1 and the second auxiliary hole AH2 may be smaller than each of the first distance D1' and the second distance D2'.

Figure 25:
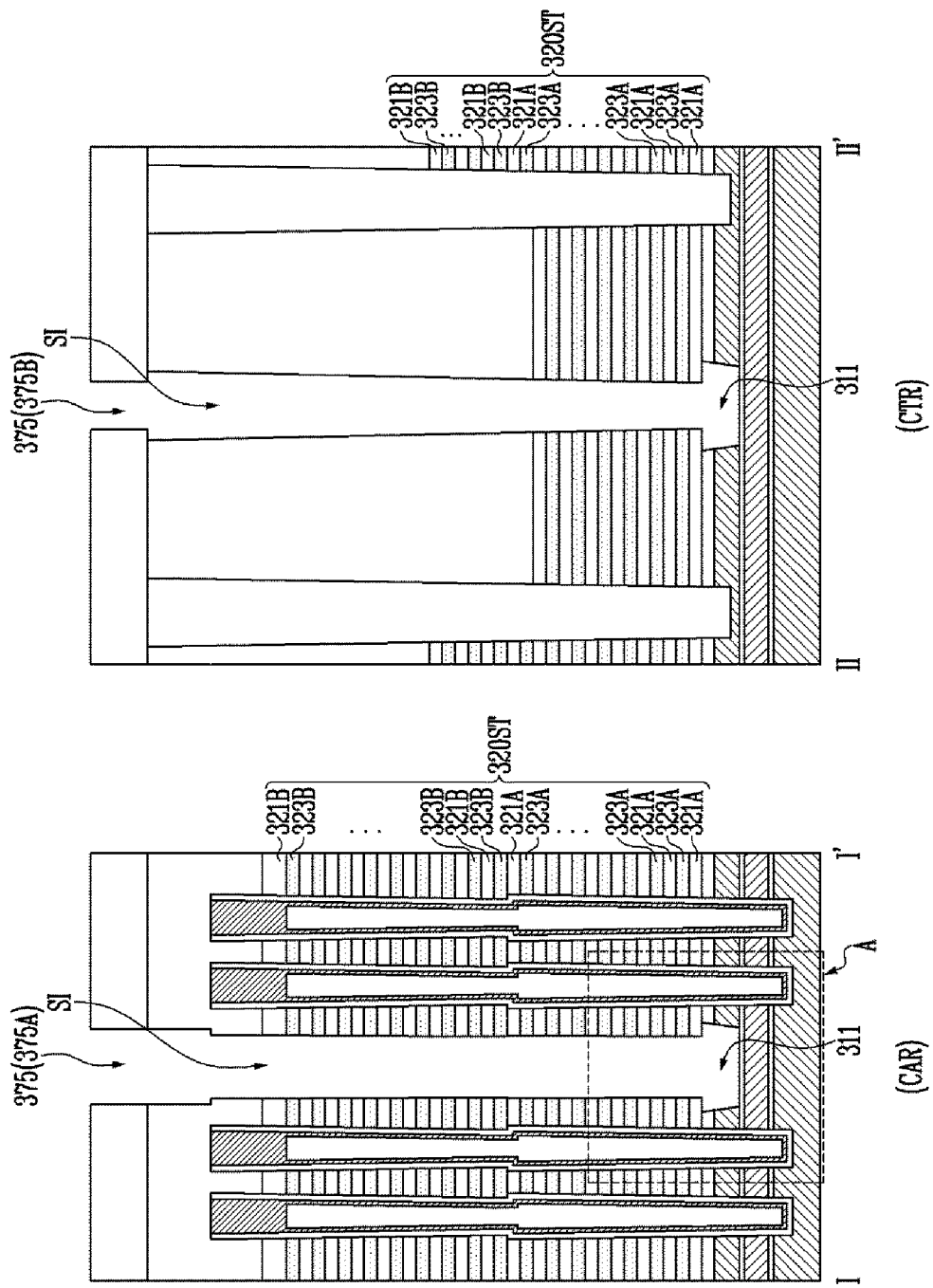

FIG. 25 is a cross-sectional diagram illustrating a process of coupling the auxiliary holes AH shown in FIG. 24 and the first trench T1.

Referring to FIG. 25, a part of each of the plurality of lower first material layers 321A, the plurality of lower second material layers 323A, the plurality of upper first material layers 321B, and the plurality of upper second material layers 323B of the stepped stacked structure 320ST may be removed through the auxiliary holes AH, shown in FIG. 24, and the first trench T1 such that the auxiliary holes AH, shown in FIG. 24, and the first trench T1 are coupled to each other. As a result, a slit SI may be formed.

Figure 26A:
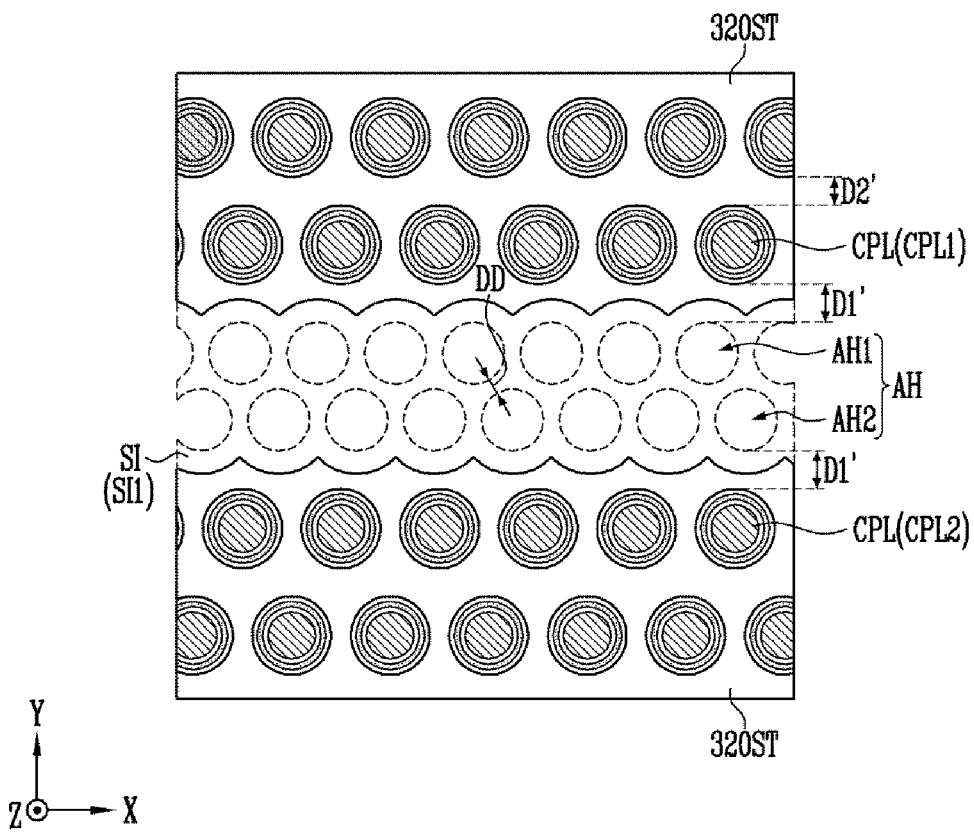
FIGS. 26A and 26B are enlarged plan views of some regions of a stepped stacked structure penetrated by a slit, shown in FIG. 25.
Figure 26B:
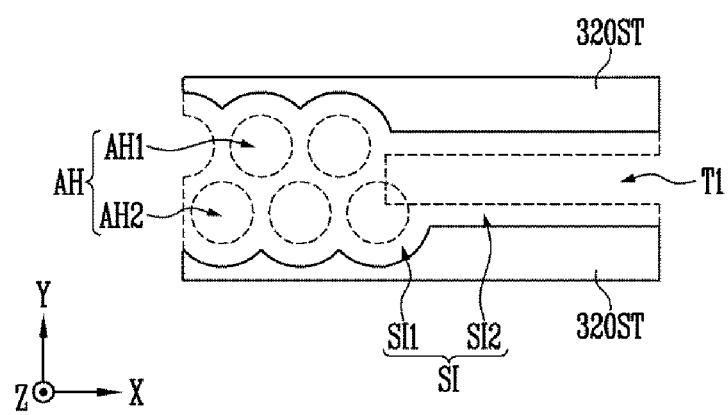

FIGS. 26A and 26B are enlarged plan views of some regions of the stepped stacked structure 320ST penetrated by the slit SI shown in FIG. 25. FIG. 26A is an enlarged plan view of the cell array region CAR of the stepped stacked structure 320ST and FIG. 26B is an enlarged plan view of a structure in which parts of the first and second auxiliary holes AH1 and AH2 that expand and a part of the first trench T1 that expands are coupled.

Referring to FIGS. 26A and 26B, the first auxiliary hole AH1 and the second auxiliary hole AH2, among the plurality of auxiliary holes AH, neighboring each other, may expand through the etching process, described above with reference to FIG. 25, to be coupled to each other. The first distance D1' between the cell plug CPL and the first auxiliary hole AH1 or between the cell plug CPL and the second auxiliary hole AH2 may be relatively greater than the distance DD between the first auxiliary hole AH1 and the second auxiliary hole AH2. Accordingly, the stepped stacked structure 320ST may remain between the slit SI and the cell plug CPL by controlling the width of the stepped stacked structure 320ST to be etched.

The first trench T1 may expand through the etching process, described above with reference to FIG. 25, to be coupled to the expanded parts of the first auxiliary hole AH1 and the second auxiliary hole AH2.

The slit SI may be divided into a first portion SI1, the first portion SI1 including the first auxiliary hole AH1 and the second auxiliary hole AH2 that expand to be coupled to each other, and a second portion SI2 that includes the first trench T1 that expands.

FIGS. 27A, 27B, 27C, 27D, and 27E are enlarged cross-sectional diagrams illustrating a process of forming a source structure according to an embodiment. FIGS. 27A, 27B, 27C, 27D, and 27E are enlarged diagrams of region A, shown in FIG. 25.

Figure 27A:
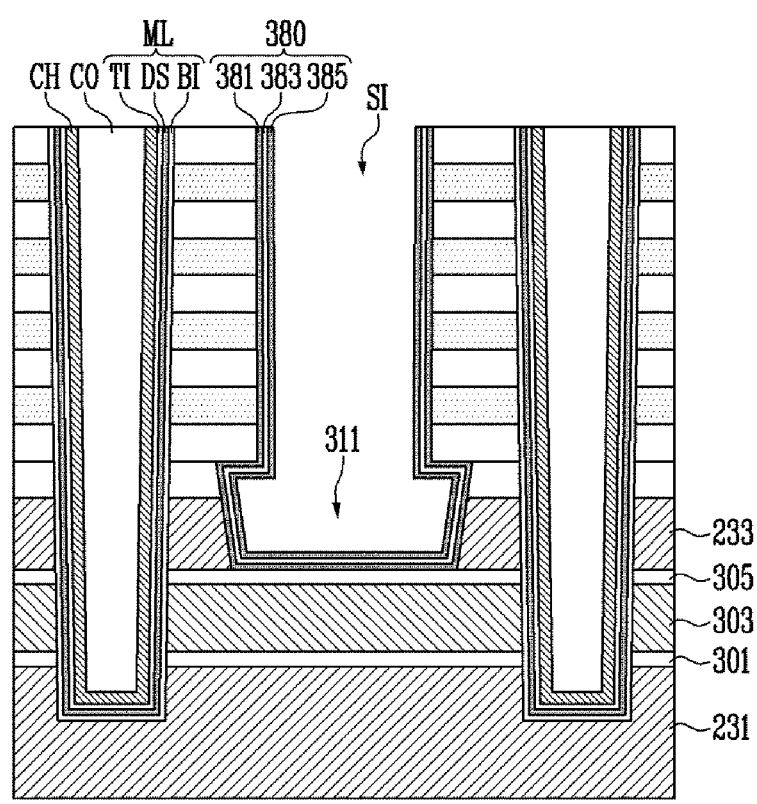
FIGS. 27A, 27B, 27C, 27D, and 27E are enlarged cross-sectional diagrams illustrating a process of forming a source structure according to an embodiment.

Referring to FIG. 27A, the process of forming the source structure may include forming a sealing layer 380 along surfaces of the slit SI and the groove 311. The sealing layer 380 may include a first sealing layer 381 that is formed along the surfaces of the slit SI and the groove 311, a second sealing layer 383 that is formed along a surface of the first sealing layer 381, and a third sealing layer 385 that is formed along a surface of the second sealing layer 383. The first sealing layer 381, the second sealing layer 383, and the third sealing layer 385 may include a material with an etch selectivity with respect to the sacrificial source layer 303. The third sealing layer 385 may include a material with an etch selectivity with respect to the blocking insulating layer BI, the second sealing layer 383 may include a material with an etch selectivity with respect to the data storage layer DS, and the first sealing layer 381 may include a material with an etch selectivity with respect to the tunnel insulating layer TI. According to an embodiment, the first sealing layer 381 and the third sealing layer 385 may include a nitride layer, and the second sealing layer 383 may include an oxide layer.

Figure 27B:
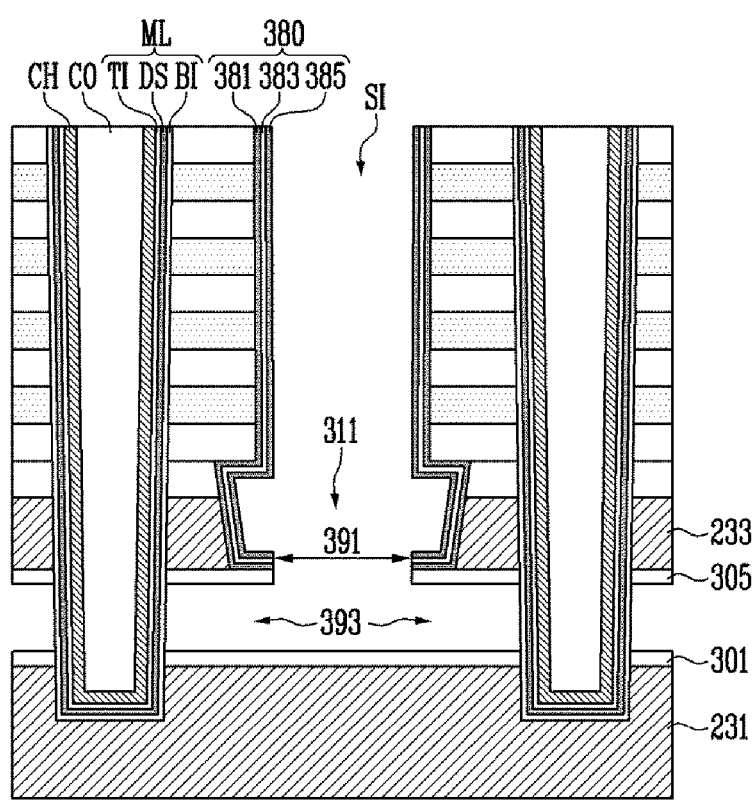

Referring to FIG. 27B, the process of forming the source structure may include forming a fourth trench 391 by etching a part of the sealing layer 380 and a part of the second protective layer 305 through the slit SI and removing the sacrificial source layer 303, shown in FIG. 27A, through the fourth trench 391. Accordingly, a fourth opening 393 that exposes the memory layer ML, the first protective layer 301, and the second protective layer 305 may be defined.

Figure 27C:
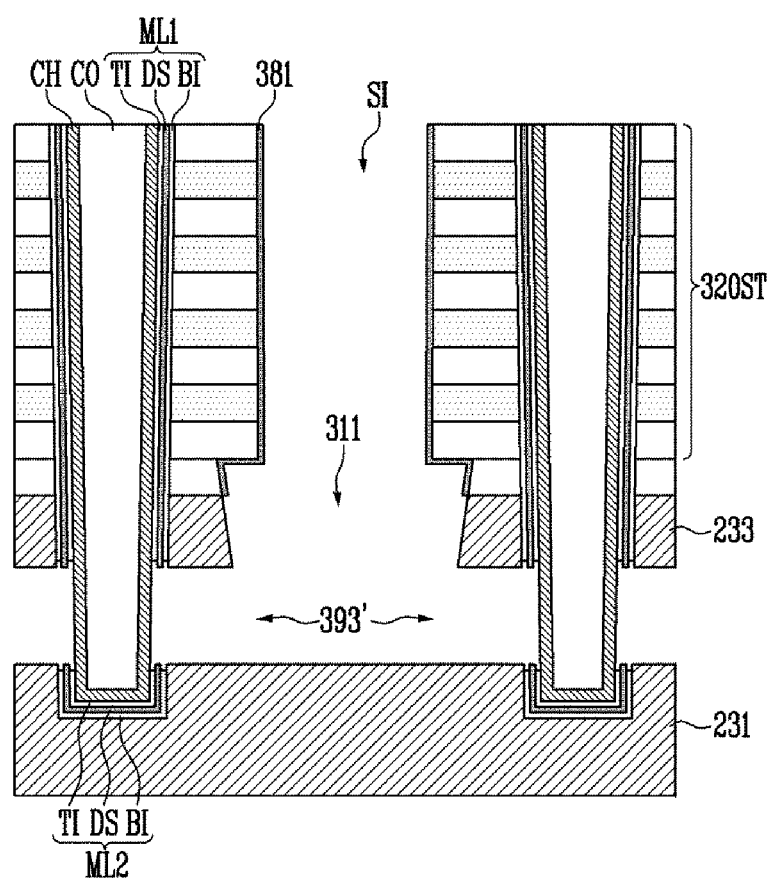

Referring to FIG. 27C, the process of forming the source structure may include expanding the fourth opening 393, shown in FIG. 27B, to expose the sidewall of the channel structure CH, the first semiconductor layer 231, and the second semiconductor layer 233. An expanded fourth opening 393' may be formed by removing a part of the blocking insulating layer BI that is exposed through the fourth opening 393, shown in FIG. 27B, removing a part of the data storage layer DS that is exposed through the removed part of the blocking insulating layer BI, and removing a part of the tunnel insulating layer TI that is exposed through the removed part of the data storage layer DS.

When the part of the blocking insulating layer BI is removed, the first protective layer 301 and the second protective layer 305, shown in FIG. 27B, may be removed. Because the third sealing layer 385, shown in FIG. 27B, has an etch resistance to a material that etches the blocking insulating layer BI, the stepped stacked structure 320ST may be protected by the third sealing layer 385, shown in FIG. 27B.

When the part of the data storage layer DS is removed, the third sealing layer 385, shown in FIG. 27B, may be removed. Because the second sealing layer 383, shown in FIG. 27B, has an etch resistance to the material that etches the data storage layer DS, the stepped stacked structure 320ST may be protected by the second sealing layer 383, shown in FIG. 27B.

When the part of the tunnel insulating layer TI is removed, the second sealing layer 383, shown in FIG. 27B, may be removed. Because the first sealing layer 381 has an etch resistance to the material that etches the tunnel insulating layer TI, the stepped stacked structure 320ST may be protected by the first sealing layer 381.

When the part of each of the blocking insulating layer BI, the data storage layer DS, and the tunnel insulating layer TI is removed, a sidewall of the second semiconductor layer 233 may be exposed through the groove 311. The memory layer ML, shown in FIG. 27B, may be divided into a first memory pattern ML1 and a second memory pattern ML2 with the expanded fourth opening 393' therebetween.

Figure 27D:
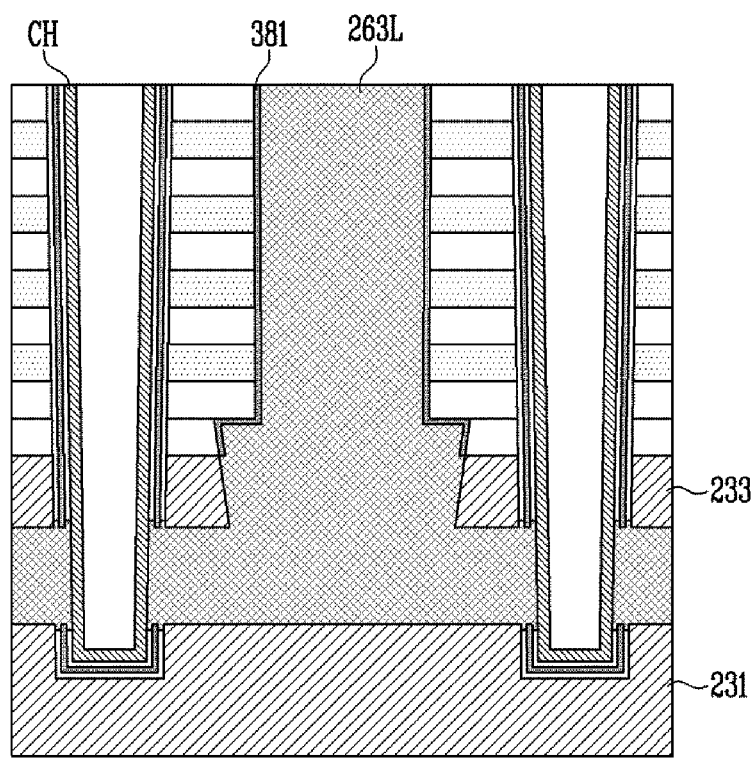

Referring to FIG. 27D, a doped semiconductor layer 263L may be formed to fill the expanded fourth opening 393', shown in FIG. 27C. The doped semiconductor layer 263L may include a conductivity type impurity. According to an embodiment, the doped semiconductor layer 263L may include n-type doped silicon. The conductivity type impurity of the doped semiconductor layer 263L may diffuse into the first semiconductor layer 231 and the second semiconductor layer 233.

Figure 27E:
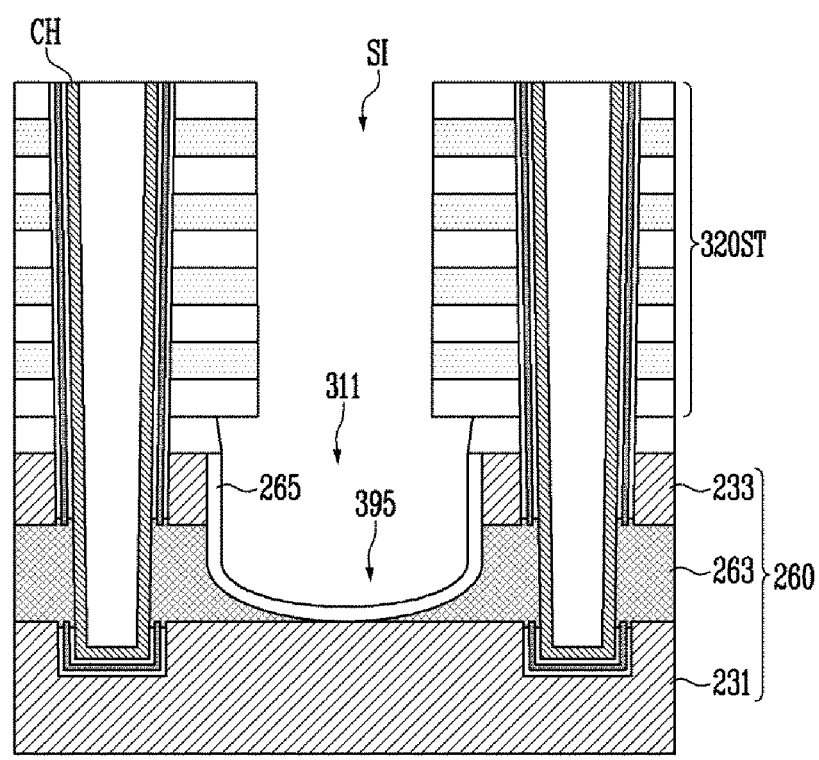

Referring to FIG. 27E, after a part of the doped semiconductor layer 263L, shown in FIG. 27D, is removed to expose the first sealing layer 381, shown in FIG. 27D, the first sealing layer 381, shown in FIG. 27D, may be removed. Accordingly, the stepped stacked structure 320ST may be exposed, and the groove 311 may be opened through the slit SI. The doped semiconductor layer 263L, shown in FIG. 27D, may be penetrated by a fifth trench 395 that extends from the groove 311. Thereafter, the oxide layer 265 may be formed by oxidizing the second semiconductor layer 233 and the doped semiconductor layer 263L through the fifth trench 395 and the groove 311. The doped semiconductor layer 263L that remains after forming the oxide layer 265 may be defined as the channel contact layer 263. The first semiconductor layer 231, the channel contact layer 263, and the second semiconductor layer 233 may form the source structure 260. The source structure 260 may be connected to the channel structure CH through the channel contact layer 263.

As described above with reference to FIGS. 27A, 27B, 27C, 27D, and 27E, the source structure 260 that is connected to the channel structure CH may be formed by replacing the sacrificial source layer with the channel contact layer 263 through the slit SI and the groove 311.

FIGS. 28A, 28B, 29A, and 29B are cross-sectional diagrams illustrating a process of forming conductive patterns according to an embodiment.

Figure 28A:
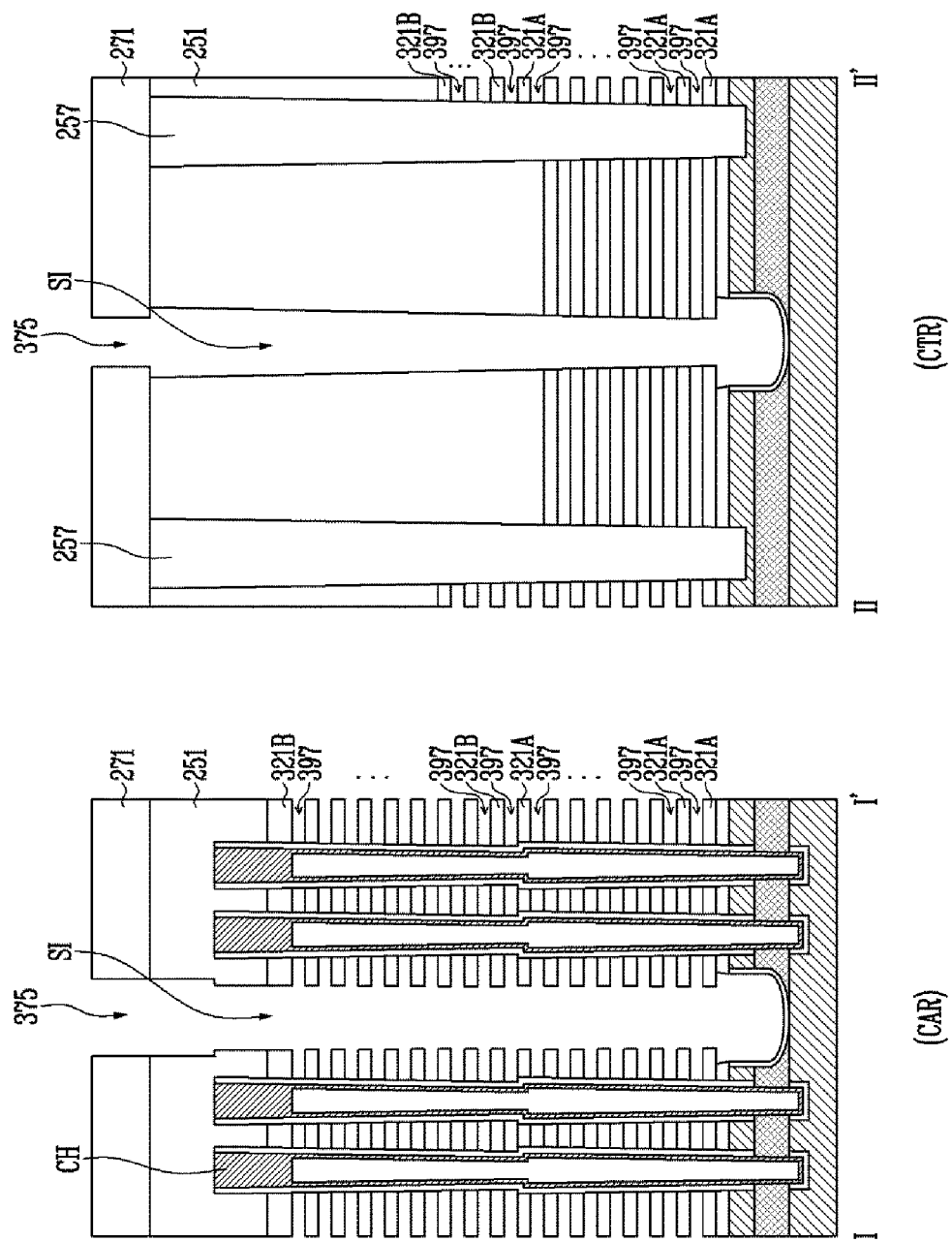
FIGS. 28A, 28B, 29A, and 29B are diagrams illustrating a process of forming conductive patterns according to an embodiment.
Figure 28B:
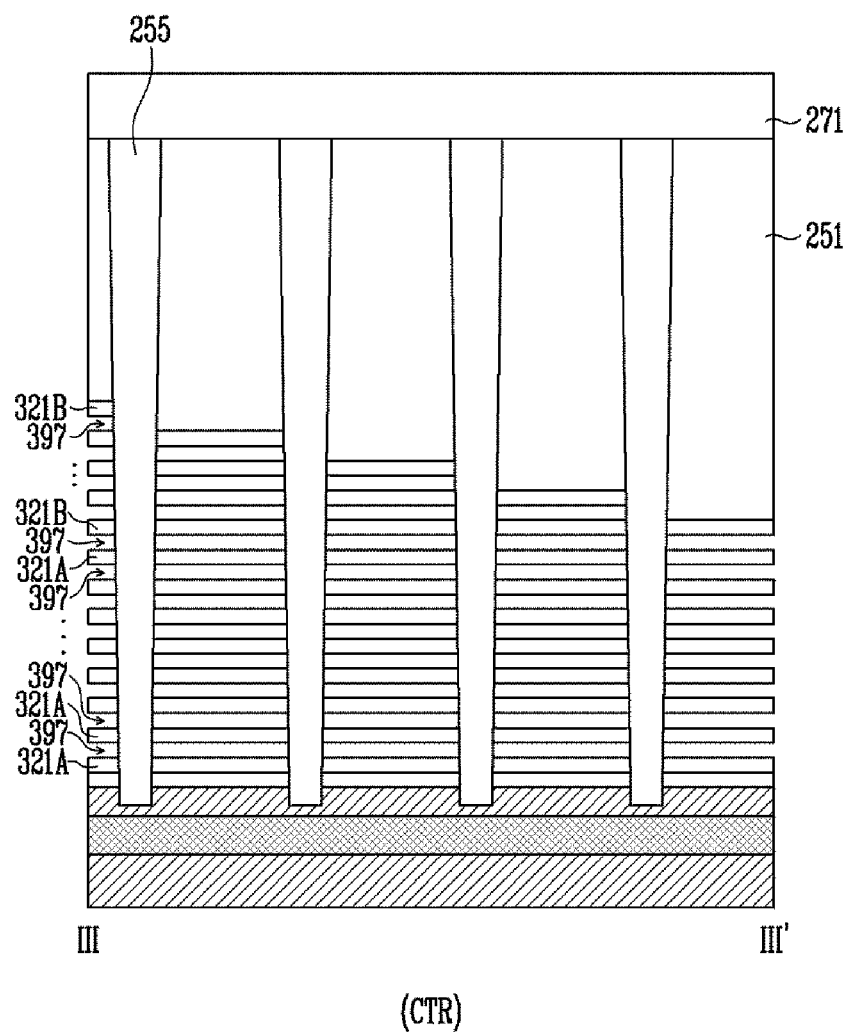

Referring to FIGS. 28A and 28B, the process of forming the conductive patterns may include removing a plurality of lower second material layers and a plurality of upper second material layers through the slit SI. Regions from which the plurality of lower second material layers and the plurality of upper second material layers are removed may be defined as a plurality of gate spaces 397. Each of the plurality of gate spaces 397 may be defined between the lower first material layers 321A that neighbor each other in the longitudinal direction of the channel structure CH, between the lower first material layer 321A and the upper first material layer 321B that neighbor each other in the longitudinal direction of the channel structure CH or between the upper first material layers 321B that neighbor each other in the longitudinal direction of the channel structure CH.

Figure 29A:
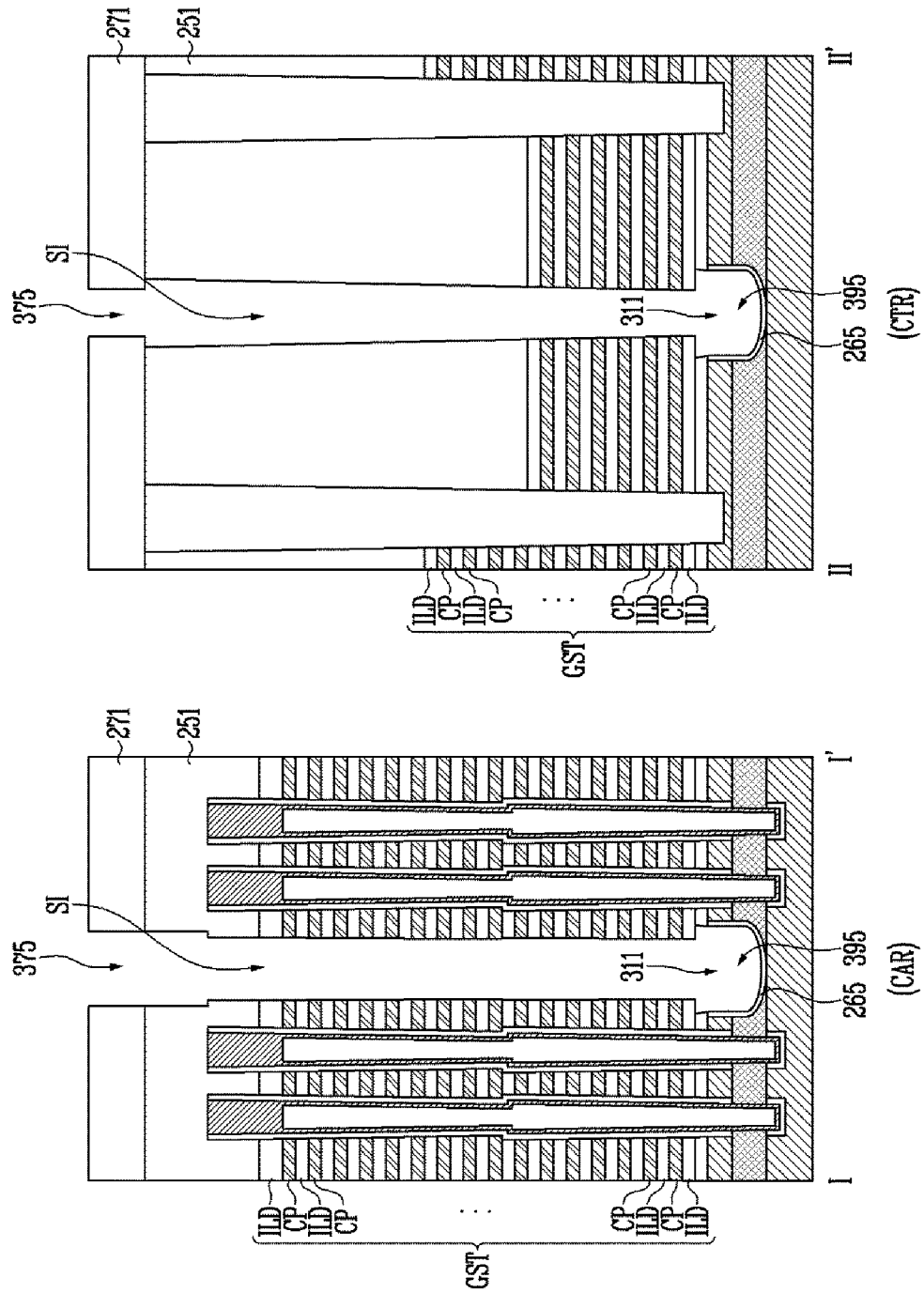
Figure 29B:
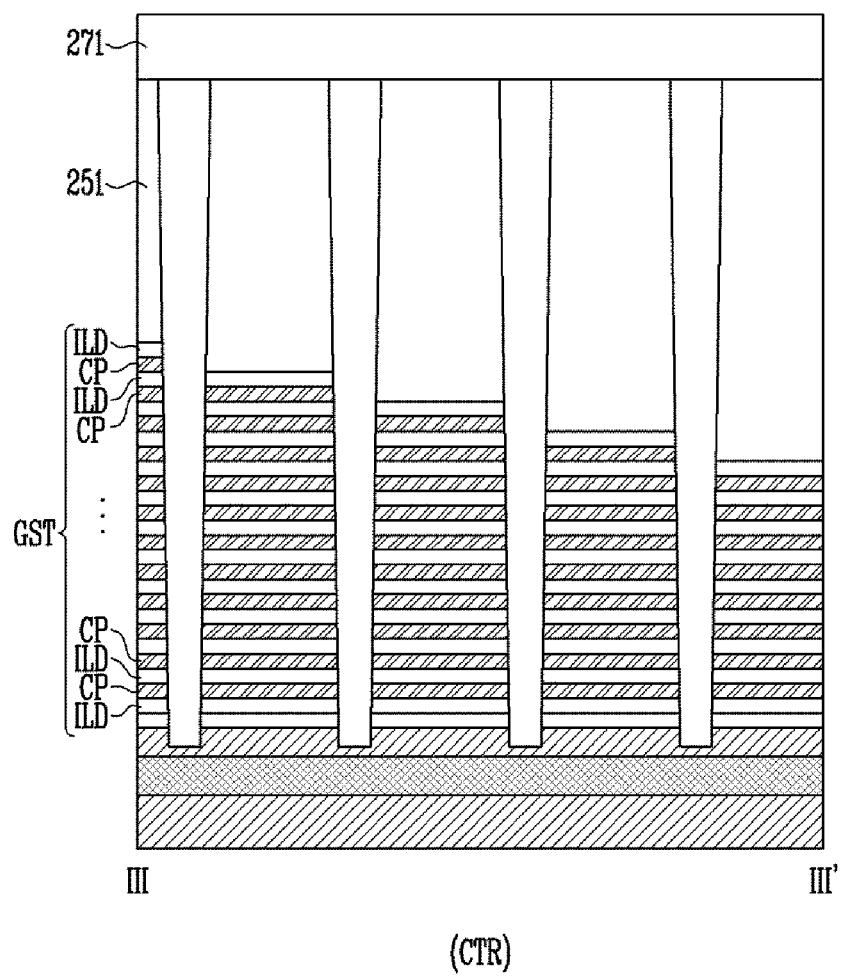

Referring to FIGS. 29A and 29B, the plurality of gate spaces 397, shown in FIGS. 28A and 28B, may be filled with the plurality of conductive patterns CP. The plurality of lower first material layers and the plurality of upper first material layers may remain as the plurality of interlayer insulating layers ILD.

The gate stacked structure GST may be formed by replacing the plurality of lower second material layers and the plurality of upper second material layers with the plurality of conductive patterns CP through the slit SI as described above with reference to FIGS. 28A, 28B, 29A, and 29B. According to an embodiment, the auxiliary hole AH may be formed as described above with reference to FIGS. 8, 9A, and 12A to define a part of the slit SI that is used to replace the lower second material layer and the upper second material layer with the conductive patterns CP. As described above with reference to FIGS. 8, 9A, and 12A, because the auxiliary hole AH is formed using a process of forming the channel hole CHH in the cell array region CAR, a manufacturing process may be simplified.

Figure 30:
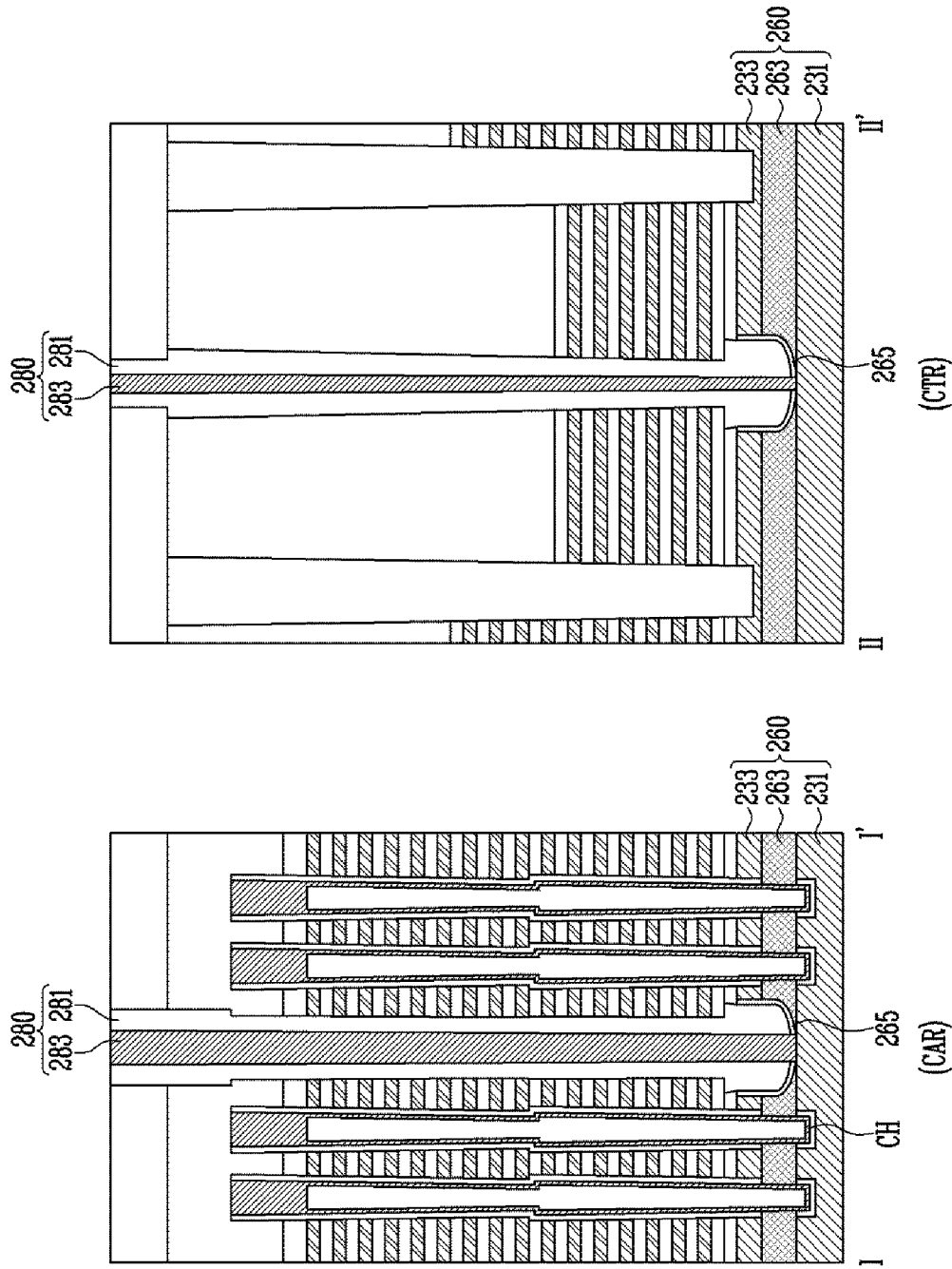
FIG. 30 is a cross-sectional diagram illustrating a process of forming a conductive source contact according to an embodiment.

FIG. 30 is a cross-sectional diagram illustrating a process of forming a conductive source contact according to an embodiment.

Referring to FIG. 30, the insulating layer 281 that fills the third trench 375, the slit SI, the groove 311, and the fifth trench 395, shown in FIG. 29A, may be formed. Subsequently, the conductive source contact 283 that passes through the insulating layer 281 and the oxide layer 265 may be formed. The conductive source contact 283 may be in contact with the first semiconductor layer 231 of the source structure 260. Thereafter, subsequent processes, such as forming the plurality of conductive bit line contacts 291 and the plurality of conductive gate contacts 293, shown in FIGS. 5A and 5B, may be performed.

Figure 31:
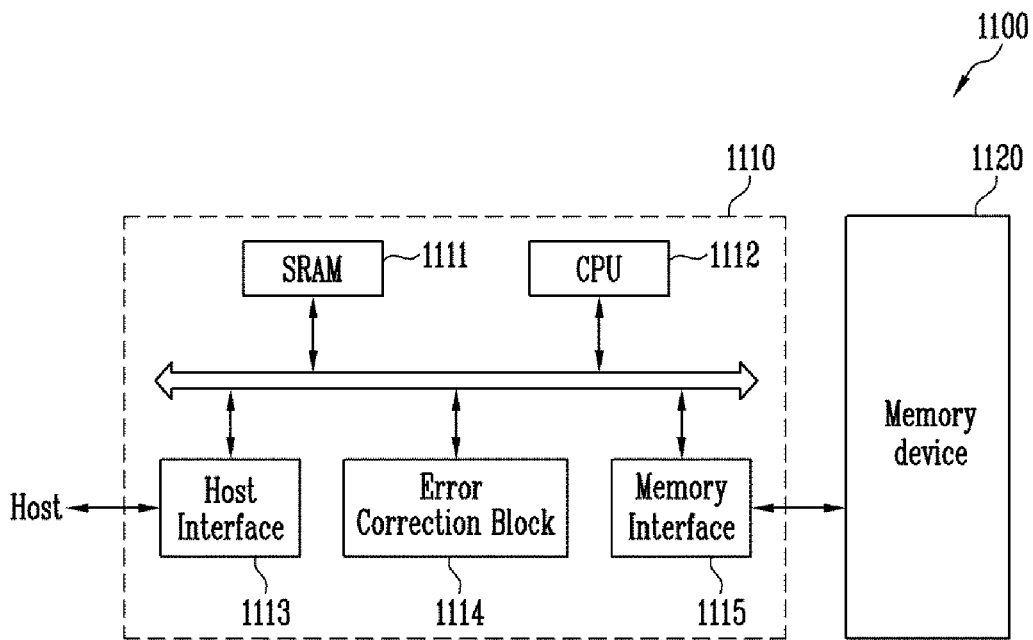
FIG. 31 is a block diagram illustrating a configuration of a memory system according to an embodiment.

FIG. 31 is a block diagram illustrating a configuration of a memory system 1100 according to an embodiment.

Referring to FIG. 31, the memory system 1100 may include a memory device 1120 and a memory controller 1110.

The memory device 1120 may be a multi-chip package with a plurality of flash memory chips. The memory device 1120 may include a gate stacked structure with a cell array region and a contact region, and the roughness of a first sidewall of the cell array region may be greater than that of a second sidewall of the contact region.

The memory controller 1110 may be configured to control the memory device 1120 and may include Static Random Access Memory (SRAM) 1111, a Central Processing Unit (CPU) 1112, a host interface 1113, an error correction block 1114, and a memory interface 1115. The SRAM 1111 may serve as operational memory of the CPU 1112, the CPU 1112 may perform general control operations for data exchange of the memory controller 1110, and the host interface 1113 may include a data exchange protocol of a host accessing the memory system 1100. The error correction block 1114 may detect and correct error that is included in data that is read from the memory device 1120. The memory interface 1115 may interface with the memory device 1120. The memory controller 1110 may further include Read Only Memory (ROM) for storing code data for interfacing with the host.

The memory system 1100 with the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnect Express (PCI-e), Serial Advanced Technology Attachment (SATA), Parallel Advanced Technology Attachment (PATA), a Small Computer System Interface (SCSI), an Enhanced Small Disk Interface (ESDI), and Integrated Drive Electronics (IDE).

Figure 32:
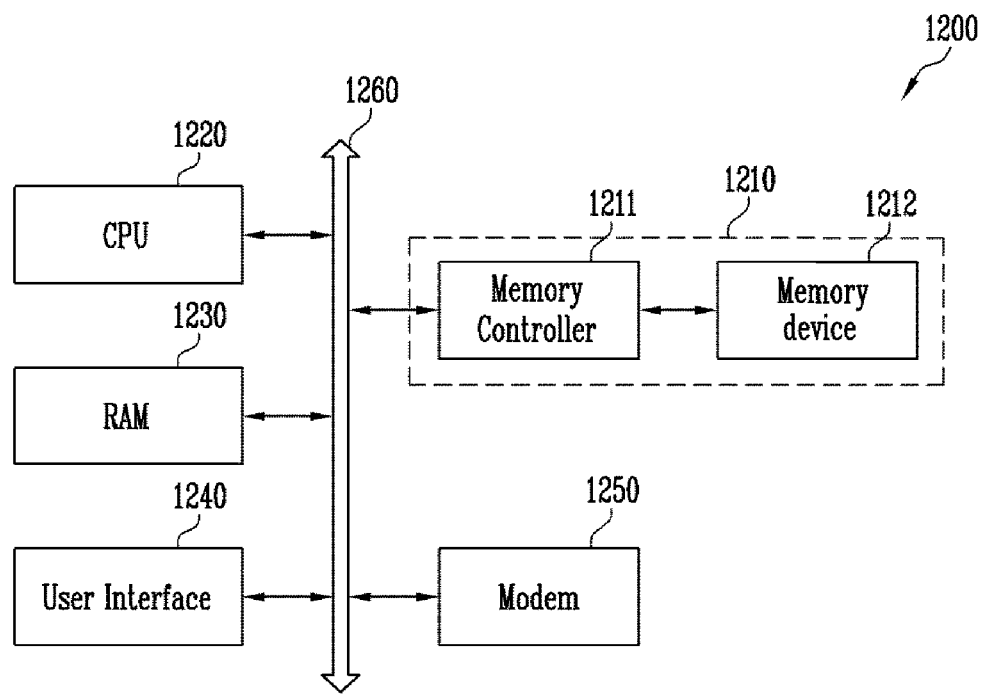
FIG. 32 is a block diagram illustrating a configuration of a computing system according to an embodiment.

FIG. 32 is a block diagram illustrating a configuration of a computing system 1200 according to an embodiment.

Referring to FIG. 32, the computing system 1200 may include a CPU 1220, Random Access Memory (RAM) 1230, a user interface 1240, a modem 1250, and a memory system 1210 that are electrically coupled to a system bus 1260. When the computing system 1200 is a mobile device, a battery for supplying an operating voltage to the computing system 1200 may be further included, and an application chipset, an image processor, mobile DRAM, and the like may be further included.

The memory system 1210 may include a memory device 1212 and a memory controller 1211.

The memory device 1212 may include a gate stacked structure with a cell array region and a contact region, and the roughness of a first sidewall of the cell array region may be greater than that of a second sidewall of the contact region.

The memory controller 1211 may be configured in the same manner as the memory controller 1110, described above with reference to FIG. 31.

According to embodiments of the present disclosure, a slit may be formed by performing an etching process such that auxiliary holes passing through a cell array region of a stacked structure and trenches passing through a contact region of the stacked structure are coupled together. The auxiliary holes may increase regularity of patterns in the cell array region and the trenches may increase regularity of patterns in the contact region. Therefore, according to embodiments of the present disclosure, process stability of a semiconductor memory device may be improved.

What is claimed is:

1. A semiconductor memory device, comprising:
a source structure; and
a gate stacked structure disposed over the source structure, the gate stacked structure having a cell array region and a contact region with a stepped shape,
wherein a roughness of a first sidewall of the cell array region of the gate stacked structure is greater than that of a second sidewall of the contact region of the gate stacked structure.

2. The semiconductor memory device of claim 1, wherein the first sidewall extends sinuously, and
wherein the second sidewall extends straight.

3. The semiconductor memory device of claim 1, wherein the first sidewall and the second sidewall are coupled to each other.

4. The semiconductor memory device of claim 1, further comprising:
a channel structure connected to the source structure, the channel structure passing through the gate stacked structure; and
a memory pattern between the channel structure and the gate stacked structure.

5. The semiconductor memory device of claim 1, further comprising:
an insulating layer extending along the first sidewall and the second sidewall of the gate stacked structure; and
a conductive source contact spaced apart from the gate stacked structure with the insulating layer therebetween, the conductive source contact being connected to the source structure.

6. The semiconductor memory device of claim 1, wherein the source structure includes a doped semiconductor layer.

7. The semiconductor memory device of claim 1, wherein the gate stacked structure includes interlayer insulating layers and conductive patterns that are stacked alternately with each other over the source structure.

8. A semiconductor memory device, comprising:
a first gate stacked structure and a second gate stacked structure that are spaced apart from each other;
a vertical structure between the first gate stacked structure and the second gate stacked structure, the vertical structure comprising a first portion and a second portion; and
a plurality of cell plugs passing through the first gate stacked structure and the second gate stacked structure to be adjacent to both sides of the first portion of the vertical structure,
wherein the first portion of the vertical structure includes depressions and protrusions that face the plurality of cell plugs, and
wherein the second portion of the vertical structure is formed in a straight shape.

9. The semiconductor memory device of claim 8, further comprising a plurality of conductive gate contacts disposed to be adjacent to both sides of the second portion of the vertical structure and in contact with the first gate stacked structure and the second gate stacked structure.

10. The semiconductor memory device of claim 8, wherein each of the first gate stacked structure and the second gate stacked structure includes a contact region with a stepped shape, and
wherein the second portion of the vertical structure is disposed between the contact region with the stepped shape of the first gate stacked structure and the contact region with the stepped shape of the second gate stacked structure.

11. The semiconductor memory device of claim 8, further comprising a source structure disposed below the first gate stacked structure and the second gate stacked structure, the source structure connected to the plurality of cell plugs.

12. The semiconductor memory device of claim 11, wherein the vertical structure further comprises:
an insulating layer extending along a sidewall of each of the first gate stacked structure and the second gate stacked structure; and
a conductive source contact spaced apart from the first gate stacked structure and the second gate stacked structure with the insulating layer therebetween, the conductive source contact being connected to the source structure.

13. The semiconductor memory device of claim 11, wherein the source structure includes a doped semiconductor layer.

14. The semiconductor memory device of claim 11, wherein each of the first gate stacked structure and the second gate stacked structure includes interlayer insulating layers and conductive patterns that are stacked alternately with each other over the source structure.

15. The semiconductor memory device of claim 11, wherein the plurality of cell plugs comprise:
channel structures passing through the first gate stacked structure and the second gate stacked structure, the channel structure being in contact with the source structure; and
memory patterns surrounding sidewalls of the channel structures.

* * * * *